US006599840B2

(12) United States Patent
Wu et al.

(10) Patent No.: US 6,599,840 B2
(45) Date of Patent: *Jul. 29, 2003

(54) MATERIAL REMOVAL METHOD FOR FORMING A STRUCTURE

(75) Inventors: Zhiqiang Wu, Plano, TX (US); Li Li, Meridian, ID (US); Thomas A. Figura, Nishiwaki (JP); Kunal R. Parekh, Boise, ID (US); Pai-Hung Pan, Boise, ID (US); Alan R. Reinberg, Westport, CT (US); Kin F. Ma, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/194,833

(22) Filed: Jul. 11, 2002

(65) Prior Publication Data

US 2002/0182872 A1 Dec. 5, 2002

Related U.S. Application Data

(63) Continuation of application No. 09/907,296, filed on Jul. 16, 2001, now Pat. No. 6,461,967, which is a continuation of application No. 09/205,989, filed on Dec. 4, 1998, now Pat. No. 6,261,964, which is a continuation-in-part of application No. 08/818,660, filed on Mar. 14, 1997, now Pat. No. 6,309,975.

(51) Int. Cl.[7] ............................................... H01L 21/00
(52) U.S. Cl. ........................ 438/705; 438/752; 438/753
(58) Field of Search ............................ 438/692, 705, 438/752, 753; 216/18, 38, 39, 62, 87

(56) References Cited

U.S. PATENT DOCUMENTS

| 4,093,503 A | 6/1978 | Harris et al. .................. 156/628 |
| 4,108,715 A | 8/1978 | Ishikawa et al. ............. 156/628 |
| 4,124,933 A | 11/1978 | Nicholas ........................ 29/578 |
| 4,271,422 A | 6/1981 | Ipri .............................. 357/42 |
| 4,343,675 A | 8/1982 | Anderson et al. ............ 156/628 |
| 4,379,001 A | 4/1983 | Sakai et al. ................... 148/1.5 |
| 4,438,556 A | 3/1984 | Komatsu et al. .............. 29/576 |
| 4,450,041 A | 5/1984 | Akufi ........................... 156/628 |

(List continued on next page.)

FOREIGN PATENT DOCUMENTS

| DE | 19530944 A1 | 4/1996 |
| EP | 0326211 A1 | 8/1989 |
| EP | 0391479 A1 | 10/1990 |

(List continued on next page.)

OTHER PUBLICATIONS

U. Schnakenberg, et al., "TMAHW Etchants for Silicon Micromachining," 91CH2817–5/91/000–0815, IEEE, 815–818, 1991.

(List continued on next page.)

*Primary Examiner*—William A. Powell
(74) *Attorney, Agent, or Firm*—Workman, Nydegger & Seeley

(57) ABSTRACT

Methods are disclosed for forming shaped structures from silicon and/or germanium containing material with a material removal process that is selective to low stress portions of the material. In general, the method initially provides a layer of the material on a semiconductor substrate. The material, which has uniform stress therein, is then masked, and the stress in a portion of the material is reduced, such as by implanting ions into an unmasked portion. The mask is removed, and either the high stress masked portion or the low stress unmasked portion of the material is selectively removed, preferably by an etching process. The portion of the material not removed remains and forms a shaped structure. The various methods are used to form raised shaped structures, shaped openings, polysilicon plugs, capacitor storage nodes, surround-gate transistors, freestanding walls, interconnect lines, trench capacitors, and trench isolation regions.

51 Claims, 36 Drawing Sheets

U.S. PATENT DOCUMENTS

| | | | |
|---|---|---|---|
| 4,514,251 A | 4/1985 | VanOmmen et al. | 156/628 |
| 4,571,817 A | 2/1986 | Birritella et al. | 29/576 |
| 4,601,778 A | 7/1986 | Robb | 156/628 |
| 4,952,446 A | 8/1990 | Lee et al. | 428/220 |
| 5,092,957 A | 3/1992 | Ashby et al. | 156/628 |
| 5,112,771 A | 5/1992 | Ishii et al. | 437/67 |
| 5,136,344 A | 8/1992 | Pronko | 357/4 |
| 5,236,547 A | 8/1993 | Takahashi et al. | 156/628 |
| 5,242,863 A | 9/1993 | Xiang-Zheng et al. | 437/67 |
| 5,244,826 A | 9/1993 | Gonzalez et al. | 437/228 |
| 5,336,912 A | 8/1994 | Ohtsuki | 257/304 |
| 5,358,908 A | 10/1994 | Reinberg et al. | 437/228 |
| 5,431,777 A | 7/1995 | Austin et al. | 156/622.1 |
| 5,484,740 A | 1/1996 | Cho | 437/40 |
| 5,488,011 A | 1/1996 | Figura et al. | 437/60 |
| 5,580,811 A | 12/1996 | Kim | 437/52 |
| 5,599,736 A | 2/1997 | Tseng | 437/186 |
| 5,600,174 A | 2/1997 | Reay et al. | 257/467 |
| 5,661,064 A | 8/1997 | Figura et al. | 438/396 |
| 5,817,580 A | 10/1998 | Violette | 438/756 |
| 6,261,964 B1 | 7/2001 | Wu et al. | 438/705 |

FOREIGN PATENT DOCUMENTS

| | | |
|---|---|---|
| EP | 0500980 A1 | 2/1991 |
| EP | 0567815 A2 | 4/1993 |
| EP | 0560575 A1 | 9/1993 |
| EP | 0651433 A1 | 9/1993 |
| EP | 0148448 A1 | 7/1995 |
| EP | 0756326 A1 | 7/1995 |
| GB | 2131748 A | 12/1982 |
| JP | 58093343 | 6/1983 |
| JP | 60121765 | 6/1985 |
| JP | 60176265 | 9/1985 |
| JP | 62029160 | 2/1987 |
| JP | 63028067 | 2/1988 |
| JP | 402189966 A | 7/1990 |
| JP | 03257859 | 11/1991 |
| JP | 04045584 | 2/1992 |
| JP | 07268663 | 10/1995 |
| JP | 08279612 | 10/1996 |

OTHER PUBLICATIONS

G.L. Kuhn, et al, "Thin Silicon Film on Insulating Substrate," J. Electrochem. Soc. Solid State Science and Technology, vol. 120, No. 11, 1563–1566, 1973.

Super Q Etch, Olin Electronic Materials, Olin Corporation, Chandler, AZ (1993).

Box Cell, Toshiba.

Steinsland, et al., "Boron etch–stop in TMAH solutions," Sensors and Actuators, A51, (1996), p. 728–732.

IBM Technical Disclosure Bulletin, "Self–Aligned Pocket Implantation Technology for Forming a Halo Type Device using Selective Tungsten Deposition" (May 1993), vol. 36, No. 05, pp. 233–235.

Y. Misawa, H. Homma, K. Sato, No. Momma, "A Self–Aligning Polysilicon Electrode Technology (SPEL) for Future LSIS," (1987); (Dec. 6–9, 1987); Intermediate Electronic Device Meeting; pp. 32–35.

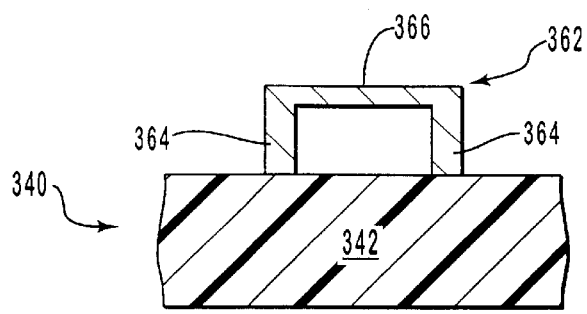
FIG. 71
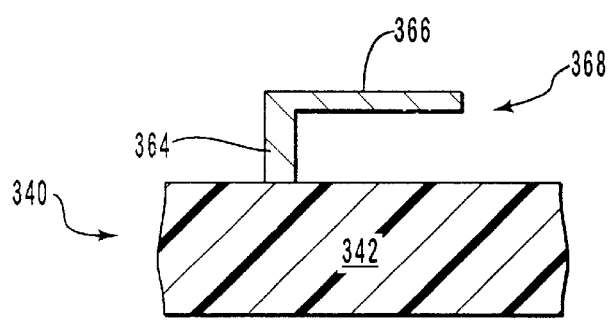
FIG. 72
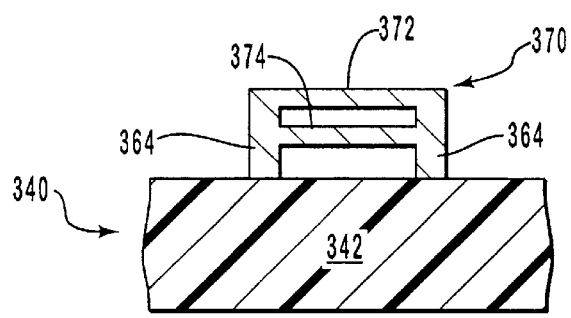
FIG. 73
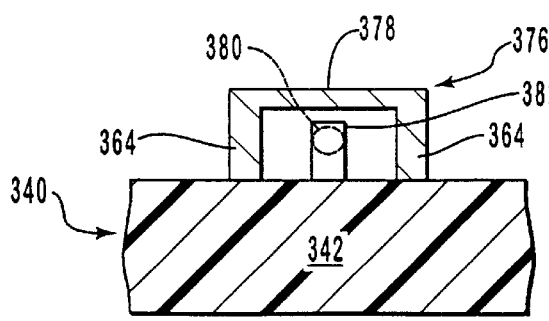 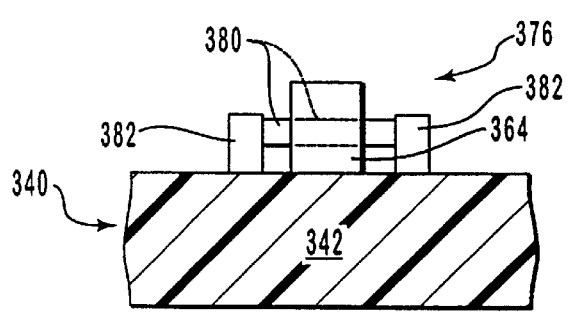
FIG. 74A    FIG. 74B

MATERIAL REMOVAL METHOD FOR FORMING A STRUCTURE

CROSS-REFERENCE TO RELATED APPLICATIONS

This application is a continuation of U.S. patent application Ser. No. 09/907,296, filed on Jul. 16, 2001, now issued as U.S. Pat. No. 6,461,967 B2, which is a continuation of U.S. patent application Ser. No. 09/205,989, filed on Dec. 4, 1998, now issued as U.S. Pat. No. 6,261,964 B1, which is a continuation-in-part of U.S. patent application Ser. No. 08/818,660, filed on Mar. 14, 1997, now issued as U.S. Pat. No. 6,309,975 B1, all of which are incorporated herein by reference.

BACKGROUND OF THE INVENTION

1. The Field of the Invention

The present invention relates to methods of patterning a volume of silicon-containing material on a semiconductor substrate. More particularly, the present invention relates to methods of forming shaped structures from a volume of silicon-containing material on a semiconductor substrate using ion implantation and an etching process which is selective to either implanted silicon-containing material or to unimplanted silicon-containing material. The present invention is particularly useful for forming shaped silicon-containing material structures such as polysilicon plugs, interconnect lines, transistor gates, trenches, and capacitor storage nodes in an efficient manner and with a high degree of control over the resulting profile of the shaped structure.

2. The Relevant Technology

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Integrated circuits on electronic chips provide the logic and memory of computers and other intelligent electronic devices. These integrated circuits have advanced to a highly functional level to the benefit of the computers and other intelligent electronic devices. The vast functionality of integrated circuits is also being provided at a cost that is economical, allowing the computers and intelligent electronic devices to be provided to consumers at affordable prices. Integrated circuits are currently manufactured by an elaborate process in which semiconductor devices, insulating films, and patterned conducting films are sequentially constructed in a predetermined arrangement on a semiconductor substrate. The conventional semiconductor devices which are formed on the semiconductor wafer include capacitors, resistors, transistors, diodes, and the like. In advanced manufacturing of integrated circuits, hundreds of thousands of these semiconductor devices are formed on a single semiconductor wafer.

The computer and electronics industry is constantly under market demand to increase the speed and functionality and to reduce the cost of integrated circuits. One manner of accomplishing this task is by increasing the density with which the semiconductor devices can be formed on a given surface area of a semiconductor wafer. In order to do so, the semiconductor devices must be decreased in dimension in a process known as miniaturization. The challenge in miniaturizing integrated circuits is to do so without greatly increasing the cost of the processes by which integrated circuits are manufactured.

Accordingly, one aspect of integrated circuit manufacturing that is in need of improvement is the complexity of the processes by which integrated circuits are manufactured. As integrated circuits have become increasingly complex, processing steps for forming the integrated circuits have multiplied in length. The number of fabrication process steps has also increased in proportion to the increased complexity of the integrated circuits. It is axiomatic that, as integrated circuit manufacturing processes increase in complexity, the cost of production of the integrated circuits correspondingly increases. Accordingly, in order to maintain an affordable cost of production of the improved and more functional computers and other intelligent electronic devices, new methods for manufacturing integrated circuits are needed which are simpler and more efficient, which assist in the miniaturization process, and which do not compromise integrated circuit quality or performance.

One necessary stage of conventional integrated circuit manufacturing processes is the formation of shaped structures which are used to form the semiconductor devices or discrete features of the semiconductor devices, such as MOS transistor gate regions and capacitor storage nodes. These shaped structures are generally formed by the patterning of structural layers on the semiconductor wafer. The structural layers are typically patterned with a process which includes depositing the structural layer, covering the structural layer with a photoresist mask, and etching away portions of the structural layer that are not covered by the photoresist mask. The portion or portions of the structural layer that are covered by the photoresist mask form the shaped structure.

The photoresist mask through which the structural layer is etched is conventionally formed by a process known as photolithography. Photolithography generally utilizes a beam of light, such as ultraviolet (UV) light, to transfer a pattern through an imaging lens from a photolithographic template to a photoresist coating which has been applied to the structural layer being patterned. The pattern of the photolithographic template includes opaque and transparent regions with selected shapes that match corresponding openings and intact portions intended to be formed into the photoresist coating. The photolithographic template is conventionally designed by computer assisted drafting and is of a much larger size than the section of the semiconductor wafer on which the photoresist coating is to be exposed. Light is passed through the photolithographic template and is focused on the photoresist coating in a manner that reduces the pattern of the photolithographic template to the required size on the wafer. For positive photoresist the portions of the photoresist coating that are unmasked are developed away.

The resolution with which a pattern can be transferred to the photoresist coating from the photolithographic template place limits upon feature sizes that can be created. The dimensions of the openings and intact regions of the photoresist mask, and consequently the dimensions of the shaped structures that are formed with the use of the photoresist mask, are correspondingly limited. Photolithographic resolution limits are thus a barrier to further miniaturization of integrated circuits. Accordingly, a need exists for an improved method of forming shaped structures having feature sizes smaller than 0.2 microns.

As an example of one such shaped structure which is in need of being formed with reduced size is an ovonic cell of a programmable resistor. An ovonic cell is a region of chalcogenide material that has a resistance which is programmable by an electrical charge passed through the ovonic cell. Generally, the ovonic cell is formed by etching out an opening from a volume of material, and thereafter depositing the chalcogenide material into the opening. As a high charge density is most suitable for programming the ovonic cell, it is desirable that the opening be formed with a small cross-sectional area, which serves to increase the density of a charge applied thereto. The opening is conventionally patterned with photolithography. It would be desirable to find a commercially feasible method of forming the opening with a width narrower than about 0.2 microns.

Certain alternative methods to photolithography for forming shaped structures of semiconductor devices with higher resolution than is possible with photolithography do currently exist, but these alternative methods have certain drawbacks and limitations which keep them from being widely employed. For example, one such alternative method is referred to as a disposable spacer flow process. The disposable spacer flow process involves initially forming a sacrificial block of material and then forming spacers at the edges of the sacrificial block of material. The sacrificial block of material is situated such that the spacers are formed in the locations where resulting high resolution shaped structures are to be located. Once the spacers are formed, the sacrificial block of material is removed and the spacers remain to form the shaped structures. As photolithography is not used in forming the spacers, the spacers are not restricted by current photolithography resolution limitations, and can be formed with dimensions less than or equal to 0.2 microns.

One problem with the disposable spacer flow process, however, is that it is limited in the types of shaped structures that can be formed thereby. Generally, such shaped structures must be of a single width. That is, when a sub-photolithography feature, such as an interconnect line, is formed with the disposable spacer flow process at a sub-photolithographic resolution width, the entire interconnect line must be of sub-photolithographic resolution width. The interconnect line cannot then be connected with structures of greater size without further deposition and masking steps to form wider portions of the interconnect lines to which the wider structures can be connected.

There is a need currently existing in the art for a method whereby a shaped structure, such as a semiconductor device feature, can be formed in a manner which is simpler and more efficient than current existing process flows. From the prior discussion, it is apparent that such a method would be additionally beneficial if it could be used to form the shaped structure with reduced dimensions from those that can be achieved with conventional photolithography and in a manner that is more flexible than photolithography-alternatives such as the disposable spacer flow.

Etching processes that selectively etch insulating surfaces efficiently are common. Less common are etching processes that etch conducting layers efficiently and with flexibility. One type of structural layer that is frequently used in forming shaped structures, and particularly shaped structures that are conductive to electricity, is polysilicon. Polysilicon is frequently used in integrated circuit formation and is preferred, in part, because it is easily deposited. Deposition of polysilicon is typically conducted with the use of chemical vapor deposition (CVD) which is typically conducted in a deposition chamber with a chemical reaction involving the pyrolitic decomposition of a precursor material such as silane, disilane, or dichlorosilane.

In order to form a shaped structure from polysilicon, the polysilicon is deposited as a structural layer and is then patterned. Patterning of a layer of polysilicon is conventionally accomplished with a process that involves photoresist patterning and thus the above-discussed shortcomings attendant thereto. Conventional processes for patterning polysilicon also generally involve dry etching with a plasma etching process, which also has certain shortcomings that will be discussed below.

Generally, when etching to form a shaped structure, it is desirable to be able to etch orthogonally into the material being etched. Such an etching process is referred to as an anisotropic etching process. Anisotropic dry etching is a form of etching in which the semiconductor wafer is bombarded with ions generated by a plasma that is formed in a flow of one or more etchant gases. Typically, one or more halocarbons and/or one or more other halogenated compounds are used as the etchant gas. For example, $CF_4$, $CHF_3$ (Freon 23), $SF_6$, $NF_3$, and other gases are conventionally used as the etchant gas. Additionally, gases such as $O_2$, Ar, $N_2$, and others are also added to the gas flow. The particular gas mixture used depends on, for example, the characteristics of the material being etched, the stage of processing, the type of etching system being used, and the desired etch characteristics, such as etch rate and degree of anisotropy.

The anisotropic nature of dry etching is desirable, but it has the drawback of not being highly selective to different types of layers. Because of this drawback, it is difficult to precisely terminate a dry etching process at a desired depth to form a shaped structure with a sharp profile. Also, the patterns that can be formed with a single photoresist masking and dry etching step are limited to a single depth, and to the patterns that can be formed with photoresist. Consequently, forming a shaped structure having a complicated profile requires multiple repeated masking and dry etching steps, which drives up cost. Therefore, it is desirable to design a more controllable etching process, capable of patterning a structural layer such as a polysilicon layer anisotropically, yet with greater control of feature size and profile, and at a low cost.

Such an improved method would also provide numerous collateral advantages in addition to those discussed above. For instance, in order to increase the functionality of the integrated circuit, it would be beneficial if an improved method could be provided that imparts a flexibility to the types of profiles of the shaped structures that can be formed thereby. It would also be beneficial if the improved method simplified the process flows of certain semiconductor device formation processes in order to meet the demand for reduced cost discussed above. In order to further illustrate these and other needs of integrated circuit manufacturing processes, several representative conventional process flows and their limitations will be discussed herein.

A first representative example of a process flow in need of improvement is discussed below. In particular, it is necessary at several stages during an integrated circuit manufacturing process to form openings in an insulative layer of material. Conductive material is deposited into the openings in order to make electrical contact to underlying semiconductor devices or discrete features of semiconductor devices. Generally, an opening through an insulating layer exposing an active region is referred to as a contact opening, while an opening through an interlevel dielectric layer is referred to as a via opening. The term interconnect structure opening will be used herein to collectively refer to such openings through an insulative layer. Contact openings and via openings are filled with a conductive material to form a contact or via. A contact or via opening filled with polysilicon is generally referred to as a polysilicon plug. As used herein, the term interconnect structure will be used to collectively refer to conductive structures such as contacts, vias, and plugs that electrically connect discrete semiconductor device features located on differing levels of a semiconductor wafer.

To form an interconnect structure opening or another such opening through an insulating layer under conventional process flows, a photoresist mask is formed over the insulating layer and is patterned to leave exposed the area above the location of the insulating layer where the interconnect structure opening is intended to be formed. Material is then removed from the insulative layer to form the opening with an etching process which, in current conventional process flows, is typically the dry etching process discussed above.

The dry etching process has proven problematic, as discussed above, due to its lack of selectivity to different types of materials. In forming interconnect structures with a high density, high aspect ratio interconnect structure openings are required. The aspect ratio of an opening, as used herein, refers to the ratio of the primary vertical dimension of the opening divided by the primary horizontal dimension of the opening. Forming interconnect structures with a high aspect ratio requires a high selectivity of the etching process so that the etching process does not over etch, such as into an underlying silicon substrate. A measure of selectivity is typically achieved with the use of a silicon nitride etch barrier layer. Nevertheless, as aspect ratios increase, it is increasingly difficult to consistently form interconnect structure openings with high aspect ratios using conventional dry etching processes.

Conventional dry etching processes also exhibit poor uniformity, as it is difficult to uniformly etch the entire wafer surface with conventional dry etching processes. Yet another problem associated with dry etching is that it is difficult to dry etch surfaces which are not smooth and have a nonuniform topography. When dry etching such interconnect structure openings, uniformity problems occur in which open surfaces are etched faster than recessed surfaces, and in which the selectivity of the dry etching process varies for the depth of the feature being etched. Thus, a high selectivity is difficult to maintain in surfaces with a nonuniform topography.

A further limiting factor in interconnect structure opening formation is the difficulty involved in masking prior to etching interconnect structure openings. The mask is formed with openings for the interconnect structures that are extremely small when forming high density contact openings, which makes it difficult to correctly align the mask openings to the proper locations on the semiconductor substrate.

To complete an interconnect structure once the interconnect structure opening is formed, the interconnect structure opening is filled with a metal such as aluminum or tungsten. Filling the interconnect structure opening with metal causes additional problems, however, in that aluminum and tungsten do not form a highly conductive interface with an underlying epitaxial silicon of an active region. Aluminum diffuses into the active region and can form conductive spikes that short out the active region. Tungsten tends to chemically react and leave voids at the active region that reduce the conductivity of the interconnect structure. Consequently, when using the aluminum or tungsten as filler materials, elaborate steps of forming a liner layer must be conducted. Formation of the liner layer also poses difficulty, however, as the deposition of the liner layer tends to narrow the contact opening, making it difficult to effectively deposit the filler material.

One type of interconnect structure used to overcome the problems associated with filling the interconnect structure opening is the polysilicon plug. To form a polysilicon plug, an insulating layer is first formed over a semiconductor device feature which is to be provided with electrical communication by the polysilicon plug. The semiconductor device feature typically comprises an active region of a transistor. In MOS transistors, the active region is a source/drain region. Once the active region is formed, an insulating layer such as borophosphosilicate glass (BPSG) is subsequently formed, and is then reflowed. A contact opening is then etched through the insulating layer using photolithography and dry etching. The contact opening is subsequently filled with polysilicon. The polysilicon is typically deposited by chemical vapor deposition as a blanket layer of polysilicon over the entire insulating layer. The portion of the blanket polysilicon layer extending above the insulating layer is then removed using a planarization process such as CMP or a dry etch. Alternatively, the portion of the polysilicon layer situated above the polysilicon plug can be removed by masking the polysilicon and etching the remainder of the polysilicon layer away.

Polysilicon plugs are advantageous in that they form a highly conductive interface to the underlying crystalline silicon of the active region, which thereby overcomes the diffusion problems of interconnect structure formation processes that use metals for the conductive filing material. On the other hand, polysilicon plugs are problematic in that the dry etching process discussed above must still be conducted in the formation of the interconnect structure opening in which the polysilicon plug is formed. Conventional polysilicon plug formation processes are complex. Such complexity restricts throughput and increases the opportunity for error, thereby driving up integrated circuit fabrication costs. Consequently, a need also exists for a method whereby interconnect structures, and especially polysilicon plugs for high aspect ratio interconnect openings, can be formed efficiently and simply and without the need for dry etching to form a high aspect ratio interconnect structure opening.

A further shaped structure which is frequently formed in integrated circuit manufacturing is the capacitor. The capacitor is formed with a storage node, a cell plate, and an intervening dielectric layer. The storage node and cell plate are frequently formed from polysilicon. The polysilicon of the storage node and the cell plate are generally deposited separately and are patterned by conventional photolithography and dry etching. An intervening dielectric layer is formed between the formation of the storage node and the cell plate, typically by growth of silicon dioxide through exposure to oxygen.

An important consideration of forming capacitors in integrated circuits is surface area. A larger surface area of the storage node and upper capacitor cell plate provides greater capacitance. Balanced against this need is the competing requirement that the capacitor occupy a minimum of space on the silicon substrate of the semiconductor wafer. One manner in which the prior art has approached capacitor formation in order to obtain a greater surface area without increasing the space occupied on the silicon substrate is to form the capacitor at a distance above the silicon substrate. When so doing, one of the storage node and the cell plate are typically wrapped around the other in a compact area, forming what is known as a stacked capacitor. One problem common with the various configurations of stacked capacitors and the processes used to form them is that the processes are generally complicated and lengthy, increasing the opportunities for defect conditions to occur and driving up cost.

Consequently, a method is needed for forming a stacked capacitor with a large surface area yet occupying a minimum of space on the silicon substrate in a simple and efficient manner. It is also desirable to gain greater charge storage area by integrally forming the stacked capacitor storage node and the underlying interconnect structure.

An additional problem attendant to forming a stacked capacitor is that the stacked capacitor must be linked in electrical communication to an active region on the silicon substrate underlying the capacitor storage node. It is critical in maintaining a high speed of the integrated circuit that the stacked capacitor maintain a high rate of charge retention. This is particularly so in forming integrated circuits that provide memory functions, such as dynamically refreshable random access memory (DRAM) integrated circuits. In order to maintain a high charge retention in the storage node, the stacked capacitor is generally separated from the silicon substrate.

Forming an interconnect structure from an active region on a silicon substrate to a stacked capacitor, however, poses certain difficulties. For instance, conventional methods of forming interconnect structures electrically connecting the storage node with the underlying active region typically involve forming an interconnect structure opening of an extended depth and then filling the interconnect structure opening, typically with polysilicon. The processes which do so, however, are difficult to conduct, as they have narrow process windows for correctly controlling all process parameters such that a defect condition does not occur. For instance, an interconnect structure opening with an aspect ratio of over two to one may be difficult to accomplish with standard dry etching processes.

A further semiconductor device for which an improved manufacturing process is needed is the MOS transistor. The transistor is the mainstay of modern integrated circuit fabrication, and integrated circuits such as microprocessors often utilize millions of transistors in a single chip. Currently, the MOS transistor is the most common type of transistor in integrated circuit formation. Greater functionality is obtained from an integrated circuit by forming a greater number of transistors in the same amount of space on an integrated circuit. Thus, a method is needed that forms a transistor which occupies less surface area of the silicon substrate of the semiconductor wafer.

It is also desired that transistors operate at lower voltage levels. One barrier to the formation of MOS transistors that operate at lower voltage levels is the channel length of MOS transistors. The channel length is generally determined by the width of a gate region of the MOS transistor being formed. The width of the gate region is, in turn, limited in conventional manufacturing processes by photolithography resolution limits as discussed above. The dimensions of the gate region also determines, to an extent, the amount of surface area that the transistor occupies. Accordingly, an improved process is needed which can manufacture transistors on integrated circuits with reduced gate length and with lower operational voltage levels.

The formation of transistors is also a complicated process, requiring numerous steps. The high number of steps required increases integrated circuit manufacturing process costs, reduces throughput, and presents more opportunities for error to occur. Therefore, a method for streamlining the transistor formation process is also needed.

Another shaped structure for which an improved method of formation is needed is a shallow trench that is often etched into a silicon substrate and which is used for forming semiconductor devices such as a trench isolation region and a trench capacitor. A method is needed of forming a trench capacitor that has an adequate volume and yet which does not occupy a large amount of surface area of the silicon substrate in order to provide high capacitance of the trench capacitor. A method of forming a trench with adequate volume would also improve a trench isolation region and help to prevent cross-talk current leakage between source/drain regions of MOS transistors that are typically formed on either side of the trench isolation region.

A further shaped structure that is frequently used in the construction of integrated circuits is the interconnect line. The term interconnect line, as used herein, refers to shaped structures that electrically connect semiconductor devices or features of semiconductor devices located on the same level, or that make electrical interconnections between interconnect structures formed on a single level of the semiconductor wafer, yet which are physically separated from each other. When formed on the top surface of the semiconductor wafer, this structure is referred to simply as a surface interconnect line. When formed beneath the surface of the semiconductor wafer, the interconnect line is referred to as a local interconnect.

One consideration in miniaturizing the integrated circuit is obtaining a more dense packing of the interconnect lines within the integrated circuit. One manner of more densely packing interconnect lines is to form the interconnect lines with a narrower width. Interconnect line widths are currently restricted by the resolution limits of conventional photolithography processes. One manner in which the prior art has attempted to overcome these limitations is with the disposable spacer flow process discussed above. As discussed therein, the thickness of the conducting lines formed with the disposable spacer flow cannot be varied. Consequently, when it becomes necessary to connect the conducting spacers to wider interconnect lines or to devices with larger feature sizes, no extra material is provided for doing so. Thus, a more flexible process for providing narrow interconnect lines is needed.

Other shaped structures are also frequently used in forming integrated circuits and would also benefit from an improved etching process whereby shaped structures could be formed with a more flexible, simple, and efficient process. One application for such shaped structures is in forming micro-machine parts as are commonly used in miniature sensors and actuators. A method is needed for forming such structures with a minimum of material deposition, masking, and etching steps.

A further shaped structure used in integrated circuit formation is a free-standing wall that is used to form capacitor storage nodes and other conducting devices. A method that provides flexibility as to the thickness of the resulting free-standing wall, and as to the shape with which the free-standing wall can be formed is needed. Such a method that can form the free-standing wall efficiently and with sub-photolithographic resolution is also needed.

SUMMARY OF THE INVENTION

To overcome the foregoing problems existing in the art, and in accordance with the invention as embodied and broadly described herein in the preferred embodiments, various methods are provided. In the invention, selected portions of a volume of a material, preferably composed of a silicon-containing material and/or a germanium-containing material, are selectively removed. The removal of the selected portions will preferably be by etching with an etchant, preferably a basic etchant, to form a shaped structure. A basic etchant is defined herein as an etchant having a pH greater than 7. In general, the distinction between removed and unremoved portions of the volume of material is the respective degree of internal stress. It is believed that the etchant will remove the high stress portion of the volume of material at a higher material removal rate than the etchant will remove the lower stress portion of the volume of material. As such, the high stress portion will be removed and than low stress portion will not be removed.

The invention is directed towards a volume of a material that is formed upon on a semiconductor substrate. The volume of the material is to have uniform stress throughout. The stress in a first portion of the volume of the material is reduced without reducing the stress in a second portion of the volume of the material. Preferably, the stress in the first portion is reduced by bombarding the first portion with atomic particles, such as by ion implantation. The second portion is then selectively removed. Preferably, the second portion is removed in an etch process. The etch process is performed upon the volume of the material, preferably with an basic etchant. Due to the respective degree of stress in each of the first and second portions, the etch will have a lower material removal rate for first portion than for the second portion. In general, regardless of the respective degree of any dopant concentration in the removed and unremoved portions prior to such stress reduction such as by bombardment or implantation, the distinction between removed and unremoved portions of the volume of material is the respective degree of stress.

In the following summary description of various inventive methods, the selective removal of a volume of a silicon-containing material is described. It is intended, however, that the invention is also applicable to a volume of a germanium-containing material In a first method, a selected portion of a volume of silicon-containing material located on a semiconductor substrate is removed in such a manner as to leave a shaped opening in the layer of silicon-containing material. Initially, a layer of silicon-containing material, which in one embodiment comprises a polysilicon layer, is provided on a semiconductor substrate. A masking substrate is formed on the layer of silicon containing material that masks at least one region of the layer of silicon-containing material and leaves a second region of the layer of silicon-containing material unmasked.

Ions of a selected type are then implanted into the unmasked portion of the layer of silicon-containing material. The ions are of a type that is selected in accordance with an etching process which is selective to implanted silicon-containing material in a manner which will hereafter be discussed. In order to reduce the dimensions of the shaped opening from the dimensions of the masking substrate, the ions can be implanted with an angle of implantation other than orthogonal to the semiconductor substrate, causing the ions to be implanted under the edges of the masking substrate. Implanting the ions with an angle of implantation other than orthogonal to the semiconductor substrate will result in a reduction in the dimensions of the shaped opening from the dimensions of the masking substrate, while an angle of implantation orthogonal to the surface of the semiconductor substrate results in no substantial dimension change.

Other ion implantation parameters, such as ion type, implantation dose, and implantation energy can also be appropriately selected to further tailor the dimensions of the implanted region and thereby the resulting shaped opening. The impermeability to ions of the selected masking material also has an effect in sculpting the resulting shaped structure. Diffusing the ions after ion implantation with a heat treatment deepens the penetration of the ions into the polysilicon layer and further serves to tailor the profile of the resultant shaped feature, though it is generally preferred not to heat treat in order to maintain a sharper profile of the implanted ions in the layer of silicon-containing material.

Additionally, in order to vary the dimensions in a uniform manner, the ion implantation operation can be conducted in multiple implantation stages with one ion implantation parameter being varied for each implantation stage. By varying the angle of implantation for each of the multiple implantation stages, for instance, deep shaped openings can be formed with substantially anisotropic sidewalls.

The masking substrate in a subsequent procedure is stripped from the layer of silicon-containing material, and the layer of silicon-containing material is then etched with an etching process. The etching process etches portions of a volume of silicon-containing material that are not implanted with ions to a threshold concentration at a faster rate than the etching process etches portions of the volume of silicon-containing material that are implanted with ions up to the threshold concentration. Such an etching process is referred to in this document as an etching process which is selective to implanted silicon-containing material. The exact concentration which constitutes the threshold concentration varies in accordance with the particular etching process and the etching process parameters. Nevertheless, for any such etching process, silicon-containing material implanted with ions beyond the threshold concentration is not substantially removed by the etching process which is selective to implanted silicon-containing material, and silicon-material implanted to less than the threshold concentration is substantially removed.

In etching processes that are selective to low stress portions of a volume of a material and that etch high stress portions of the volume of the material, preferred etchants include an etchant having a pH greater than 7 and more preferably not less than 9, an organic base, an inorganic base, an etchant that contains ammonia, a basic etchant that does not contain Group I or Group II metals, tetraethylammonium hydroxide, tetrabutylphosphonium hydroxide, tetraphenylarsonium hydroxide, KOH, NaOH, and tetramethyl ammonium hydroxide (TMAH). Preferably, the etched material is a silicon-containing material or a germanium containing material. Although the invention discussed below expands upon the use of TMAH as an etchant, the foregoing etchants are also contemplated in processes of forming the various structures described below.

Where the etching process is selective to implanted silicon-containing material and the etchant is TMAH, a wet etch is preferred. The TMAH wet etch is typically administered as an etchant solution into which the semiconductor wafer is immersed. Preferably, the etchant solution comprises about 1 to about 10 weight percent of TMAH in deionized water. More preferably, the etchant solution comprises about 2.5 weight percent of TMAH in deionized water.

The TMAH wet etch has been found to etch silicon-containing material implanted to less than the threshold concentration of ions at least two times faster than it etches silicon-containing material that is implanted to the threshold concentration of ions. Differences in etch rates of 20 to one and 40 to one are easily achievable, and a difference in etch rates of up to 60 to one can be obtained according to TMAH concentrations and the selection of other ion implantation and etching process parameters.

When conducting the TMAH wet etch for polysilicon, the threshold concentration of implanted ions at least to polysilicon is implanted is preferably in a range from about $1\times10^{15}$ ions per cm$^3$ of silicon-containing material to about $1\times10^{22}$ per cm$^3$ of silicon-containing material. More preferably, the threshold concentration is in a range from about $5\times10^{18}$ ions per cm$^3$ of silicon-containing material to about $5\times10^{19}$ ions per cm$^3$ of silicon-containing material. Most preferably, the threshold concentration is about $1\times10^{19}$ ions per cm$^3$ of silicon-containing material.

Common dopants such as boron and phosphorous are suitable for use as the implanted ions, and in addition, other common dopant ions and even ions that are not commonly considered to be dopant ions are satisfactory. For instance, ions can also be successfully used in conjunction with the TMAH wet etch that do not electrically activate or otherwise alter the electrical properties of the silicon-containing material. Examples of such ions are silicon ions and argon ions.

As a result of the etching process which is selective to implanted silicon-containing material, a selected portion of the polysilicon layer that is not implanted up to the threshold concentration of ions is etched away to form a shaped opening. Etching process parameters, such as the duration of the etch, can also be varied to further tailor the shaped opening. In one example of the use of a shaped opening, an ovonic cell of a programmable resistor is formed by filling the shaped opening with chalcogenide material.

In a related embodiment, the polysilicon layer with the shaped opening therein is used as a hard mask to pattern an underlying layer. Thus, for example, a layer of material other than a silicon-containing material such as a layer of silicon nitride is initially formed under the layer of silicon-containing material, and the first method is carried out to create a shaped opening in the layer of silicon-containing material. An etching process is then conducted to etch the layer of silicon nitride through the shaped opening to form a shaped opening in the layer of silicon nitride.

Thus, a method is provided for forming shaped openings which are simple and efficient. The method can be used to form shaped openings with smaller dimensions than can be formed with conventional photolithography processes. Greater flexibility is provided as to the possible profiles of the resulting shaped openings, thereby increasing the types of semiconductor devices that can be formed thereby, and consequently, the potential functionality of the integrated circuit formed with the first method.

In a second method of the present invention, a shaped structure is formed from a layer of silicon-containing material on a semiconductor wafer with an etching process that, converse to the etching process of the first method, etches silicon-containing material that is implanted with ions up to a threshold concentration at a substantially faster rate than it etches silicon-containing material that is not implanted with ions up to the threshold concentration. The second method initially comprises providing a layer of silicon-containing material, such as a polysilicon layer, on a semiconductor substrate. Thereafter, a masking substrate is formed over the layer of silicon-containing material. The masking substrate is formed so as to cover at least a portion of the layer of silicon-containing material and to leave a portion of the layer of silicon-containing material unmasked.

Subsequently, ions are implanted into the unmasked portion of the layer of silicon-containing material. The ions are of a selected type chosen in accordance with an etching process which is selective to unimplanted silicon-containing material. In one embodiment, the ions comprise dopant ions such as phosphorous or boron ions. As with the first method, the ion implantation operation can be conducted with ion implantation parameters selected to tailor the profile of the portion of the layer of material that is implanted to the threshold concentration, and thereby of the resulting shaped structure. The ion implantation operation can also be conducted in multiple implantation stages with the ion implantation parameters varied for each of the multiple implantation stages as previously discussed for the first method.

After the ion implantation operation is conducted, an initial etching process is thereafter conducted that etches the layer of silicon-containing material substantially anisotropically to partially reduce the height of the unmasked portion of the layer of silicon-containing material.

Once the initial etching process is conducted, the layer of silicon-containing material is etched with an etching process which etches portions of the layer of silicon-containing material that are implanted with ions up to a threshold concentration at a substantially faster rate than it etches portions of the layer of silicon-containing material that are not implanted with ions up to the threshold concentration. Such etching processes are referred to herein as an etching process which is selective to unimplanted silicon-containing material. The concentration of ions which constitutes the threshold concentration is determined by the particular etching process which is selective to unimplanted silicon-containing material that is used and by the selection of the ion implantation and etching parameters in a manner that will be readily understood from this disclosure by those skilled in the art.

In one embodiment given by way of example, the etching process which is selective to unimplanted silicon-containing material uses an acidic etchant such as commercially available hydrofluoric acid, or it may use a nitric acid etchant solution. Also, a KOH etching chemistry can be used together with a counter-doping of the polysilicon layer.

The result of the etching process which is selective to unimplanted material is a raised shaped structure formed in the location of the portion of the layer of silicon-containing material that was masked and thus implanted to less than the threshold concentration of ions. In the embodiment wherein ions are implanted at an angle other than orthogonal to the surface of the semiconductor substrate, the shaped structure has dimensions that are reduced from the dimensions of the masked portion of the layer of silicon-containing material.

The raised shaped structure can also be used as a sacrificial hard mask for etching an underlying layer. When using the raised shaped structure as a sacrificial hard mask, an underlying layer is formed prior to depositing the layer of material. The raised shaped structure is then formed in the manner discussed above, and serves as a hard mask when etching the underlying layer. The underlying layer is typically etched anisotropically, with an etching process such as dry etching. The raised shaped structure is removed after etching the underlying layer, and a portion of the underlying layer remains in substantially the same location and with substantially the same dimensions as the raised shaped structure. Once again, these dimensions can be smaller than those of which conventional photolithography is capable.

A third method of the present invention is used to form an interconnect structure. Under the third method, a charge conducting region such as an active region is first provided on a semiconductor substrate. A layer of silicon-containing material, which in one embodiment is a polysilicon layer, is then formed over the charge conducting region. The layer of silicon-containing material is then masked with a masking substrate that is patterned so as to leave masked a portion of the layer of silicon-containing material that is located over the active region.

After the masking substrate is applied, ions are implanted into the unmasked portion of the layer of silicon-containing material. The ions are selected, as discussed above for the first method, in conjunction with an etching process which is selective to unimplanted silicon-containing material. The ion implantation process parameters can be varied to shape the resulting interconnect structure. Also, the ion implantation operation can be conducted in multiple implantation stages as discussed above.

After the ion implantation operation is concluded, the masking substrate is removed, and the layer of silicon-containing material is etched with the etching process which is selective to unimplanted silicon-containing material. As a result, the portion of the layer of silicon-containing material that was underlying the masking substrate is removed, and the portion of the layer of silicon-containing material located above the active region, which was masked and thus was unimplanted with ions, remains and forms the interconnect structure electrically connected to the active region.

The interconnect structure is, as a result of the method of the present invention, constructed in a more simple and efficient manner than interconnect structures constructed with the conventional methods discussed above. Accordingly, integrated circuit manufacturing throughput is increased and integrated circuit manufacturing cost is reduced. The need for a dry etching process and the problems associated therewith, as discussed above, are also eliminated.

A fourth method of the present invention is used to form a stacked capacitor storage node. Under the fourth method, a charge conducting region is initially provided on a semiconductor substrate, above which the stacked capacitor storage node is to be formed. In one embodiment, the charge conducting region comprises an active region formed in a silicon substrate of a semiconductor wafer. Once the active region is provided, a layer of silicon-containing material is then formed over the active region. In the embodiment to be discussed, the layer of silicon-containing material comprises a polysilicon layer.

The polysilicon layer is subsequently masked with a masking substrate that is patterned so as to leave a portion of the polysilicon layer located above the active region unmasked. The masking substrate is formed with an island having two edges, each located above and to one side of the active region.

After the masking substrate is applied and patterned, spacers of silicon-containing material are formed on the polysilicon layer, one adjacent each of the two edges of the masking substrate. The spacers are formed with a conventional spacer formation process, and their shape and height are selected in accordance with the needs of the stacked capacitor storage node being formed.

Thereafter, ions are implanted into the unmasked portion of the polysilicon layer, substantially in the manner discussed above for the first method. Also, the ion implantation operation can be conducted in multiple stages as discussed above.

After the ion implantation operation is concluded, the masking substrate is removed and the polysilicon layer is etched with the etching process which is selective to implanted silicon-containing material in the manner discussed above for the first method. The etching process which is selective to implanted silicon-containing material removes the portions of the polysilicon layer that were underlying the masking substrate and allows the portion of the polysilicon layer located above the active region that was unmasked to remain. The spacers also remain and extend upward therefrom to form the stacked capacitor storage node.

In an alternate embodiment of the fourth method, an interconnect structure is formed concurrently with stacked capacitor storage node formation. The procedure is substantially the same as that of the first embodiment wherein only a stacked capacitor storage node is formed, with the exception that in the location where an interconnect structure is to be formed, spacers are not formed above the portion of the polysilicon layer where the interconnect structure is to be located. The ion implantation process parameters can be varied to shape the resulting interconnect structure.

The fourth method forms a stacked capacitor storage node with an integral storage node and capacitor base thereby providing a greater storage area for greater charge retention. The stacked capacitor storage node can be formed concurrently with the capacitor base, thereby eliminating a separate interconnect structure formation step. Consequently, the number of masking and etching steps is decreased, which in turn increases the throughput, reduces the cost, and eliminates opportunities for error in the integrated circuit fabrication process. The fourth method also introduces greater flexibility to the stacked capacitor storage node formation process, as polysilicon plugs can be formed over active regions concurrently with the formation of the stacked capacitor storage node.

A fifth method is provided herein and is used to form an interconnect structure in a CMOS process flow. Under the fifth method, a conventional CMOS integrated circuit formation process is followed up to the point of transistor gate regions formation. In so doing, a silicon substrate is formed with a PMOS portion and an NMOS portion. At least one gate region is formed on each of the PMOS portion and the NMOS portion. Insulating spacers may also be formed around the gate region of the NMOS portion. The PMOS portion is then masked with a first masking substrate.

Dopant ions of a suitable type are thereafter implanted into the NMOS portion to create at least one active region therein. Thereafter, the first masking substrate is removed from the PMOS portion, and a layer of silicon-containing material is deposited over the PMOS and NMOS portions. In the embodiment to be discussed, the layer of silicon-containing material is a polysilicon layer.

Once deposited, the polysilicon layer is masked with a second masking substrate. The second masking substrate is patterned so as to leave unmasked a portion of the polysilicon layer located above a selected active region of the NMOS portion.

Subsequently, ions are implanted into the unmasked portion of the polysilicon layer. In so doing, the second masking substrate prohibits ions from substantially impinging into and implanting the portions of the polysilicon layer underlying the masking substrate. The ion implantation operation is conducted substantially as described above for the first method. The second masking substrate is then removed, and the polysilicon layer is etched with the etching process which is selective to implanted silicon-containing material, thereby removing the portions of the polysilicon layer that were underlying the masking substrate. The unmasked portion of the polysilicon layer above the selected active region of the NMOS portion remains and forms a polysilicon interconnect structure.

The ion implantation and etching process parameters can be appropriately selected in the manner discussed in the description of the first method above. Once again, the ion implantation operation can be conducted at an angle other than orthogonal to the silicon substrate, and can be conducted in multiple stages. The type of masking substrate may also be varied and the implanted ions can optionally be diffused by heat treatment to further tailor the shape of the resulting interconnect structure.

Once the interconnect structure is formed, the NMOS portion is covered with a masking substrate, and ions are implanted into the PMOS portion to form at least one active region therein.

Thus, under the fifth method, an interconnect structure is formed in a CMOS process flow that eliminates several steps required by conventional prior art methods. Also, the source/drain regions of the NMOS and PMOS regions are doped without cross-contamination from the ion implantation or etching processes. The number of masking and etching operations is reduced from the conventional CMOS process flow, thereby increasing throughput of the integrated circuit manufacturing process and ultimately reducing the cost of the integrated circuits formed thereby. The fifth method is also simple and efficient and leads effectively into contact etch and capacitor formation.

A sixth method of the present invention is used to form a free-standing wall. The free-standing wall is suitable for use in forming a stacked capacitor storage node. Under the sixth method, a layer of silicon-containing material, which is a polysilicon layer in the embodiment to be described, is initially deposited upon a semiconductor substrate. The polysilicon layer is preferably formed of intrinsic polysilicon.

After forming the polysilicon layer, a masking substrate is applied over the polysilicon layer and is patterned to form a mask island. A dry etching process is then used to anisotropically remove the exposed portion of the polysilicon layer. The dry etching process forms a polysilicon block out of the polysilicon layer that has surface dimensions corresponding to the surface dimensions of the island of the masking substrate.

After the dry etching process is concluded, one or more of the laterally extending surfaces of the polysilicon block are implanted with ions with the masking substrate remaining in place. Following the ion implantation operation, the masking substrate is removed and an etching process is conducted which is selective to implanted silicon-containing material is conducted. Depending on the shape of the polysilicon block and the extent of the laterally extending surfaces of the polysilicon block that is implanted, a variety of differently shaped free-standing walls can be formed. By forming the polysilicon block with the appropriate shape, for instance, thin and laterally extending polysilicon columns can be formed, pairs of which are suitable for forming container capacitors. Thin posts can also be created which are characterized as columns of relatively small thickness.

When the entire periphery of the polysilicon block is implanted, continuously extending free-standing walls are formed. If the polysilicon block is circular, an annular free-standing wall is formed. The thickness of the resulting free-standing wall is determined by the angle of implantation and the implantation energy of the implanted ions. Consequently, the free-standing wall can have sub-photolithography resolution thickness dimensions.

The free-standing wall of the sixth method can be formed with a high aspect ratio of which conventional photolithography and etching methods are incapable. The capability of forming the free-standing wall with a variety of shapes adds a flexibility to the integrated circuit formation process. Additionally, the free-standing wall is formed in an efficient manner with a minimum of processing operations, thereby maintaining a high throughput and low cost of the integrated circuit manufacturing process.

A seventh method of the present invention is similar to the sixth method, and is also used to form a free-standing wall that is suitable for forming a stacked capacitor storage node. The seventh method involves initially depositing a polysilicon layer as in the sixth method, and thereafter applying and patterning a masking substrate over the polysilicon layer. The masking substrate is as in the seventh method, but it is also patterned with an opening to form a corresponding patterned opening in the polysilicon layer. Directional ion implantation is then conducted to implant ions into the laterally extending surface of the opening in the polysilicon layer with the masking substrate in place. The ion implantation operation is conducted substantially in the manner described above for the first method, and is conducted with an angle of implantation other than orthogonal to the surface of the semiconductor substrate in order to implant the laterally extending surface of the opening in the polysilicon layer. The masking substrate is thereafter removed, and the etching process is conducted which is selective to implanted silicon-containing material which is substantially in the manner described above in the first method, and results in a free-standing wall.

The free-standing wall can be formed with a variety of configurations, depending on the shape of the masking substrate opening and the extent to which the laterally extending surface of the shaped opening in the polysilicon layer is implanted. For instance, by forming a circular masking substrate opening and implanting the entirety of the laterally extending surface of the opening in the polysilicon layer, an annular free-standing wall can be formed such as is suitable for forming a stacked capacitor storage node or a surround-gate transistor gate region. Thus, the free-standing wall of the seventh method has similar advantages to the sixth method, and provides an added flexibility to the integrated circuit manufacturing process.

An eighth method of the present invention is used to form a surround-gate MOS transistor. Initially under the eighth method, a free-standing wall is created, preferably in a manner described above for either the sixth or the seventh method. The free-standing wall is preferably continuous, defining a chamber therein and could be of any suitable shape, including rectangular or hexagonal. The preferred shape is annular. The free-standing wall is formed on the semiconductor substrate over a gate oxide layer, after which a continuous insulating spacer is formed on either side of the free-standing wall. Dopants are then implanted into the silicon substrate at the interior of the free-standing wall and around the exterior of the free-standing wall. The dopants are selected as N-type or P-type dopants, depending on whether the transistor being formed is an N-channel or P-channel transistor, respectively. The implanted interior and exterior of the free-standing wall region form the source/drain regions of the surround-gate transistor.

Formed thereby is a surround-gate transistor, with a gate region formed from the free-standing wall, a source/drain region formed at the interior of the gate region, and another source/drain region formed at the exterior of the gate region, surrounding the gate region. A MOS transistor channel extends under the gate region, and has a short channel length determined by the thickness of the free-standing wall. As the thickness of the free-standing wall is not dependent upon conventional photolithography resolution levels, the MOS transistor channel can correspondingly be quite short. Preferably, the channel has a length of less than about 0.25 microns.

A DRAM memory cell can also be formed under the eighth method. In so doing, the surround-gate transistor is formed as described, and a word line is connected with the gate of the surround-gate transistor. A lower insulating layer is then formed over the surround-gate transistor. Interconnect structure openings are opened through the lower insulating layer down to the source/drain regions of the surround-gate transistor. The interconnect structure openings are filled with conductive material to form contacts. One contact is constructed extending down to the source/drain region at the interior of the gate region, and a second is constructed extending down to the source/drain region at the exterior of the gate region.

In a further procedure of forming the DRAM memory cell, a storage node is formed over the lower insulating layer, connecting with the contact extending down to the source/drain region at the interior of the gate region. A dielectric layer is formed over the storage node, and an upper capacitor plate is formed over the dielectric layer. An upper insulating layer is then formed over the capacitor, and a digit line is formed at the top thereof connected with the contact that extends down to the source/drain region at the exterior of the gate region.

The MOS surround-gate transistor occupies a minimum of space on the semiconductor substrate, and is formed in a simpler and more efficient manner than surround-gate transistors of the prior art. The MOS surround-gate transistor can be formed with a short MOS transistor channel, which can be of a length of less than about 0.2 microns. The MOS surround-gate transistor is easily incorporated into a DRAM memory cell, which, similar to the MOS surround-gate transistor, occupies a minimum of surface area on the semiconductor substrate. The DRAM memory cell also exhibits a low amount of leakage due to the placement of the capacitor over the center of the MOS surround-gate transistor.

A ninth method of the present invention is used to form a cone shaped free-standing wall that is suitable for use as a stacked capacitor storage node. Under the ninth method, a layer of silicon-containing material, which is a polysilicon layer in the embodiment to be discussed, is initially deposited upon a semiconductor substrate. In the discussed embodiment, the semiconductor substrate is a silicon substrate which has gate regions formed thereon to the sides of active regions also formed thereon. The polysilicon layer is preferably formed of intrinsically doped polysilicon. After deposition of the polysilicon layer, an insulating layer is formed over the polysilicon layer.

Once the insulating layer is formed, a masking substrate is deposited and patterned over the insulating layer. The masking substrate is patterned with an opening at the location wherein the conical stacked capacitor storage node is to be formed. A dry etching process is then used to etch the exposed region of the polysilicon layer in a sloping fashion. A conical opening is thereby formed in the polysilicon layer that tapers down to an active region in the silicon substrate. After the dry etching process is concluded, the masking substrate is removed and a second polysilicon layer is deposited over the first polysilicon layer and over the insulating layer. The second polysilicon layer is then implanted with ions in the manner discussed for the first method above to form an implanted region therein.

The uppermost portion of the second polysilicon layer and the insulating layer are thereafter removed by planarization. Following planarization, the etching process discussed above which is selective to implanted silicon-containing material is conducted. In substantially the same manner as described for the first method above, a free-standing wall is thus formed having a high aspect ratio, a conical shape, and a small area of contact with the underlying active region, thereby occupying a minimum of space on the silicon substrate.

The ninth method is advantageous in that it eliminates a masking and material deposition operation from the prior art stacked capacitor storage node formation processes, thereby increasing throughput of the integrated circuit manufacturing process. The integrated circuit manufacturing process is thereby simplified, increasing yield and decreasing cost. The ninth method also has a relatively large alignment process window, further increasing yield and further facilitating greater miniaturization of the integrated circuit being fabricated.

A tenth method of the present invention uses the etching process which is selective to unimplanted silicon-containing material of the second method to form an interconnect structure. In the embodiment to be discussed, the layer of silicon-conducting material comprises a polysilicon layer. The polysilicon layer is preferably formed of intrinsic polysilicon. The tenth method initially involves forming active regions and gate structures on a semiconductor substrate. A lightly doped or undoped polysilicon layer is then formed over the gate structures.

Once the polysilicon layer is formed, a masking substrate is applied over the polysilicon layer and is patterned to cover a portion of the polysilicon layer located above a conducting region that is to be electrically connected by the polysilicon plug. In the discussed embodiment, the conducting region is an active region. A portion of the polysilicon layer that is to be removed is left exposed. After patterning the masking substrate, an anisotropic etching process is conducted through the openings in the masking substrate. The anisotropic etching process partially reduces the height of the portion of the polysilicon layer that is not covered by the masking substrate. Exposed portions of the polysilicon layer are consequently reduced to less than their original height.

An ion implantation operation is subsequently conducted substantially in the manner described above for the second method. The preferred type of ions to be implanted by the ion implantation process is arsenic ions. An etching process is conducted after implantation which is selective to unimplanted silicon-containing material as described for the second method above. Once again, the parameters of the selective etching process and the ion implantation operation can be appropriately selected to tailor the profile of the portion of the polysilicon layer that is implanted. An interconnect structure is thereby formed, such as a polysilicon plug that is formed in a more efficient and streamlined manner than the above-discussed methods of the prior art.

An eleventh method of the present invention uses the etching process which is selective to implanted silicon-containing material of the first method as well as a height reduction operation to form an interconnect structure. Under the eleventh method, a plurality of raised insulating surfaces are initially provided on a semiconductor substrate. In the embodiment to be discussed, the raised insulating surfaces comprise a plurality of gate regions. Silicon nitride caps are preferably formed on the tops of the plurality of gate regions. At least one charge conducting region, preferably an active region, is also provided between the gate regions at the bottom thereof. A polysilicon layer is then formed over the active region and the gate regions which fills in an intervening open area located over the active region and between the gate regions.

In a subsequent procedure of the eleventh method, the height of the polysilicon layer is reduced down to the level of the tops of the gate regions, preferably with a planarization process. The planarization process more preferably comprises chemical mechanical planarization (CMP) which stops on the silicon nitride caps formed over the gate regions.

A masking substrate is, in subsequent procedure, formed over the polysilicon layer and the gate regions and is patterned with an opening over the portion of the polysilicon layer that overlies the active region above which the interconnect structure is to be formed. The opening in the masking substrate also slightly overlaps the tops of the gate regions. The opening is a thereby self-aligned in that a slight misalignment of the masking substrate will not result in a defect condition.

Ions of a type selected in accordance with the etching process which is selective to implanted silicon-containing material, as discussed for the first method, are then implanted into a selected segment of the polysilicon layer that overlies the active region. The nitride spacers prevent the ions from being implanted into the gate regions, and consequently also assist in self-alignment.

The masking substrate is then removed and the etching process which is selective to implanted silicon-containing material is conducted in a manner substantially as described above for the first method. The etching process which is selective to implanted silicon-containing material removes the polysilicon layer except for the selected segment overlying the active region that was implanted with ions. The remaining selected segment that is not etched away forms an interconnect structure. In the discussed embodiment, the interconnect structure is a polysilicon plug that extends from the active region up to the level of the tops of the gate regions.

The eleventh method simplifies the interconnect structure formation process by eliminating the BPSG deposition, reflow, and dry etching steps of the prior art polysilicon plug formation process discussed above. The streamlined process increases integrated circuit fabrication process throughput and reduces costs. The problems associated with the dry etching process of the prior art and the formation of the high aspect ratio interconnect structure openings are also avoided.

A twelfth method of the present invention uses the etching process which is selective to implanted silicon-containing material of the present invention and a planarization process which stops on silicon nitride to form a sacrificial interconnect structure. In addition, the twelfth method further involves the subsequent removal of the self-aligned interconnect structure to form an extended depth interconnect structure opening.

Initially in the twelfth method, a sacrificial interconnect structure is formed, preferably in the manner described above for the eleventh method, and is used as a removable "dummy" in forming an extended depth interconnect structure opening. In the twelfth method, a thin insulating layer is formed over a semiconductor substrate surface. A charge conducting region which is to be provided with electrical contact through the extended depth interconnect structure opening is located beneath the thin insulating layer, central to a plurality of raised insulating surfaces. An intervening open area is thus formed above the charge conducting region in between the plurality of raised insulating surfaces.

Thereafter, a sacrificial interconnect structure is formed in the intervening open area extending from the charge conducting regions to the tops of the raised insulating surfaces. The sacrificial interconnect structure is preferably formed in the manner described for the eleventh method. Once the sacrificial interconnect structure is formed, a blanket layer of insulating material is formed over the interconnect structure.

In one embodiment to be discussed, the semiconductor substrate is a silicon substrate, the charge conducting region is a source/drain region, the sacrificial interconnect structure is a polysilicon plug, and the raised insulating surfaces are gate regions. The gate regions are preferably provided at the tops thereof with silicon nitride caps. Once the polysilicon plug is formed over the source/drain region, a blanket layer of insulating material is formed over the polysilicon plug extending over and a distance above the polysilicon plug.

An interconnect structure opening is then formed through the blanket layer of insulating material extending down to the top of the polysilicon plug, thereby exposing the top of the polysilicon plug. In one manner of so doing, a masking substrate is applied and patterned, and an etching process is conducted which etches the material of the blanket layer of insulating material selective to polysilicon. In order to form the polysilicon plug in a self-aligned manner, the etching process is also preferably selective to the silicon nitride caps at the tops of the gate regions. The interconnect structure opening can be formed wider than the polysilicon plug, as the silicon nitride caps at the tops of the gate regions will stop the etching process from penetrating into the gate regions. Consequently, a leeway of approximately half the width of the gate structures is provided for the possibility of misalignment of the interconnect structure opening.

The polysilicon plug is then removed to expose the underlying source/drain region. The polysilicon plug is preferably removed using an etching process that selectively etches polysilicon and does not etch the blanket layer of insulating material or the material of the gate region caps. The etching process is also preferably selective to the material of the thin insulating layer in order to allow the thin insulating layer to function as an etch barrier and to prevent over-etching into the underlying source/drain region. One such etching process uses an etchant comprising a TMAH wet etch. The TMAH wet etch removes the polysilicon plug selective to the blanket layer of insulating material and the silicon nitride caps at the tops of the gate regions.

Once the polysilicon plug is removed, an extended depth self-aligned interconnect structure opening is formed in the location of the polysilicon plug, and extends from the source/drain region up to the top of the blanket layer of insulating material. The extended depth interconnect structure opening is in one embodiment filled with aluminum to form an aluminum contact. The extended depth interconnect structure is particularly useful in the formation of a stacked capacitor, where it is desirable that the base of the stacked capacitor be integral to the storage node of the stacked capacitor. Forming the base of the stacked capacitor integral to the storage node thereof provides a higher cell capacitance, as compared to stacked capacitors formed with non-integral polysilicon plugs of the prior art.

A thirteenth method of the present invention uses the etching process which is selective to implanted silicon-containing material of the first method to form a stacked capacitor storage node that has a large surface area. The thirteenth method initially involves forming an interconnect structure extending down through a planarized lower insulating layer to a charge conducting region on a semiconductor substrate. The interconnect structure is preferably formed in the manner described in the eleventh method, wherein a polysilicon plug is formed extending down to an active area between a pair of gate regions on a silicon substrate of a semiconductor wafer.

Once the polysilicon plug is formed, an upper insulating layer is deposited over the polysilicon plug and the gate regions. The upper insulating layer is then planarized, and an opening is formed in the upper insulating layer extending down to the tops of silicon nitride spacers located on the tops of the gate regions. The opening overlaps the silicon nitride spacers, allowing the opening to be self-aligned to the polysilicon plug that is located between the gate regions. The opening also exposes the top of the polysilicon plug. The opening is preferably circular, with a horizontal bottom and vertically extending sides.

After the opening is formed, a lower silicon-containing layer is formed over the surface of the opening. The lower silicon-containing layer is intrinsically doped with impurities that cause the etching process which to etch the lower silicon-containing layer slowly, where the etching is selective to implanted silicon-containing material discussed above for the first method. An intermediate silicon-containing layer, which is only lightly doped or which is not doped, is then formed over the lower polysilicon layer. An upper silicon-containing layer is then formed over the intermediate silicon-containing layer and is doped in a similar manner to the doping of the lower insulating layer. Each of the lower, intermediate, and upper polysilicon layers preferably comprise a horizontally extending bottom section and a vertically extending side section extending upward from the edges of the bottom section. Each of the lower, intermediate, and upper silicon-containing layers preferably comprise polysilicon.

Ions are subsequently implanted into the bottom section of the intermediate silicon-containing layer. In so doing, ions can also be implanted into the lower and upper silicon-containing layers with no detrimental effects. The ions of the ion implantation operation are preferably implanted with an angle of implantation orthogonal to the plane of the substrate, and with a selected implantation energy range. The selected implantation energy range is selected such that portions of the lower and upper side sections that extend above the surface of the opening will block the implanted ions from impacting the side sections of the intermediate silicon-containing layer. The side sections of the upper silicon-containing layer also block implanted ions from impacting the outer edges of the bottom section of the intermediate silicon-containing layer that underlie the side sections of the upper polysilicon layer. Accordingly, only a central portion of the bottom section of the intermediate silicon-containing layer is implanted with ions.

Portions of the lower, intermediate, and upper silicon-containing layers which are formed above the top of the upper insulating layer are then removed with a height reduction process such as planarization. Alternatively, there could be an over polish to further remove the intermediate layer which might have been impacted by the implant. An etching process which is selective to implanted silicon-containing material is then conducted to remove relatively unimplanted portions of the intermediate polysilicon layer. The central portion of the bottom section of the intermediate polysilicon layer which was implanted with ions is left remaining, while the outer edges of the bottom section and the sidewalls of the intermediate silicon-containing layer which were not implanted with ions are etched away. Thus, the entirety of the sidewalls and a portion of the bottom sections of the lower and upper polysilicon layers are exposed, increasing the surface area of the storage node. A shaped structure is formed thereby with a large surface area that makes the shaped structure highly suitable for use as a storage node of a stacked capacitor. In completing a stacked capacitor, a thin dielectric layer is formed over the storage node, and a cell plate is formed over the thin dielectric layer.

The storage node is formed in a streamlined and efficient manner, with only a single etching process that is conducted with a simple wet etch. The storage node has a large surface area, yet occupies a minimum of space on the semiconductor substrate.

A fourteenth method of the present invention uses the etching process which is selective to implanted silicon-containing material of the first method, and forms a stacked capacitor storage node with a free-standing wall having a thickness determined by the selection of a set of implantation parameters of an ion implantation operation. The stacked capacitor storage node is also formed with a roughened surface for greater surface area. The fourteenth method initially involves providing a semiconductor substrate and a charge conducting region to which the stacked capacitor storage node will be connected. In one embodiment, the semiconductor substrate comprises a silicon substrate of a semiconductor wafer and the charge conducting region comprises an active region located on the semiconductor substrate. It is preferred that a pair of gate regions be formed on the silicon substrate, one at either side of the active region. A layer of insulating material is then formed over the gate regions and the active region with a depth corresponding to a height to which the storage node is desired to extend above the gate regions.

Once formed, the insulating layer is thereafter planarized and an opening is formed in the insulating layer extending down to the charge conducting region. The opening preferably is self-aligned to the pair of gate regions in the manner of the thirteenth method.

A polysilicon layer is subsequently formed in the opening. The polysilicon layer is preferably a blanket layer and is deposited with a thickness that only partially fills the opening. The thickness of the polysilicon layer is selected in accordance with a desired thickness of the stacked capacitor storage node sidewalls to be formed and with an etching process which is selective to implanted silicon-containing material.

An ion implantation process is then conducted in the manner described in the discussion of the first method. The ions are implanted into an outer portion of the polysilicon layer and are not implanted into an inner portion thereof. In order to do so, the ions are preferably implanted at an angle other than orthogonal to the plane of the semiconductor wafer. The ions are also implanted with an implantation energy selected in conjunction with the angle of implantation to implant the polysilicon layer to a desired depth. The desired depth corresponds to a thickness of a resulting free-standing wall of a stacked capacitor storage node that is to be formed from the polysilicon layer. The ion implantation can be conducted in stages with the ion implantation parameters varied between the stages to tailor the shape of the implanted portion as was discussed for the first method.

The remainder of the opening is thereafter filled with photoresist or other suitable material in preparation for conducting a height reduction process. The photoresist or other suitable material protects the polysilicon in the opening from being contaminated by the height reduction process. The height reduction process is then conducted to remove portions of the polysilicon layer that extend above the top of the insulating layer. The height reduction process is preferably a planarization process and more preferably is a CMP process.

The surface area of the stacked capacitor storage node is increased by roughening the polysilicon layer at this stage or at a later stage in the fourteenth method. To do so, a layer of hemispherical or cylindrical grain polysilicon is preferably deposited with a chemical vapor deposition (CVD) process on the polysilicon layer in the opening.

In a further procedure, the etching process which is selective to implanted silicon-containing material is conducted and removes the unimplanted inner portion of the polysilicon layer. The implanted outer portion of the polysilicon layer remains in place and forms a free-standing wall around the opening without physically contacting the opening except at the bottom of the opening, where it may contact the gate regions and is in electrical communication with the underlying charge conducting region. Preferably, the opening is circular, and consequently, the free-standing wall is annular.

If the interior of the free-standing wall was not roughened at a prior stage of the fourteenth method, it can be roughened at this point. As both an inner face and an outer face of the polysilicon layer are now exposed, hemispherical or cylindrical grain polysilicon is formed on both the inner face and on the outer face of the free-standing wall. Roughening the free-standing wall surface at the prior stage results in only the inner face being roughened. Accordingly, roughening at this later stage is preferred over roughening in the prior stage.

Once the stacked capacitor storage node is formed, conventional process flow is followed to complete a stacked capacitor. Briefly, completion of a stacked capacitor involves forming a dielectric layer over the storage node, and forming a layer of polysilicon or other charge conducting material over the dielectric layer.

The fourteenth method is advantageous in that the stacked capacitor formed thereby has a large surface area, yet consumes minimal space on the silicon substrate of the semiconductor wafer. The method is simple and can be conducted so as to provide for high throughput and low cost of the integrated circuit fabrication process.

A fifteenth method of the present invention uses the etching process which is selective to implanted silicon-containing material of the first method along with multiple ion implantations of differing ranges of depth or otherwise in different patterns to form shaped polysilicon structures. The manner of formation of several representative shaped structures formed by variations of the basic embodiment of the fifteenth method are discussed herein.

The basic embodiment of the fifteenth method initially involves providing a volume of silicon-containing material. In the embodiments discussed herein, the volume of silicon-containing material comprises a polysilicon layer. Once the polysilicon layer is provided, a first selected region of the polysilicon layer is implanted with ions to a first depth range. A second selected region of the polysilicon layer is then also implanted with ions to a second depth range. The second depth range is preferably implanted with a lower implantation energy range and extends less deeply into the polysilicon layer than the first depth range. After ion implantation, the polysilicon layer is etched with an etching process which is selective to implanted silicon-containing material to remove the unimplanted polysilicon. The etching process is conducted substantially as described above for the first method.

The first and second selected regions are left remaining and form a shaped structure. Other selected regions which are implanted with ions to a different depth range or which are patterned with a different profile can be added to the first and second regions to form shaped structures of varying conformations.

In one embodiment, a free-standing bridge is formed by implanting regions of the polysilicon layer to form two uprights and an intervening cross-bar extending therebetween. The free-standing bridge can be formed with multiple cross-bars of different heights. The multiple cross-bar free-standing bridge is suitable for use as a severable fuse and can be employed in forming a programmable read only memory device (PROM).

By forming a single upright and a cross-bar integrally attached to the upright, a lever is formed that is suitable for use in forming micromachines. Overlapping cross-bars which do not electrically contact each other can also be formed.

In a further embodiment, a polysilicon block with an integrally formed tunnel extending entirely through the bottom thereof is formed. The polysilicon block is shaped and formed with a dry etching process, and the tunnel is formed by implanting portions of the polysilicon block that are to remain and then selectively etching away the relatively unimplanted portions.

In a further embodiment, a tunnel is formed extending from the surface of the polysilicon layer down below the surface of the polysilicon layer. A portion of the polysilicon layer situated around the tunnel is oxidized, and a metal is deposited into the tunnel to result in a conducting interconnect line routed beneath the surface of a now oxidized polysilicon layer.

The fifteenth method provides the capability of forming a wide variety of conducting shaped structures in an efficient manner, thereby allowing for greater functionality of the resulting integrated circuit. The shaped structures of the fifteenth method are formed with a minimal number of material deposition, masking, and etching operations. The shaped structures are thus formed efficiently, consuming a minimum of integrated circuit manufacturing process time.

A sixteenth method of the present invention uses the etching process which is selective to implanted silicon-containing material of the first method to form a bottle shaped trench in a semiconductor substrate. The bottle shaped trench is useful for forming a trench capacitor and for forming a trench isolation region.

The sixteenth method initially involves forming a substantially anisotropic trench in a volume of silicon-containing material on a semiconductor substrate. In one embodiment to be described, the volume of silicon-containing material is a silicon substrate and the semiconductor substrate is a semiconductor wafer. Thus, in this embodiment, a silicon substrate is provided and a masking substrate is formed over the silicon substrate. In one embodiment, the masking substrate is a photoresist mask and is self-aligned to gate regions formed on either side of the trench. Ions are then implanted into the trench. The ions are preferably implanted at an angle of implantation other than orthogonal to the surface of the silicon substrate. The angle of implantation is selected such that the ions are primarily directed toward the bottom portion of the trench rather than toward the top of the trench. Consequently, the bottom of the trench is implanted to a greater extent than the top of the trench.

An etching process which is selective to silicon-containing material that is not implanted with ions of the selected type is then conducted substantially in the manner described above for the second method. Material from the implanted portions of the trench is thereby removed, expanding the bottom of the trench more than the top of the trench and giving the trench its bottle shape. The bottle-shaped trench can be used for various applications, including the formation of a trench capacitor and a trench isolation region.

When forming a trench capacitor, a storage node is deposited in the trench, followed by a dielectric layer and an upper capacitor plate to complete the trench capacitor. When forming a trench isolation region, the bottle-shaped trench is filled with insulating material. The insulating material can be formed by first growing a layer of silicon oxide on the trench sidewalls and then depositing an insulating material into the remainder of the trench.

The trench capacitor is thus formed with greater surface area than if a conventionally shaped trench were formed. The greater surface area is achieved without occupying additional surface area of the silicon substrate. It is also achieved with a simple and efficient process. The trench isolation region likewise is formed with a large volume, and consequently provides great isolation capability, without consuming a large amount of silicon substrate surface area. The large volume provides a high resistance to cross-talk current leakage without sacrificing semiconductor device density and miniaturization.

A seventeenth method of the present invention uses the etching process which is selective to implanted silicon-containing material of the first method. The seventeenth method forms a region of silicon-containing material on each of one or more exposed horizontal surfaces of a semiconductor substrate, while not forming a region of silicon-containing material on any exposed vertical surfaces.

The seventeenth method initially involves providing a semiconductor substrate on which is located a protruding structure having an exposed horizontal surface and an exposed vertical surface. The protruding structure can be, for instance, a gate region on a silicon substrate of a semiconductor wafer.

A layer of silicon-containing material is formed over the exposed horizontal surface and over the exposed vertical surface. The layer of silicon-containing material is, in one embodiment which is to be discussed, a polysilicon layer. The polysilicon layer is preferably intrinsic polysilicon.

Ions are, in a subsequent procedure, implanted into the portion of the polysilicon layer that is situated on the exposed horizontal surface. The ions are of a type selected in accordance with an etching process which is selective to implanted polysilicon as described for the first embodiment. The ions are preferably implanted with an angle of implantation that is orthogonal to the exposed horizontal surface.

The implantation of ions at an orthogonal angle causes portions of the polysilicon layer situated on the exposed horizontal surface to be implanted with ions and does not substantially implant ions into a portion of the polysilicon layer situated over the exposed vertical surface.

In a subsequent procedure, the etching process is conducted which is selective to implanted silicon-containing material which is described above in the discussion of the first method. Thus, the portion of the polysilicon layer that was situated over the exposed vertical surface and was thus not implanted with ions is etched away. The portion of the polysilicon layer that is located over the exposed horizontal surface and was thus implanted with ions is left remaining.

Several applications of the seventeenth method are provided. In one application, the vertically protruding feature is a gate region of a MOS transistor, and a polysilicon region is formed on the horizontal surfaces of the gate region for use as an implant mask for a halo implant to provide punch-through protection.

In a further application, polysilicon regions are formed on horizontal surfaces for use as interconnect lines. When forming interconnect lines, protruding features of the interconnect lines can be formed from insulating material. Consequently, polysilicon regions formed at the sides and top of the protruding features, which are not in electrical communication therewith, can be used to form separate interconnect lines. Such a protruding feature could also be an existing interconnect line, or a gate region, and could have thereon an insulating layer for electrically isolating the protruding feature from the region of polysilicon located on top of the protruding feature. Thus, the region of polysilicon situated on the protruding feature and the protruding feature can each form separate interconnect lines.

When forming interconnect lines or other such conducting shaped structures, the polysilicon region, once formed on a horizontal surface, can be converted to a refractory metal silicide to increase the conductivity thereof. In so doing, a layer of refractory metal such as titanium is deposited over the region of polysilicon, typically as a blanket layer. Thereafter, a heating treatment is conducted to react the exposed region of polysilicon with the refractory metal. The portions of the unreacted refractory metal can then be removed with a suitable etching process which etches the refractory metal selective to a silicide of the refractory metal. Refractory metal silicide is left over the exposed horizontal surface in the location where the region of polysilicon was located.

The interconnect lines and halo mask implant are each formed in a simple and efficient manner that is compatible with current process flows. The interconnect lines can be formed close together with high density, and the halo implant mask can be formed accurately and with appropriately sized openings which are useful in forming highly miniaturized transistors.

An eighteenth method of the present invention uses the etching process which is selective to implanted silicon-containing material of the first method. The eighteenth method forms a narrow interconnect line that is integrally connected to a region of greater width for electrically connecting the interconnect line to a larger structure. The narrow interconnect line can be formed with a sub-photolithography resolution width.

The eighteenth method initially involves providing a layer of silicon-containing material, which by way of example in the embodiment to be discussed is a polysilicon layer on a semiconductor substrate. The polysilicon layer is preferably formed from intrinsic polysilicon. Once the polysilicon layer is deposited, a masking substrate is applied and is patterned with an opening through which a selected region of the polysilicon layer will be implanted with ions. The selected region is used for connecting the interconnect line, once formed, with a structure of greater width than the interconnect line.

After the masking substrate is applied, a first ion implantation process is conducted in which the selected region is implanted with ions of a selected type chosen in accordance with an etching process which is selective to implanted silicon-containing material, as was discussed above for the first embodiment. The masking substrate is then removed and a second masking substrate is applied over the polysilicon layer and is patterned to have a selected surface shape, the outer periphery of which coincides with the desired location of the interconnect line. A dry etching process or equivalent material removal process is then conducted to reduce the polysilicon layer to a block of polysilicon having anisotropically etched sidewalls and a perimeter of the selected surface shape. The selected region is preferably located proximal to the perimeter of the block of polysilicon.

While the second masking substrate is in place, ions are implanted with a second ion implantation process into one or more laterally extending surfaces of the block of polysilicon. The ions are of a type that is selected in accordance with an etching process which is selective to implanted silicon-containing material as discussed for the first embodiment. The ions of the second ion implantation operation can be of the same type as the ions of the first ion implantation process, or can be of a different type. The ions of the second implantation process are implanted with an angle and energy selected to implant ions into laterally extending surfaces of the block of polysilicon to a selected depth. The selected depth corresponds to the thickness of the completed interconnect line. The angle of implantation is conducted essentially in the manner discussed above for the first and sixth methods.

After ion implantation is conducted, the etching process which is selective to implanted silicon-containing material is conducted substantially as described above in the discussion of the first method. The result is that unimplanted polysilicon of the block of polysilicon is etched away and implanted polysilicon is left remaining. The implanted regions of the one or more sidewalls thus remains, as does the selected region. The selected region of the polysilicon layer forms a contact pad and is integrally connected with the interconnect line. Of course, more than one contact pad can be formed on the interconnect line, and more than one interconnect line can be formed.

The entire perimeter of the block of polysilicon can be implanted so as to divide the block of polysilicon into two or more separate interconnect lines that are separated by breaks formed in the interconnect lines. In one embodiment, the breaks are formed using sacrificial spacer blocks close to the outer perimeter of the block of polysilicon. The sacrificial spacer blocks are formed prior to the second ion implantation operation, preferably during the patterning and formation of the block of polysilicon. The sacrificial spacer blocks absorb the implanted ions and block the implanted ions from implanting a segment of the sidewall of the block of polysilicon. Consequently, an opening is formed at the location of the segment that was not implanted, causing therein a break in the resulting interconnect line. Alternatively, the opening could be formed with a separate masking and etching procedure that is conducted after the interconnect line has been formed.

The interconnect line formed by the eighteenth method has a shape determined by the angle of implantation and the implantation energy, rather than by photolithography, and consequently can have a width that is smaller than that which can be provided by conventional photolithography processes. The interconnect line of the eighteenth method is also formed with an integral structure of greater width than the interconnect line for connecting the interconnect line to a larger structure. Consequently, the interconnect line can be highly miniaturized, while maintaining the flexibility of being able to connect easily to other semiconductor devices or features of semiconductor devices thereof. Additionally, the narrower interconnect line can be used as a gate region and when so used will have a short channel length. The short channel length allows for a lower threshold voltage of the MOS transistor and consequently a higher speed.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 71 is a cross-sectional view of the semiconductor wafer of FIG. 70, showing a further procedure of the fifteenth method of the present invention in which an etching process is conducted which is selective to implanted silicon-containing material, and in which relatively unimplanted portions of the polysilicon layer are removed to form a free-standing bridge.

FIG. 72 is a cross-sectional view of a semiconductor wafer showing a lever formed by an alternate embodiment of the fifteenth method of the present invention.

FIG. 73 is a cross-sectional view of a semiconductor wafer showing a multiple cross-bar free-standing bridge formed by another alternate embodiment of the fifteenth method of the present invention.

FIG. 74a is a cross-sectional view of a semiconductor wafer showing overlapping bridges formed by yet another alternate embodiment of the fifteenth method of the present invention, and FIG. 74b is side view of FIG. 74a.

DETAILED DESCRIPTION OF THE PREFERRED EMBODIMENTS

1. Formation of Shaped Structures with an Etching Process which is Selective to Implanted Silicon-containing Material FIGS. 1 through 9 of the accompanying drawings illustrate a first method of the present invention. In the first method, a volume of a silicon-containing material on a semiconductor substrate is patterned with an etching process. The etching process is selective to implanted silicon-containing material to form a shaped opening in the volume of silicon-containing material. The interconnect structure opening can comprise an interconnect structure opening, a trench, or another such shaped structure formed by removing a selected portion of the volume of silicon-containing material. The shaped opening can be formed with smaller dimensions than can currently be formed with current conventional photolithography technology. A shaped opening in a layer of material other than the silicon-containing material can also be formed by using the shaped opening as a hard mask for etching the layer of material other than the silicon-containing material.

Figure 1:
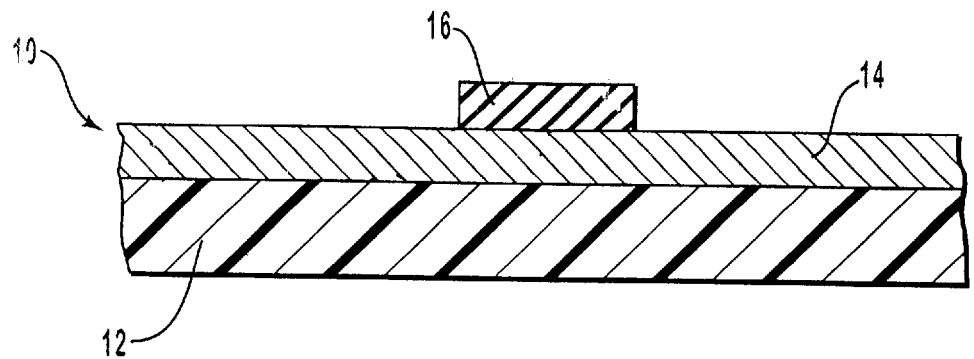
FIG. 1 is a cross-sectional view of a semiconductor wafer having a polysilicon layer provided thereon that is patterned with a masking substrate in an initial procedure of a first method of the present invention.

FIG. 1 illustrates an initial procedure of the first method. In the embodiment depicted in FIG. 1, a shaped opening in the form of a hole is being formed in a volume of silicon-containing material that in the depicted embodiment comprises a polysilicon layer. A semiconductor substrate is shown, and in the depicted embodiment comprises a semiconductor wafer 10. Semiconductor wafer 10 is provided with a silicon substrate 12, atop of which is provided a volume of silicon-containing material represented as a polysilicon layer 14. As will be apparent from the disclosure herein, polysilicon layer 14 could be substituted with a volume of silicon-containing material other than polysilicon.

Polysilicon layer 14 can be deposited in any known and suitable manner, and is typically deposited with a CVD process from a precursor material such as disilane. Polysilicon layer 14 is preferably formed from intrinsic polysilicon. Intrinsic polysilicon is defined herein as polysilicon that is undoped or that is lightly doped. Lightly doped polysilicon is defined as polysilicon having less than $1 \times 10^{18}$ dopant atoms per $cm^3$ of polysilicon. Forming polysilicon layer 14 of intrinsic polysilicon facilitates the use of an etching process which is selective to implanted silicon-containing material that will be discussed below in greater detail.

Further processing of the first method, also illustrated in FIG. 1, involves forming and patterning a masking substrate over polysilicon layer 14. In the depicted embodiment, the masking substrate comprises a photoresist mask 16. The masking substrate could alternatively comprise other patternable materials which are impermeable to implanted ions. Suitable alternatives include patterned layers formed from a nitride or oxide of silicon and photosensitive polyimide. Photoresist mask 16 is applied in such a manner as to cover and mask a selected region of polysilicon layer 14 that has the approximate desired horizontal dimensions of the shaped opening to be formed. The region or regions of polysilicon layer 14 that are intended to remain are left unmasked.

Figure 2:
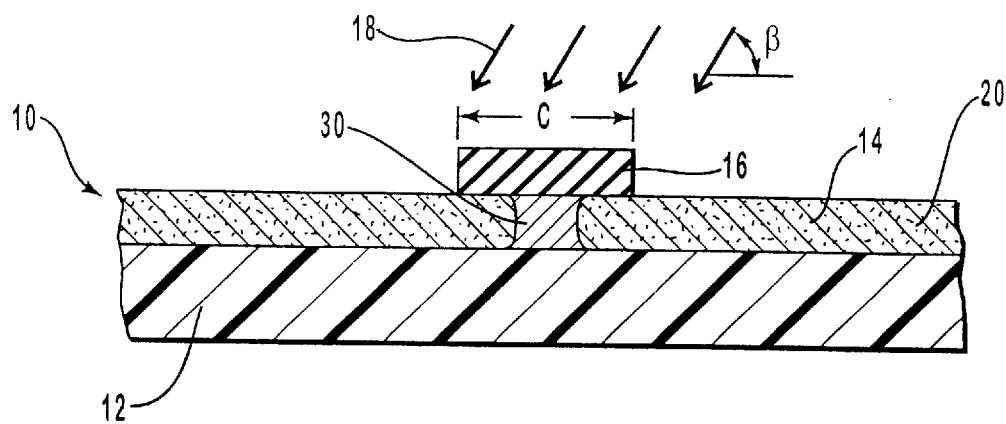
FIG. 2 is a cross-sectional view of the semiconductor wafer of FIG. 1 showing a further procedure of the first method of the present invention in which ions are implanted into unmasked portions of the polysilicon layer of FIG. 1.

FIG. 2 illustrates a further procedure in the first method. As shown in FIG. 2, once polysilicon layer 14 is covered with photoresist mask 16, ions 20 are implanted into the unmasked regions of polysilicon layer 14 Ions 20 are, in one embodiment, implanted orthogonally to the plane of semiconductor wafer 10. The orthogonal angle of ion implantation results in an anisotropic implantation of the portion of polysilicon layer 14 located under photoresist mask 16. In the depicted embodiment, however, in order to reduce the dimensions of the resulting shaped opening from the dimensions of photoresist mask 16, ions 20 are being implanted at an angle other than orthogonal to the plane of semiconductor wafer 10, causing ions 20 to be embedded under the edges of photoresist mask 16. Ions 20 to be implanted by the ion implantation operation can be selected in accordance with the etching process which is selective to implanted silicon-containing material in a manner that will be understood from the following discussion.

The ion implantation operation is conducted with certain ion implantation parameters, including implantation dose, type of masking substrate, implantation energy, type of ions implanted, and angle of implantation. The ion implantation parameters are, for the most part, determined in accordance with conventional ion implantation procedures. Nevertheless, the ion implantation operation is also used to tailor the profile of the shaped opening being formed. Consequently, the ion implantation parameters are selected in an appropriate manner so as to not only implant ions into the unmasked portion of polysilicon layer 14, but also to tailor the shape of a relatively unimplanted region 30 formed in locations where ions are not implanted. The resulting shaped opening will be formed in the location of unimplanted region 30, and will be of substantially the same profile as unimplanted region 30.

Appropriate selection of the ion implantation parameters to tailor the shape of relatively unimplanted region 30 can involve varying the ion implantation parameters from conventional parameters, or varying the implantation parameters from those used in a prior implantation operation. In the depicted embodiment, the shape of the implanted region 30 is tailored by implanting the ions at an angle that embeds the ions under the edges of photoresist mask 16 and thereby leaves a relatively unimplanted region 30 of dimensions that are smaller than those of photoresist mask 16. The extent and location of the undercutting determines the amount to which the dimensions of the resulting shaped opening vary from the dimensions of photoresist mask 16.

Thus, appropriate selection of the angle of implantation affects the amount of change in the dimensions of the shaped opening that occurs from the dimensions of an island of photoresist mask 16 situated above relatively unimplanted portion 30. For instance, selecting an angle of implantation orthogonal to semiconductor wafer 10 will allow the least amount of undercutting, and will result in a substantially uniform reduction in dimensions from the island of photoresist mask 16. Implanting at a non-orthogonal angle will result in a substantial amount of implanted ions in the region under and interior of masking layer 16 and thus, a substantial reduction in the dimensions of the shaped opening from the dimensions of the island of photoresist mask 16.

Selection of the angle of implantation can also be used to maintain a uniform profile of the shaped opening. FIG. 2 illustrates an embodiment wherein polysilicon layer 14 is being implanted with ions 20 having trajectory 18 with an angle of implantation from the surface of polysilicon layer 14. By rotating semiconductor wafer 10, or varying the direction of the implanted ions while maintaining a constant angle of implantation, ions 20 can be implanted with a consistent depth of penetration under the edges of photoresist mask 16 on all sides thereof, and thus the dimensions of the shaped opening will be uniformly reduced on all sides from the dimensions of photoresist mask 16.

As an example of a further manner of selecting the ion implantation parameters to vary the dimensions of the shaped opening, selecting a heavier ion implantation dose or a greater implantation energy will cause a greater amount of implantation under the edge of masking layer 16 and thus, a greater reduction in the dimensions of the shaped opening. The choice of material used in forming the masking substrate also affects the amount of implantation under the mask edge. The use of a masking substrate material that is more impervious to the implanted ions will reduce implantation under the mask edge, while using a less impervious masking substrate will allow more implantation under the mask edge.

Figure 3:
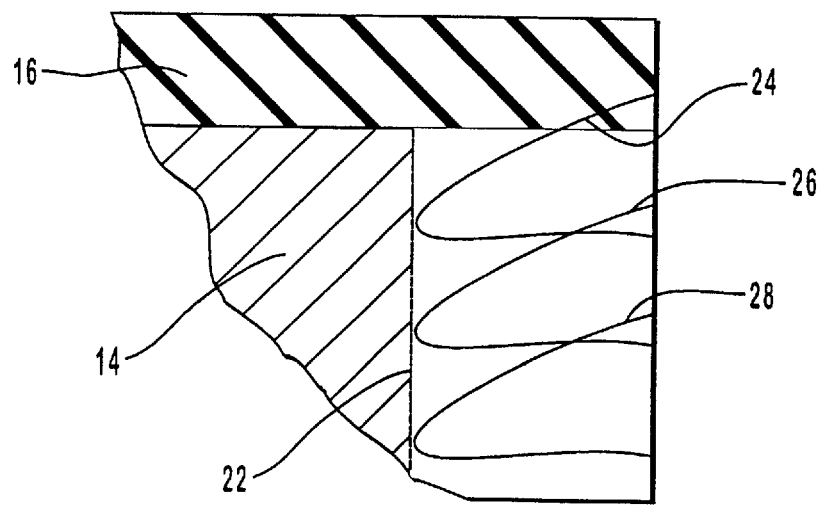
FIG. 3 is a graph depicting the depth of penetration pattern of ions implanted in multiple implantation stages at varying concentrations under the edges of a masked portion of the polysilicon layer of FIG. 2.
Figure 4:
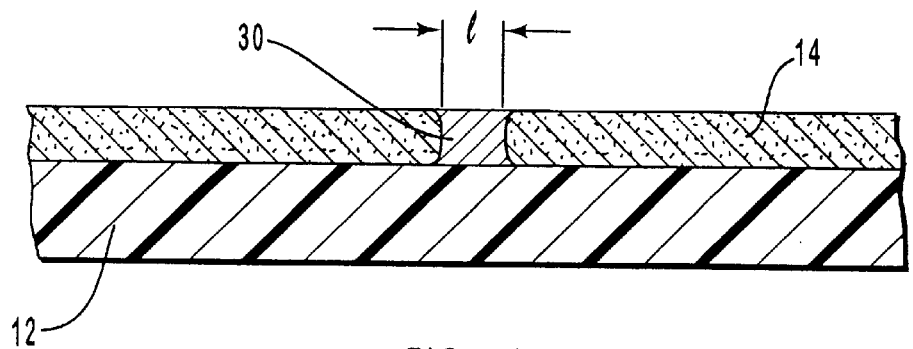
FIG. 4 is a cross-sectional view of the semiconductor wafer of FIG. 3, showing a procedure of the first method of the present invention in which a masking substrate is removed from the polysilicon layer of FIG. 3.

A further manner of controlling the profile of the resultant shaped opening is to conduct the ion implantation operation in multiple implantation stages. FIG. 3 is an illustration of an implantation concentration profile resulting from three hypothetical implantation stages, each conducted with a different angle of implantation. Shown therein is a dashed line 22 representing a uniform depth of penetration of ions under the edges of photoresist mask 16.

A first implantation concentration profile curve 24 represents the results of a first implantation stage. The first implantation stage is conducted with an angle of implantation that is relatively steep, and that is conducted with an implantation dose and range of implantation energy selected to implant ions to a desired penetration. A second implantation concentration profile curve 26 represents the results of a second implantation stage that is conducted with an angle of implantation that is less steep than angle of implantation for profile curve 24. The second implantation stage is conducted with a consistent dose and a consistent or slightly higher range of implantation energy than that of the first implantation stage, and thus a second implantation concentration profile curve 26 is deeper than first implantation concentration profile curve 24. A third implantation concentration profile curve 28 represents the results of a third implantation stage that is conducted with an angle of implantation that is less steep than angle of implantations for either of profile curves 24, 26. The third implantation stage will preferably be conducted with a consistent dose and a consistent or slightly higher range of implantation energy than that of the first and second implantation stages and consequently, third implantation concentration profile curve 28 is deeper within polysilicon layer 14 than first and second implantation concentration profile curve 24, 26.

As can be readily observed from the chart of FIG. 3, multiple implantation stages are useful to achieve a uniform implantation concentration profile that could not be provided by a single implantation stage. By varying the angle of implantation in other manners, relatively unimplanted region 30 of polysilicon layer 14 can also be tailored to have other selected shapes. Of course, implantation parameters other than the angle of implantation can also be varied for each of the multiple implantation stages. For instance, varying the implantation energy or a range of the implantation energy will result in implanted portions having profiles that extend to different depths. Different masking substrates can be used for different implantation stages, and the patterns of the masking substrates can be varied for the different implantation stages to form implanted regions with different profiles.

After the ion implantation operation is conducted, photoresist mask 16 is removed from polysilicon layer 14. Exposed unimplanted region 30 has a desired shape through the selection of the ion implantation parameters in the manner discussed above. After removing photoresist mask 16, an optional heat treatment operation can be conducted. Heat treatment diffuses ions 20 to further smooth the implantation concentration profile of ions 20, and may also increase the depth of penetration of ions 20 under the edges of photoresist mask 16, thereby further reducing the dimensions of the shaped opening. If a sharper profile of the resulting shaped opening is desired, ions 20 are not diffused prior to conducting an etching process which is selective to silicon-containing material.

Once the ion implantation operation has been conducted and photoresist mask 16 has been removed, an etching process which is selective to implanted silicon-containing material is conducted. The etching process etches portions of the volume of silicon-containing material having less than an implanted ion threshold concentration at a faster rate than the etching process etches portions of the volume of silicon-containing material having an implanted ions threshold concentration and above. Silicon-containing material implanted with ions beyond the threshold concentration is not substantially removed by the etching process which is selective to implanted silicon-containing material, and silicon-material implanted to less than the threshold concentration is substantially removed.

As a result, relatively unimplanted region 30 that is not implanted with ions 20 up to the threshold concentration is etched at a faster rate than the remainder of polysilicon layer 14 that is implanted with ions 20 up to or above the threshold concentration. Of course, if a layer of material other than polysilicon layer 14 is being used, an etching process is correspondingly used which etches portions of the specific type of material being used that are not implanted with ions up to a threshold concentration at a faster rate than the etching process etches portions of the specific type of material that are implanted with ions up to the threshold concentration.

By way of example, the inventive method provides or creates low and high stress portions of a volume of a material, followed by removal of the high stress portion(s). In etching processes that are selective to the low stress portions of the volume of the material and that etch the high stress portions of the volume of the material, preferred etchants include an etchant having a pH greater than 7 and more preferably not less than 9, an organic base, an inorganic base, an etchant that contains ammonia, a basic etchant that does not contain Group I or Group II metals, tetraethylammonium hydroxide, tetrabutylphosphonium hydroxide, tetraphenylarsonium hydroxide, KOH, NaOH, and tetramethyl ammonium hydroxide (TMAH). Preferably, the volume of the material is composed of a silicon-containing material and/or a germanium-containing material. Although the examples discussed below describe the use of TMAH as an etchant for a silicon-containing material, the foregoing etchants are also contemplated to etch silicon and/or germanium containing materials in processes to fabricate the various structures described below.

One example of an etching process which is selective to low stress or implanted silicon-containing material comprises a tetramethyl ammonium hydroxide (TMAH) wet etch. The TMAH wet etch is preferably administered as an etchant solution into which semiconductor wafer 10 is immersed.

Preferred concentrations of the TMAH wet etch etchant solution comprise from about 0.1 weight percent TMAH in a deionized water solution and higher. More preferably, a concentration from about 1 to about 10 weight percent TMAH in a solution, and most preferably about 2.5 weight percent TMAH in a solution can be used as the TMAH wet etch etchant solution. The TMAH wet etch is preferably conducted at a temperature in a range from about 5 C. to about 50° C., and more preferably, in a range from about 20 C. to about 30° C. Most preferably, the TMAH wet etch is conducted at about 30° C.

The implanted portion of the volume of silicon-containing material is preferably implanted with a threshold concentration of ions in a range from about $1 \times 10^{15}$ ions per $cm^3$ of silicon-containing material to about $1 \times 10^{22}$ ions per $cm^3$ of silicon-containing material. More preferably, the threshold concentration is in a range from about $5 \times 10^{18}$ ions per $cm^3$ of silicon-containing material to about $5 \times 10^{19}$ ions per $cm^3$ of silicon-containing material. Most preferably the threshold concentration is about $1 \times 10^{19}$ ions per $cm^3$ of silicon-containing material. Relatively unimplanted portion 30 is preferably substantially unimplanted with ions 20.

Figure 5:
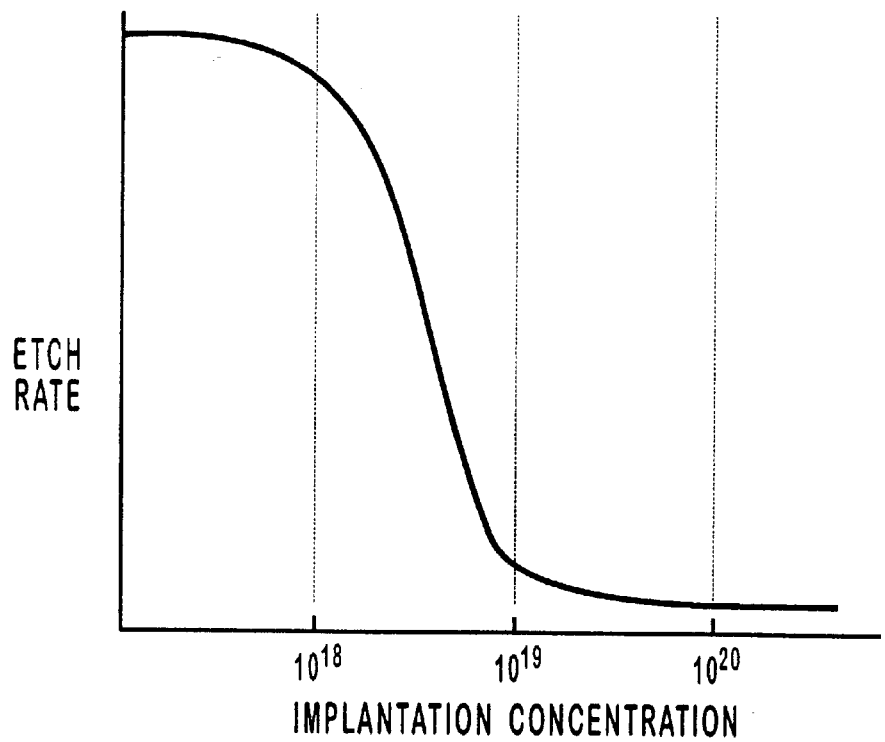
FIG. 5 is a graph illustrating the relationship of an etch rate of the etching process which is selective to implanted silicon-containing material of the present invention as a function of implanted ion concentration, in arbitrary units.

The relationship of etch rate to implanted ion concentration for the TMAH wet etch is illustrated in FIG. 5, wherein representative etch rates of implanted polysilicon are given in angstroms per minute relative to ion implantation concentration, which is given in ions per $cm^3$. FIG. 5 illustrates that, at or around a concentration of $1 \times 10^{19}$ ions per $cm^3$ of silicon-containing material, the etch rate using the wet etch of the present invention begins to fall and continues to fall until an inflection point is reached at or around $1 \times 10^{19}$ ions per $cm^3$ of silicon-containing material.

A high implanted ion concentration will have a higher etch material removal rate than a low implanted ion concentration. In that ion implantation reduces the stress in a material, it is believed that the material removal rate of the etch is related to stress in the material. Heating the material, such as by annealing, will reduce the stress in the material and will diffuse atomic particles, such as implanted ions, in the material. As such, it is preferable to maintain the material within a predetermined temperature range after stress reduction and before the selective material removal to avoid a change in stress of the material.

With typical implantation and etching parameters, the threshold concentration is between about $5 \times 10^{18}$ and about $5 \times 10^{19}$ ions per $cm^3$ of silicon-containing material. Of course, the implanted portion can be implanted with ions in excess of $5 \times 10^{19}$ ions per $cm^3$ of silicon-containing material, but the excess ions have not been found to substantially increase the selectivity to implanted portions of the silicon-containing material.

When conducting the TMAH wet etch, traditional dopant ions that are known to change the electrical properties of polysilicon layer 14 can be utilized in the ion implantation operation. A preferred dopant ion for which satisfactory results have been observed is phosphorous. Arsenic and boron are also predicted to be satisfactory dopant ions. Other ions including the Group IIIA and VA elements can be selected, according to a desired doping scheme. Silicon ions are also satisfactorily.

Inert ions that do not alter the electrical properties of polysilicon layer 14 can be implanted. Implantation of inert ions is useful, for instance, where the silicon-containing material or another material adjacent the silicon-containing material is doped in a specific manner in order to exhibit certain electrical properties, and it is desired that those electrical properties not be altered. One such example is the construction of a CMOS integrated circuit. Implanting polysilicon layer 14 with P-type or N-type dopants can cause diffusion during subsequent procedures involving heat treatment of the dopants into adjacent N-type or P-type active regions. The diffusion of dopant ions of an opposite type into these doped regions can alter the function of the N-type or P-type active regions. Ions being implanted could also overshoot the intended implanted regions into underlying N-type or P-type active regions. Thus, implanting phosphorous, for example, could alter the electrical characteristics of the P-type regions, while implanting argon would maintain the specific electrical properties of both the P-type and the N-type regions. In such situations, inert ions can be implanted such that later diffusion of the inert ions will be electrically neutral.

In a further aspect of the present invention, ions can be implanted in multiple implantation stages using a combination of dopant ions and inert ions. Thus, an initial ion implantation operation could be conducted with a relatively low implantation energy range or a relatively shallow angle of implantation to implant to a shallow depth using dopant ions, such as phosphorous. A subsequent, deeper ion implantation operation could be conducted with inert ions such as argon. Accordingly, when implanting ions into a region of polysilicon layer 14 located over an underlying material for which it is not desired to alter the electrical properties, such as an active region, any ions overshooting into the underlying material will not alter the electrical properties of the material. Also, as only the inert ions are in close contact with the underlying material, dopant ions are not diffused into the underlying material.

Since it is not necessary to dope polysilicon layer 14 in any specific manner in order to successfully conduct the etching process which is selective to implanted silicon-containing material, different types of ions can be implanted either together or at different times to achieve the desired implantation dopant concentration profile. Additionally, different portions of polysilicon layer 14, or any other silicon-containing material being patterned, could be implanted to a proper threshold concentration at different implantation stages with different types of ions, and the etching process that is selective to implanted silicon-containing material would still be selective to each of the different portions of polysilicon layer 14.

In addition to not requiring a specific dopant, the etching process of the present invention which is selective to implanted silicon-containing material is not reliant upon an activation or diffusion of the implanted ions with a heat treatment operation. Thus, conducting a heat treatment operation is optional. As mentioned above, the heat treatment operation, usually conducted as an anneal, typically diffuses ions 20 laterally, which rearranges the implantation concentration profile and may thus be undesirable. Rearrangement of the implantation concentration profile reduces control over the dimensions of the resulting shaped opening. Conducting the etching process which is selective to implanted silicon-containing material without annealing results in a sharper ion concentration profile, which is often more desirable than the diffusion of ions that results from a heat treatment operation.

In an additional aspect of the present invention, in situ doped silicon-containing material is removed at a lower material removal rate than that of undoped silicon-containing material when using the TMAH wet etch. In situ doped silicon-containing material is not, however, removed at as low a material removal rate as implanted silicon-containing material. Rather, the material removal rate is about three times less than that of undoped silicon-containing material. Consequently, polysilicon layer 14 can be in situ doped with any type of ions prior to ion implantation, and the method as described above of ion implantation and selective etching can still be conducted successfully. If polysilicon layer 14 is in situ doped prior to ion implantation, it is preferred that the in situ doping form a concentration of less than about $1 \times 10^{19}$ ions per $cm^3$ of polysilicon.

Of course, other satisfactory etchants that remove unimplanted silicon-containing material at a faster rate than implanted silicon-containing material can be used as an etching process which is selective to implanted silicon-containing material. For instance, basic solutions can be employed, one example of which is potassium hydroxide (KOH).

Figure 6:
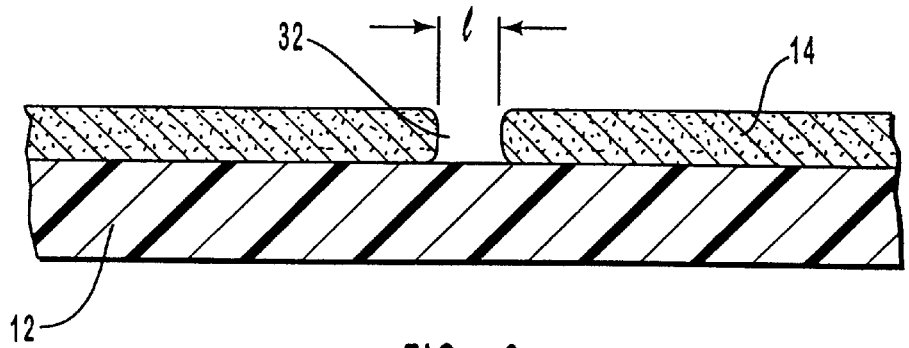
FIG. 6 is a cross-sectional view of the semiconductor wafer of FIG. 4, showing a further procedure of the first method of the present invention in which relatively unimplanted portions of the polysilicon layer are etched away to form a shaped opening therein.

The result of conducting the etching process which is selective to implanted silicon-containing material is shown in FIG. 6, wherein can be seen a resulting shaped opening, in the form of a hole 32. Penetration of ions under the edges of photoresist mask 16, seen in FIG. 2, caused hole 32 to have dimensions that are reduced from the dimensions photoresist mask 16 with which it was patterned. Through appropriate selection of the ion implantation parameters, hole 32 can be formed with dimensions smaller than that achievable by conventional photolithography. For instance, for a width of photoresist mask 16 within commercial photolithography resolutions, such as 0.35 microns, hole 32 is, in one embodiment, formed with a width of about 0.2 microns or less.

Figure 7:
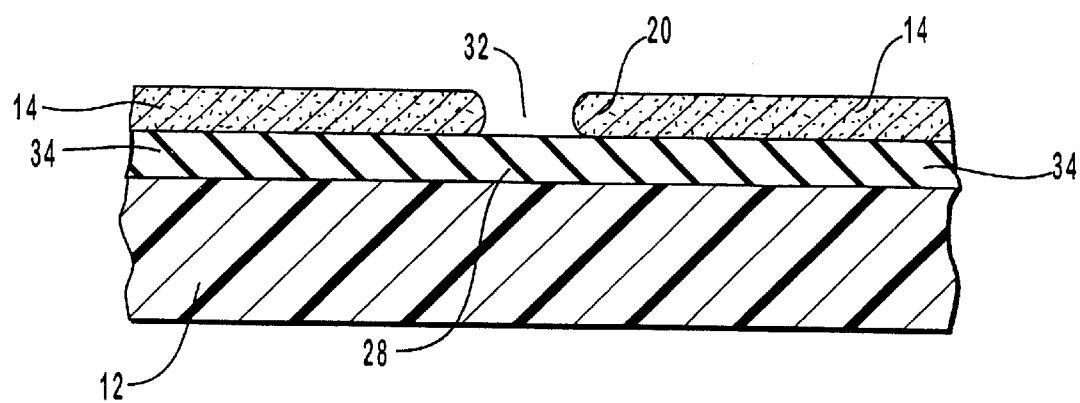
FIG. 7 is a cross-sectional view of the semiconductor wafer of FIGS. 1 through 5, showing a procedure used in an alternative embodiment of the method of FIGS. 1 through 6 in which the polysilicon layer with the shaped opening of FIG. 6 is used to form a shaped opening of similar dimensions in an underlying layer.
Figure 8:
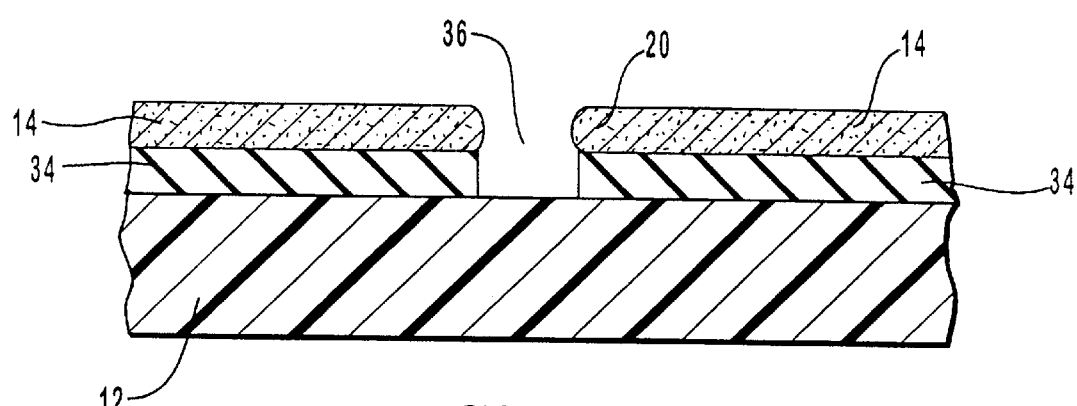
FIG. 8 is a cross-sectional view of the semiconductor wafer of FIG. 7, showing a further procedure of the embodiment of FIG. 7 in which the underlying layer of FIG. 7 is etched using the shaped opening of FIG. 7 as a hard mask.
Figure 9:
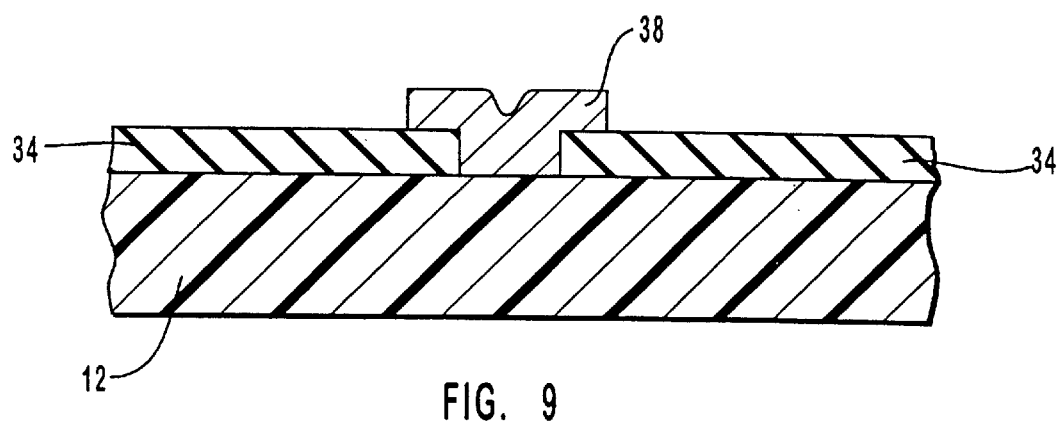
FIG. 9 is a cross-sectional view of the semiconductor wafer of FIG. 8, showing chalcogenide material of a programmable resistor formed in the shaped opening of FIG. 8.

An alternate embodiment of the first method of the present invention is illustrated in FIGS. 7 through 9. Under this alternate embodiment, polysilicon layer 14, patterned with hole 32 as shown in FIG. 6, is used as a hard mask for etching an underlying layer. In so doing, the underlying layer, which in the depicted embodiment is a silicon nitride layer 34, is formed prior to forming polysilicon layer 14. Thereafter, ion implantation and etching take place, substantially as described above, to result in the structure of FIG. 7, wherein hole 32 is shown formed over silicon nitride layer 34.

Once hole 32 is formed over silicon nitride layer 34, silicon nitride layer 34 is etched with a second etching process, using polysilicon layer 14 as a hard mask. The second etching process is selected to utilize an etchant that removes silicon nitride layer 34 faster than it removes polysilicon layer 14. Preferably, the second etching process removes the underlying layer anisotropically. One example of an etchant that etches nitride selective to polysilicon, given by way of example, is hydrofluoric acid. A dry etching process that etches silicon nitride anisotropically and selective to polysilicon uses $CHF_3$ in a reactive ion etcher.

The results of the second etching process are shown in FIG. 8. A hole 36 is formed in silicon nitride layer 34 having substantially the same dimensions as hole 32 in polysilicon layer 14. Thus, layers other than polysilicon layer 14, or the specific layer of silicon-containing material employed, can also be patterned such that the geometry of the shaped opening can be tailored in smaller dimensions than conventional photolithography is capable of. Once the structure of FIG. 8 is formed, polysilicon layer 14 is typically removed with an etching process that etches polysilicon selective to silicon nitride.

One application of the use of the embodiment of FIGS. 7 through 9 of forming shaped openings to form a hard mask is shown in FIG. 9, wherein polysilicon layer 14 has been removed, and the further procedures of depositing and patterning a material in hole 36 has been conducted. The material deposited in hole 36 in this embodiment comprises ovonic chalcogenide material, and forms a plug 38 suitable for use in a programmable resistor. This embodiment thus meets the need for forming chalcogenide programmable resistors in a hole having sub-photolithography resolution dimensions.

In a further application, hole 36 could be filled with a conductive material to form an interconnect line. In so doing, hole 36 would preferably have the form of a trench of a desired length extending in a direction into the page of FIG. 9. The trench need not be straight, but could be non-linear. Integral sections of different widths could also connect to the trench and to larger structures. Thus, with the use of a photoresist mask having a width within conventional photolithography resolution limits, such as about 0.35 microns, a much narrower interconnect line can be formed. The interconnect line is, in one embodiment, formed with a width of about 0.2 microns or less.

A raised shaped structure can also be formed under the first method by forming a shaped opening that surrounds a protruding intact region of polysilicon layer 14. The raised shaped structure has a profile that is tailored by tailoring the shape of the shaped opening that is used to form the raised shaped structure. Representative applications of the first method in which various types of raised shaped structures are formed will be discussed below.

As described herein, the first method can be used to control the dimensions and profile of a shaped opening with great flexibility, control, and precision. As a result, the shaped opening can be formed with smaller dimensions than those of which conventional photolithography is capable. Applications which require such dimensions, such as the formation of ovonic cells of programmable resistors and the formation of fine interconnect lines, become practical under the present invention. The first method is further useful in that the procedure used to form the shaped opening is simpler than conventional alternatives to photolithography. Such simplicity is evidenced in that the first method is conducted without the need for multiple material deposition operations and without the need for conducting a dry etching process. Accordingly, a high throughput and a low cost fabrication process is proposed by the first method.

2. Shaped Structures Formed with an Etching Process which is Selective to Unimplanted Silicon-containing Material A second method of the present invention is illustrated in FIGS. 10 through 19. In the second method, a shaped structure is formed on a semiconductor substrate with an etching process which, converse to the selective etching process of the first method, etches portions of a layer of silicon-containing material selectively to unimplanted silicon-containing material.

A shaped structure can be formed under the second method having dimensions smaller than those within the capabilities of conventional photolithography processes. The shaped structure can comprise, for instance, a semiconductor device feature such as a gate region, a plug or a contact.

Figure 10:
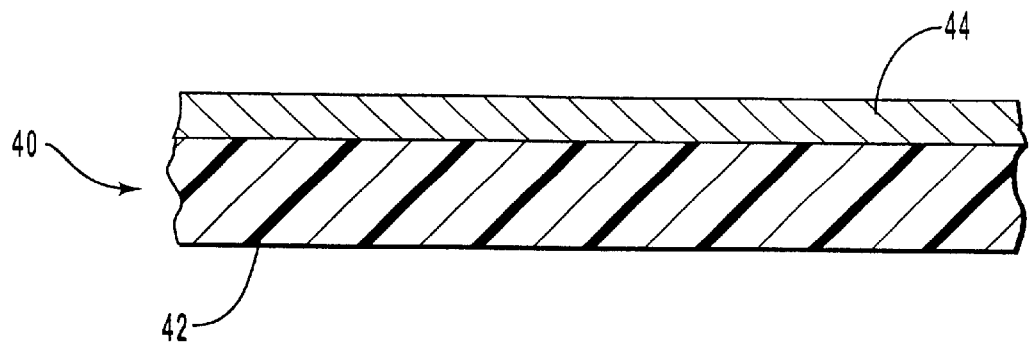
FIG. 10 is a cross-sectional view of a semiconductor wafer showing a procedure in a second method of the present invention in which a polysilicon layer is formed over a semiconductor substrate.

In one manner of conducting the second method, the shaped structure is formed from polysilicon, and the semiconductor substrate comprises a semiconductor wafer. Accordingly, the layer of silicon-containing material comprises a polysilicon layer. Thus, as illustrated in FIG. 10, a semiconductor wafer 40 is provided and a polysilicon layer 44 is formed on a silicon substrate 42 of semiconductor wafer 40. Polysilicon layer 44 is formed of intrinsic polysilicon and is deposited with conventional methods as discussed for the first method above.

Figure 11:
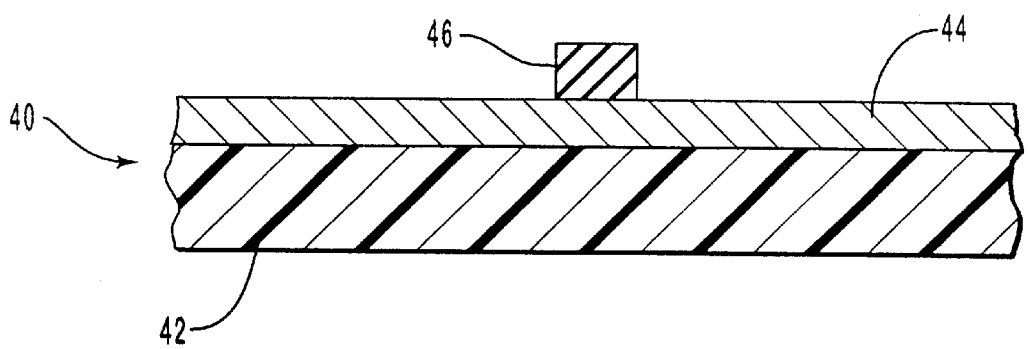
FIG. 11 is a cross-sectional view of the semiconductor wafer of FIG. 10, showing a further procedure in the second method of the present invention in which a masking substrate is formed over the polysilicon layer of FIG. 10.

After formation of polysilicon layer 44, polysilicon layer 44 is masked with a masking substrate such as a photoresist mask 46, as shown in FIG. 11. Photoresist mask 46 could be substituted with a hard mask of a material such as an oxide or nitride of silicon, or of any other material impermeable to ion implantation. One further suitable material for photoresist mask 46 is photosensitive polyamide. Photoresist mask 46 is patterned to cover the region or regions of polysilicon layer 14 that are intended to remain after an etching process which is selective to unimplanted silicon-containing material is conducted. Portions which are not intended to remain are left exposed to ion implantation.

Figure 12:
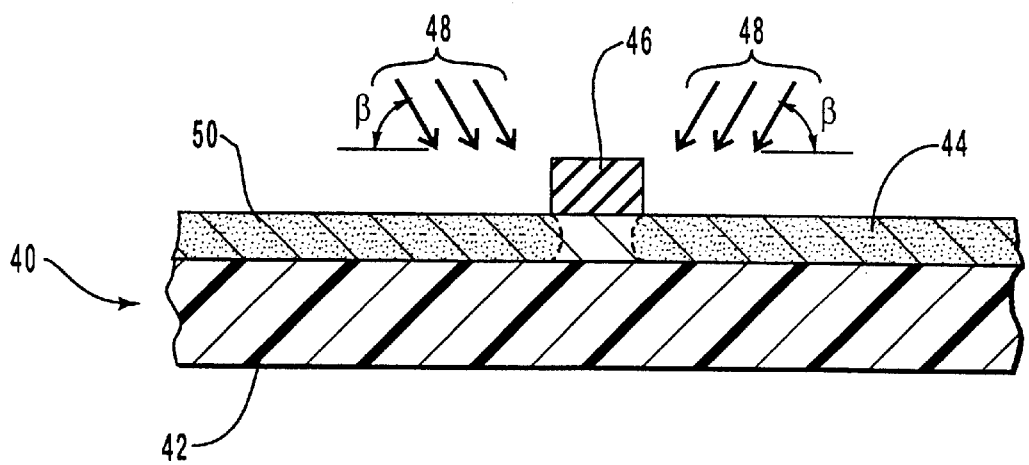
FIG. 12 is a cross-sectional view of the semiconductor wafer of FIG. 11, showing a further procedure in the second method of the present invention in which ions are implanted into the polysilicon layer of FIG. 11.

Once polysilicon layer 44 is masked, an ion implantation operation is conducted. The ion implantation operation can be localized, as illustrated in FIG. 12 by arrows 48, by focusing on the area of polysilicon layer 44 that is close to photoresist mask 46. Alternatively, the ion implantation operation can be conducted over the entirety of polysilicon wafer 40. The ions 50 that are implanted by the ion implantation operation are of a type selected in accordance with the selection of the etching process which is selective to unimplanted silicon-containing material. The etching process which is selective to unimplanted silicon-containing material and the selection of the type of ions to be implanted will be discussed in greater detail below. The ion implantation parameters are preferably selected in the manner, discussed above for the first method, that tailors the resulting shaped feature, though the results will be reversed, as it is the implanted portions of polysilicon layer 44 that are to be removed, rather than portions that are not substantially implanted.

The ion implantation operation is conducted with an angle of implantation from a top surface of polysilicon layer 44, as shown in FIG. 12. The angle of implantation can be an angle orthogonal to the top surface of silicon wafer 40, as discussed for the first method. Alternatively, and as shown in FIG. 12, the angle of implantation can be other than orthogonal to the top surface of silicon wafer 40, in order to result in the implantation of ions beneath photoresist mask 46. The degree to which ions 50 penetrate beneath photoresist mask 46 is selectable by the implantation energy and the angle of implantation.

The ion implantation operation is optionally conducted in multiple stages in order to regulate the depth and concentration of the implanted ions. The result of ion implantation conducted in multiple stages is the same as that which is graphically depicted in FIG. 3 in conjunction with the discussion of the first method above. In constructing a shaped structure, the ion implantation operation can be conducted in several implantation stages and with several different angles in order to implant ions 50 with a uniform concentration throughout a depth of penetration. The ion implantation operation can also be conducted with differing levels or ranges of implantation energy or differing ion doses in each stage in order to tailor the profile of the shaped feature as discussed for the first method.

Figure 13:
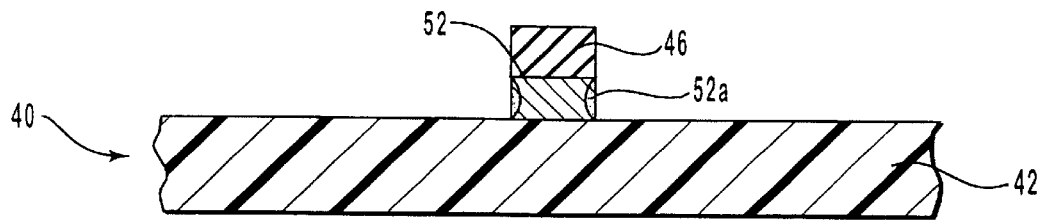
FIG. 13 is a cross-sectional view of the semiconductor wafer of FIG. 12, showing a further procedure in the second method of the present invention in which a first etching process is conducted that etches the polysilicon layer of FIG. 12 anisotropically.

After conducting the ion implantation operation, a substantially anisotropic etching process, hereafter referred to as the initial etching process, is conducted to reduce polysilicon layer 44 to a patterned polysilicon block 52 seen in FIG. 13. Polysilicon block 52 has essentially the same lateral dimensions as photoresist mask 46. The implantation of ions 50 under photoresist mask 46 causes the occurrence of underlapping implanted regions 52a, formed in patterned polysilicon block 52.

The initial etching process can be conducted with any suitable etching chemistry that etches polysilicon selective to photoresist mask 46. It is preferred that the initial etching process be anisotropic in order to maintain the pattern of photoresist mask 46 and thereby better control the geometry of the resulting shaped feature. In one embodiment, the initial etching process comprises a dry etching process such as RIE or MRIE.

After conducting the initial etching process, the etching process which is selective to unimplanted silicon-containing material is conducted. The etching process which is selective to unimplanted silicon-containing material can be conducted after photoresist mask 46 is removed, or the etching process which is selective to unimplanted silicon-containing material can be conducted with photoresist mask 46 still in place. The option of removing photoresist mask 46 adds flexibility to the method of the present invention. Photoresist mask 46 is removed prior to etching typically in situations where the height of the shaped structure is not critical, because etching without photoresist mask 46 in place will reduce the height of the resulting shaped structure somewhat.

The type of ions 50 that are implanted is selected in accordance with the etching process which is selective to unimplanted silicon-containing material in order to cause implanted portions of polysilicon layer 44 to etch faster than relatively unimplanted portions of polysilicon layer 44. When conducting the selective etching process which is selective to unimplanted silicon-containing material before stripping photoresist mask 46, it is preferable to wet etch. More preferably, an acid-based etching process is used, such as a wet etch for polysilicon that incorporates water, acetic acid, hydrofluoric acid, and nitric acid.

When conducting the etching process which is selective to unimplanted silicon-containing material after photoresist mask 46 is removed, either the wet etching process described above is conducted, or a conventional isotropic dry etching process is conducted. In either etching process, implanted silicon-containing material has a higher material removal rate than that of unimplanted silicon-containing material.

In a further embodiment, the etching process which is selective to unimplanted silicon-containing material is a KOH etching process, where the silicon-containing material is counter doped. When using the KOH counter-doped etch, polysilicon layer 44 as seen in FIG. 12, is initially intrinsically doped with P-type dopants such as boron, and the ion implantation process uses N-type dopants such as phosphorous or arsenic to counter-dope polysilicon layer 44. The ions are implanted in areas of the silicon-containing material that are to be removed. A threshold concentration of ions is achieved, which concentration is determined by the particular type of etching process which is selective to unimplanted silicon-containing material. The particular ion implantation and etching parameters are dependent upon the concentration of implanted ions that is achieved.

Figure 14:
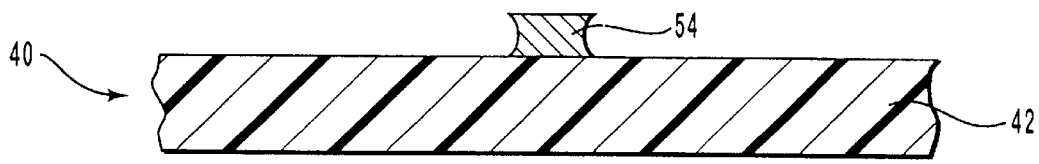
FIG. 14 is a cross-sectional view of the semiconductor wafer of FIG. 13, showing a further procedure in the second method of the present invention in which a second etching process is conducted that etches the polysilicon layer anisotropically and selectively to unimplanted silicon-containing material to result in a shaped structure.

A shaped polysilicon structure 54 results from the etching process, as shown in FIG. 14. The size of shaped polysilicon structure 54, and particularly the degree to which the dimensions of shaped polysilicon structure 54 vary from the dimensions of photoresist mask 46, can be controlled by selection of the ion implantation parameters as discussed above, particularly by selecting the implantation energy and angle of implantation. Due to this capability, better control of the dimensions of patterned polysilicon structure 54 is obtained.

Patterned polysilicon structure 54 may be formed in any raised shape, and might comprise in cross-section, for example, a square gate region, an elongated interconnect line, or a vertically extending interconnect structure. By using a photoresist mask having a width within commercial photolithography resolution limits, a raised shaped structure such as an interconnect line or a gate region can be formed that has a smaller width than the photoresist mask. In one embodiment, photoresist mask 46 is an island with a width of about 0.35 microns, and the shaped polysilicon structure 54 has a width of about 0.2 microns or less.

Figure 15:
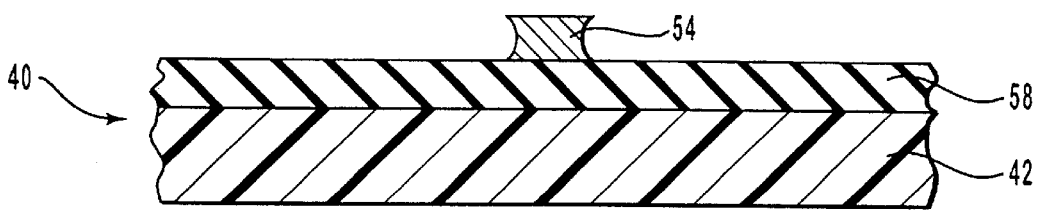
FIG. 15 is a cross-sectional view of the semiconductor wafer of FIG. 14, showing a procedure in an embodiment of the second method of the present invention in which an underlying layer is provided and the shaped structure of FIG. 14 is formed thereon.
Figure 16:
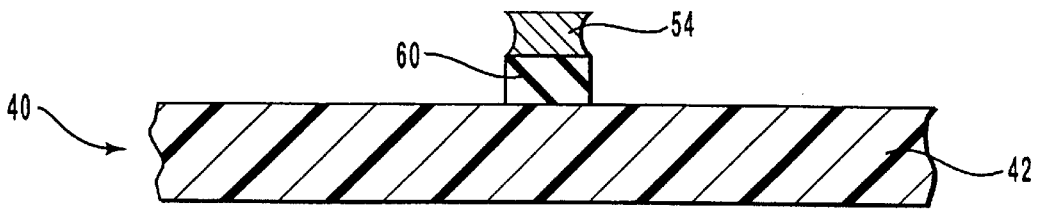
FIG. 16 is a cross-sectional view of the semiconductor wafer of FIG. 15, showing a further procedure in the second method in which the shaped structure of FIG. 15 is used as a hard mask for etching the underlying layer of FIG. 15.

A further embodiment of the second method is illustrated in FIGS. 15 and 16. In this embodiment, once patterned polysilicon structure 54 is formed as described above, polysilicon structure 54 is employed as a sacrificial hard mask for forming a shaped structure from a material other than polysilicon. When so doing, prior to providing polysilicon layer 44, an underlying layer of the material to be formed into a shaped structure is formed. In the depicted embodiment, the underlying layer comprises a silicon dioxide layer 58 as shown in FIG. 15. Once silicon dioxide layer 58 is formed, the second method is conducted substantially as described above to form patterned polysilicon structure 54 seen in FIG. 15. After the formation of polysilicon structure 54, silicon dioxide layer 58 is etched using polysilicon structure 54 as a hard mask as shown in FIG. 16. In so doing, an etching process is employed that etches silicon dioxide layer 58 at a faster rate than it etches polysilicon. A patterned structure 60 is then formed out of silicon dioxide and has substantially the same dimensions as polysilicon structure 54. As polysilicon structure 54 is produced with sub-photolithographic dimensions, so also can patterned structure 60 of FIG. 16 be produced with sub-photolithographic dimensions.

Figure 17:
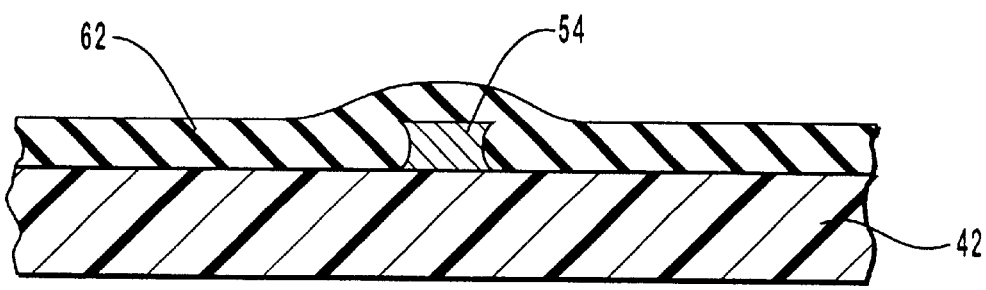
FIG. 17 is a cross-sectional view of the semiconductor wafer of FIG. 14, showing a procedure in a further embodiment of the second method in which an oxide layer is provided over the shaped structure of FIG. 14.
Figure 18:
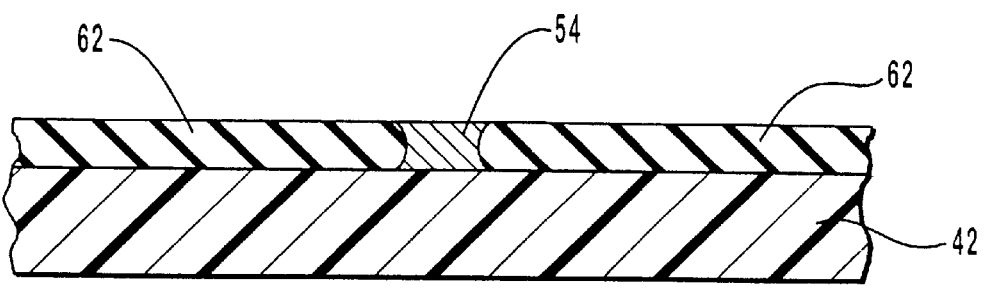
FIG. 18 is a cross-sectional view of the semiconductor wafer of FIG. 17, showing a further procedure in the second method in which the oxide layer of FIG. 17 is planarized, leaving the shaped feature encased within the oxide layer.
Figure 19:
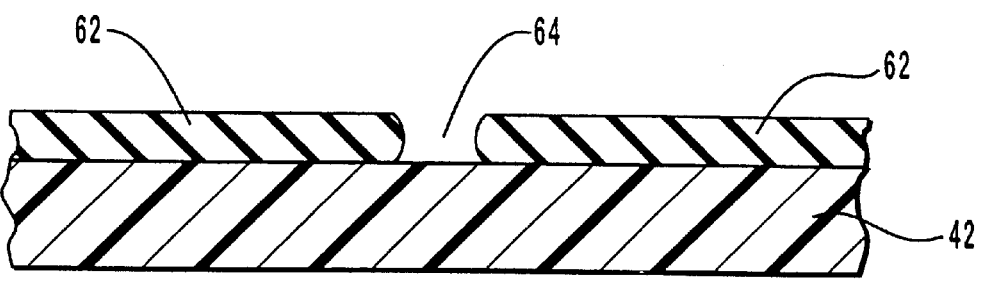
FIG. 19 is a cross-sectional view of the semiconductor wafer of FIG. 18, showing a further procedure in the embodiment of FIG. 18 in which the shaped feature of FIG. 18 is etched away, leaving a patterned opening in the oxide layer.

Shaped polysilicon structure 54 may also be used as a sacrificial spacer for forming holes, trenches, or other shaped openings as shown in the further embodiment of FIGS. 17 through 19. In FIG. 17, a shaped polysilicon structure 54 is formed in the manner described for FIGS. 9 through 14. Shaped polysilicon structure 54 is created with the dimensions of the desired shaped opening and is subsequently covered with a blanket layer of material, such as a silicon dioxide layer 62 in which the shaped opening is to be formed. As shown in FIG. 18, silicon dioxide layer 62 is then planarized. In one embodiment, planarization is achieved with CMP. The structure of FIG. 18 can be used, for example, as an interconnect structure.

In a further alternative embodiment also shown in FIG. 19, shaped polysilicon structure 54 is removed to form a shaped opening. In forming the shaped opening, shaped polysilicon structure 54 is removed with an etching process that etches polysilicon selective to silicon dioxide layer 62. The resulting shaped opening, illustrated in the form of a hole 64, is suitable for making contact between underlying silicon substrate 42 and the surface of silicon dioxide layer 62. Hole 64 could also be filled with chalcogenide material, as in the embodiment of FIG. 9 in the first method, to form an ovonic cell of a programmable resistor.

Thus, the second method of the present invention is used to pattern a layer of polysilicon or other material to form a shaped structure that has smaller dimensions than can be formed with conventional photolithography. The method is flexible and controllable, allowing precise tailoring of the resulting shaped structure, and is simpler to conduct and more efficient than alternative processes to photolithography such as the disposable spacer flow process discussed above. As a result of the increased stability and efficiency, the integrated circuit manufacturing process can be conducted with increased throughput and reduced cost.

3. Formation of a Polysilicon Plug with the Etching Process which is Selective to Implanted Silicon-containing Material A third method of the present invention is illustrated in FIGS. 20 through 23. The third method uses the etching process which is selective to implanted silicon-containing material, described above for the first method, to form an interconnect structure. In the depicted embodiment, the interconnect structure comprises a polysilicon plug.

Figure 20:
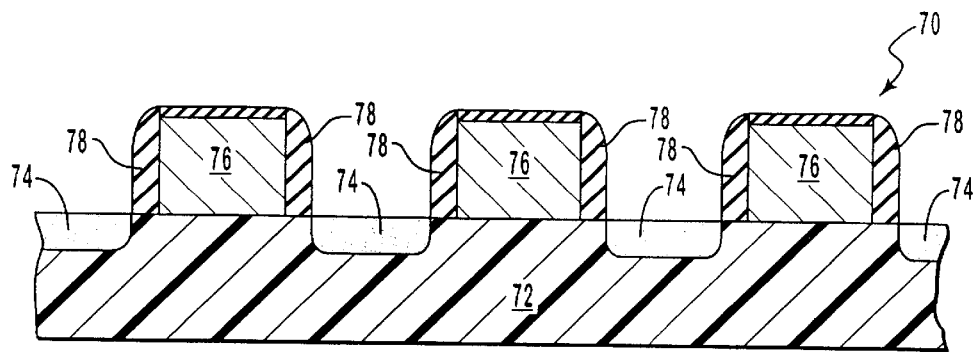
FIG. 20 is a cross-sectional view of a semiconductor wafer showing a procedure in a third method of the present invention in which a plurality of active regions are provided between a plurality of gate regions.

FIG. 20 shows, for the third method, an embodiment wherein an active region is placed in electrical communication with an overlying structure through the use of the interconnect structure. A semiconductor substrate as shown in the form of a semiconductor wafer 70 from which an integrated circuit is to be formed. Provided on semiconductor wafer 70 is a silicon substrate 72. Provided on silicon substrate 72 are a plurality of active regions 74 which in the depicted embodiment comprise source/drain regions of MOS transistors. Formed on silicon substrate 72 adjacent active regions 74 are a plurality of gate regions 76. Gate regions 76 are each provided with an electrically conductive gate layer on a gate oxide layer and have the sides and top thereof covered with an insulating spacer 78.

The third method can be used to electrically connect a charge conducting region other than an active region to an overlying structure. For instance, in one embodiment, the interconnect structure comprises a via and the charge conducting region comprises on underlying contact.

Figure 21:
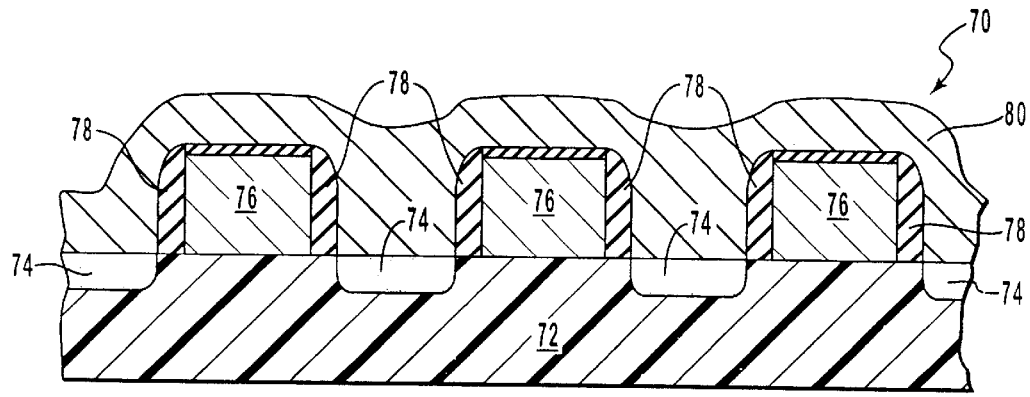
FIG. 21 is a cross-sectional view of the semiconductor wafer of FIG. 20, showing a further procedure in the third method of the present invention in which a polysilicon layer is formed over the active regions of FIG. 20.

FIG. 21 shows a layer of silicon-containing material, in the depicted embodiment a polysilicon layer 80, formed over gate regions 76 and active regions 74. Polysilicon layer 80 is deposited in any known and suitable manner, and preferably comprises intrinsic polysilicon, as defined above.

Figure 22:
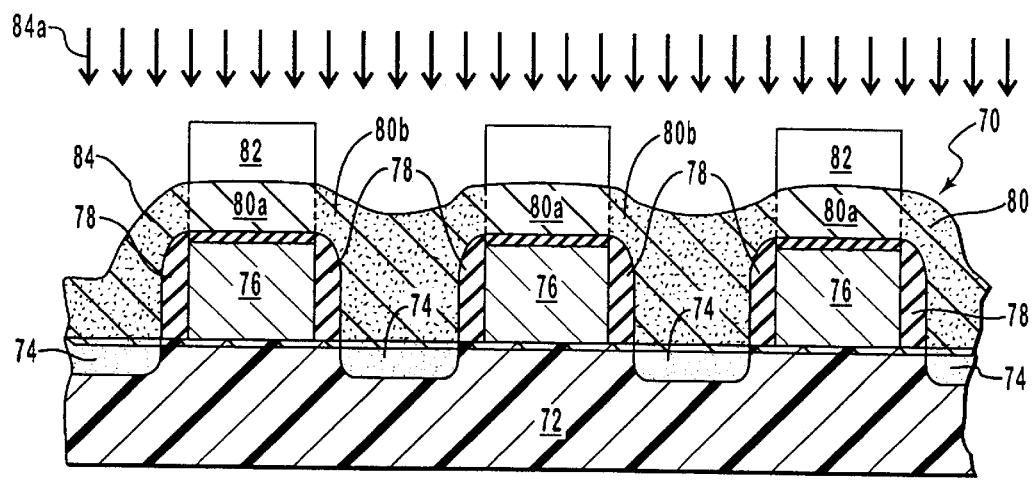
FIG. 22 is a cross-sectional view of the semiconductor wafer of FIG. 21, showing a further procedure in the third method in which a hard mask is formed over the polysilicon layer of FIG. 21, and in which ions are implanted into the exposed portions of the polysilicon layer of FIG. 21.

FIG. 22 shows a masking substrate formed over polysilicon layer 80. The masking substrate is depicted in FIG. 22 in the form of a silicon nitride hard mask 82. Silicon nitride hard mask 82 covers portions of polysilicon layer 80 that are to be removed, leaving exposed the portions of polysilicon layer 80 that are to remain. Consequently, the portion of polysilicon layer 80 located over active regions 74, where the polysilicon interconnect structure is to be formed, is left exposed. Alternatively, the masking substrate can also comprise oxide, photoresist, or other materials that serves as a barrier to implanted ions.

FIG. 22 depicts the implantation of ions 84 into the unmasked portions of polysilicon layer 80. Ion implantation is conducted once silicon nitride hard mask 82 is in place. The implantation of ions 84 is represented in FIG. 22 by downward pointing arrows 84. Ions 84 are of a type chosen, as discussed above, in conjunction with an etching process that is to be conducted at a further stage in the third method. In one embodiment, ions 84 comprise phosphorus ions. The implantation of ions 84 creates a relatively unimplanted portion 80*a* and a heavily implanted portion 80*b* in polysilicon layer 80. Relatively unimplanted portion 80*a* and heavily implanted portion 80*b* correspond to the portions of polysilicon layer 80 that are to be removed and those that are to remain, respectively.

The shape of heavily implanted portion 80*b* can be tailored by varying the ion implantation parameters as described above in the discussion of the first method. Ion implantation can be conducted in multiple implantation stages with the ion implantation parameters varied for each of the implantation stages, and can be conducted with a combination of dopant ions and inert ions as described for the first method above.

Figure 23:
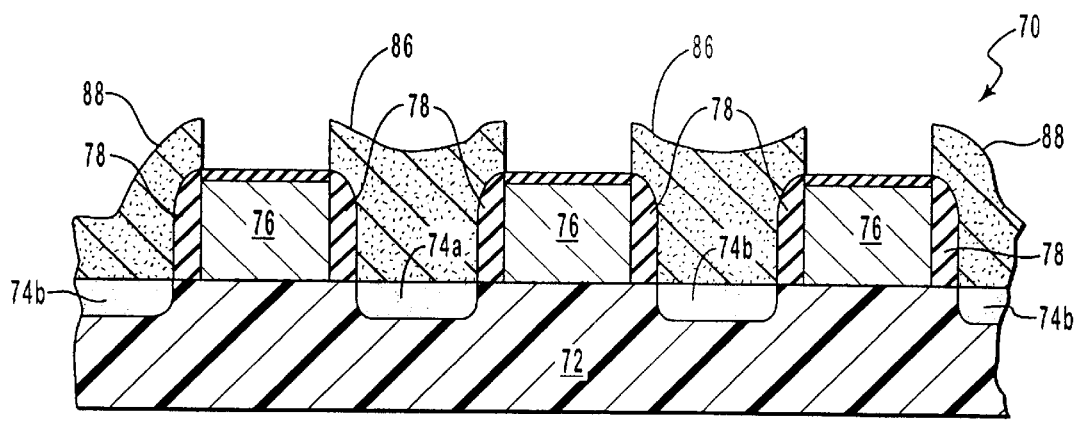
FIG. 23 is a cross-sectional view of the semiconductor wafer of FIG. 22, showing a further procedure in the third method in which an etching process is conducted which is selective to implanted silicon-containing material and which results in the formation of a plurality of polysilicon plugs above the active regions of FIG. 22.

FIG. 23 shows the results of a subsequently conducted etching process which is selective to implanted silicon-containing material. The etching process which is selective to implanted silicon-containing material is conducted under the third method substantially as described for the first method, with etching parameters that can be varied as described therein to further tailor the shape of the interconnect structures being formed. The etching process which is selective to implanted silicon-containing material results in the formation of an interconnect structure, several of which are shown in the depicted embodiment as polysilicon plugs 86 and 88.

The third method forms a polysilicon plug in a simplified manner in which the conventional steps of depositing and reflowing an insulating layer are eliminated. The dry etching process, typically conducted to form interconnect structure openings through the insulating layer, is also eliminated. Also eliminated is the CMP process that is typically conducted after depositing polysilicon into the contact holes. The improvement reduces fabrication throughput and cost. Additionally, the third method adds flexibility to the integrated circuit manufacturing process, as the interconnect structures can be tailored to a specific profile through the appropriate selection of ion implantation and etching process parameters.

Figure 24:
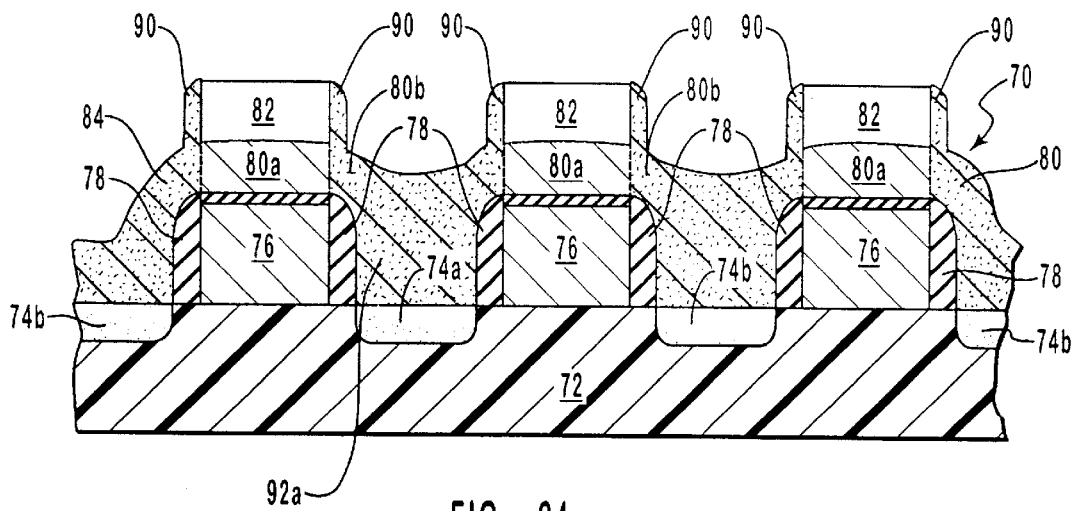
FIG. 24 is a cross-sectional view of a semiconductor wafer showing an initial procedure in a fourth method of the present invention, in which spacers are formed on the interior edges of openings in the hard mask of FIG. 22 above the active regions of FIG. 22, and wherein ions are implanted into the polysilicon layer of FIG. 22.
Figure 25:
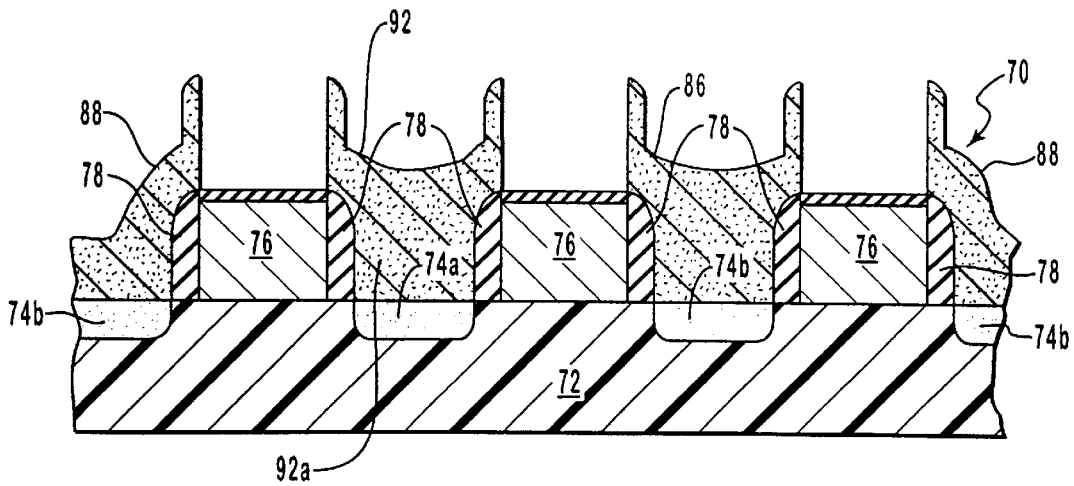
FIG. 25 is a cross-sectional view of a semiconductor wafer showing a further procedure in the fourth method in which an etching process which is selective to implanted silicon-containing material is conducted, and in which the formation of a capacitor storage node and a polysilicon plug results.
Figure 26:
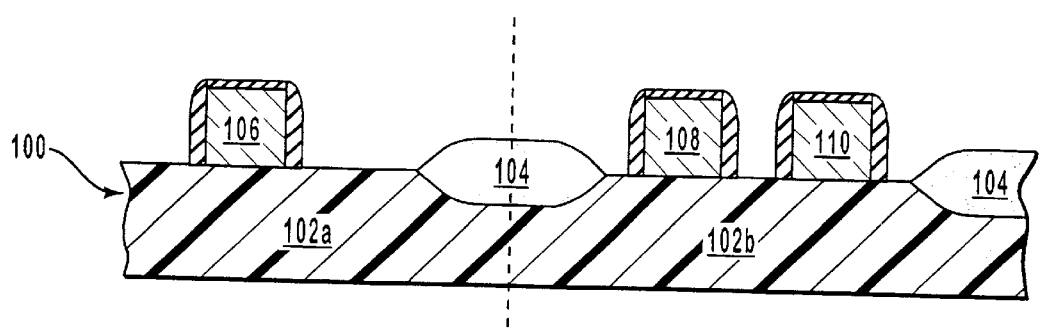
FIG. 26 is a cross-sectional view of a semiconductor wafer showing an initial procedure in a fifth method of the present invention in which a CMOS process flow is conducted to form a plurality of gate regions, and in which an insulating layer is formed over the plurality of gate regions.

4. Formation of a Stacked Container Capacitor Cell with the Etching Process which is Selective to Implanted Silicon-containing Material A fourth method of the present invention is a variation of the third method, and is illustrated in FIGS. 24 and 25. In the fourth method, a stacked capacitor storage node is formed above a charge conducting region. In the depicted embodiment of the fourth method, a polysilicon interconnect structure is also formed concurrently with the stacked capacitor storage node.

The capacitor storage node is preferable formed on a semiconductor substrate. Initially, there is formed a volume of an electrically conductive silicon-containing material located upon a plurality of insulated gate stacks situated upon the semiconductor substrate. Adjacent to and between each pair of insulated gate stacks in the plurality of gate stacks is a charge conducting region that is situated within the semiconductor substrate. The volume of the electrically conductive silicon-containing material also formed upon each of the charge conducting regions. Next, a masking substrate is formed upon the volume of the electrically conductive silicon-containing material such that it is adjacent to and above each of the charge conducting regions, as well as above each the insulated gate stack. A masked portion of the volume of the electrically conductive silicon-containing material is masked by the masking substrate, and an unmasked portion of the volume of the electrically conductive silicon-containing material is unmasked by the masking substrate.

The next step is to form an additional layer of the electrically conductive silicon-containing material over the masking substrate, and then selectively remove, in an anisotropic etch, the silicon-containing material from the additional layer of the electrically conductive silicon-containing material over the masking substrate to form therefrom at least one spacer therefrom that extends from the volume of the electrically conductive silicon-containing material adjacent to and in contact with the masking substrate.

After the at least one spacer is formed, ions are then implanted into the volume of the electrically conductive silicon-containing material and the additional layer of the electrically conductive silicon-containing material so as to form an ion concentration in the unmasked portion, and an ion concentration in the masked portion that is substantially lower than that of the unmasked portion. After the implantation step, the masking substrate is removed.

Silicon-containing material is then selectively removed from the unmasked portion at a material removal rate that is at least two times greater than that of the unmasked portion to form from the first implanted portion a capacitor storage node having the at least one spacer extending therefrom.

Referring now to the FIGS. 20 and 21, the fourth method is conducted essentially as described above for FIGS. 20 and 21. Thus, as shown in FIG. 20, a semiconductor wafer 70 from which the integrated circuit is to be formed is provided and has provided thereon a silicon substrate 72. Also provided on semiconductor wafer 70 are active regions 74*a* and 74*b*, which in the depicted embodiment comprise source/drain regions of MOS transistors. Formed over semiconductor substrate 72 and adjacent active regions 74*a* and 74*b* are gate regions 76. Gate regions 76 are encapsulated within insulating spacers 78. A layer of silicon-containing material depicted as a polysilicon layer 80 is formed over active regions 74*a* and 74*b*. Once again, polysilicon layer 80 is preferably formed of intrinsic polysilicon as defined for the first method. A masking substrate is formed over polysilicon layer 80 and in the depicted embodiment has the form of a silicon nitride hard mask 82. Silicon nitride hard mask 82 is patterned with openings above active region 74*a* and 74*b* as shown in FIG. 24. Optionally, an ion implantation process can then be performed.

The fourth method differs from the third method in that spacers 90 are formed on polysilicon layer 80 overlying active regions 74*a* and 74*b*. To form spacers 90, polysilicon layer 80 is formed higher against silicon nitride hard mask 82 as is shown in FIG. 22. To do so, polysilicon layer 80 is further formed by an additional deposition of polysilicon after silicon nitride hard mask 82 has been formed. Polysilicon layer 80 is then selectively removed, preferably in a spacer etch, to form spacers 90. Spacers 90 are attached to the proximal edges of adjoining islands of silicon nitride hard mask 82, as shown in FIG. 24. Preferably, spacers 90 are formed of a silicon-containing material, such as polysilicon.

After spacer formation, an ion implantation operation is conducted to implant ions into unmasked portions of polysilicon layer 80. The ion implantation operation is conducted essentially in the manner described for FIG. 22 such that relatively unimplanted portions 80*a* and heavily implanted portions 80*b* are formed in polysilicon layer 80.

The shape of heavily implanted portion 80b can be tailored by appropriate selection of the ion implantation parameters as described above for the first and second methods. Ion implantation can be conducted in multiple stages with parameters varied between the stages, and can be conducted with a combination of dopant ions and inert ions as described above for the first method.

After ion implantation is conducted, an etching process which is selective to implanted silicon-containing material is conducted such that relatively unimplanted portions 80a are etched away and implanted portions 80b are left remaining. The etching process which is selective to implanted silicon-containing material is conducted in substantially the same manner as described above in conjunction with FIG. 23. The etching process parameters can be selected in the manner described for the first method to further tailor the shape of the resulting stacked capacitor storage node and polysilicon interconnect structures. FIG. 25 shows the result of the etching process which is selective to implanted silicon-containing material, wherein there is shown a completed stacked capacitor storage node 92 as well as polysilicon plugs 86 and 88. Stacked capacitor storage node 92 is integrally connected with an underlying capacitor base 92a, which connects stacked capacitor storage node 92 to underlying active region 74a. The further procedures of depositing a dielectric layer and an upper capacitor plate are typically conducted to complete the stacked capacitor.

The fourth method forms a stacked capacitor storage node that is integrally formed with a capacitor base, thereby providing a larger storage area for greater charge retention capacity. The stacked capacitor storage node can be formed concurrently with the capacitor base, thereby eliminating a separate polysilicon plug formation process, reducing the number of required material deposition and photoresist masking operations, increasing throughput, reducing cost, and eliminating opportunities for errors to occur. Additionally, greater flexibility is provided by the fourth method, as interconnect structures can be concurrently formed over adjacent active regions with the formation of the stacked capacitor storage node.

5. Formation of Polysilicon Plugs in a CMOS Process Flow with the Etching Process which is Selective to Implanted Silicon-containing Material A fifth method, and a further variation of the third method, is illustrated in FIGS. 26 through 30. In the fifth method, an interconnect structure is formed during a CMOS process flow on an NMOS portion of a semiconductor substrate without destroying the doped active regions of either the NMOS or PMOS portions.

Initially, under the fifth method, conventional CMOS process flow is followed until a CMOS circuit is formed. By way of the example seen in FIG. 26, a semiconductor wafer 100 has formed thereon a silicon substrate 102 that is functionally divided into a PMOS portion 102a and an NMOS portion 102b. Field oxide spacer regions 104 are provided on silicon substrate 102, as are gate regions 106, 108, and 110.

Figure 27:
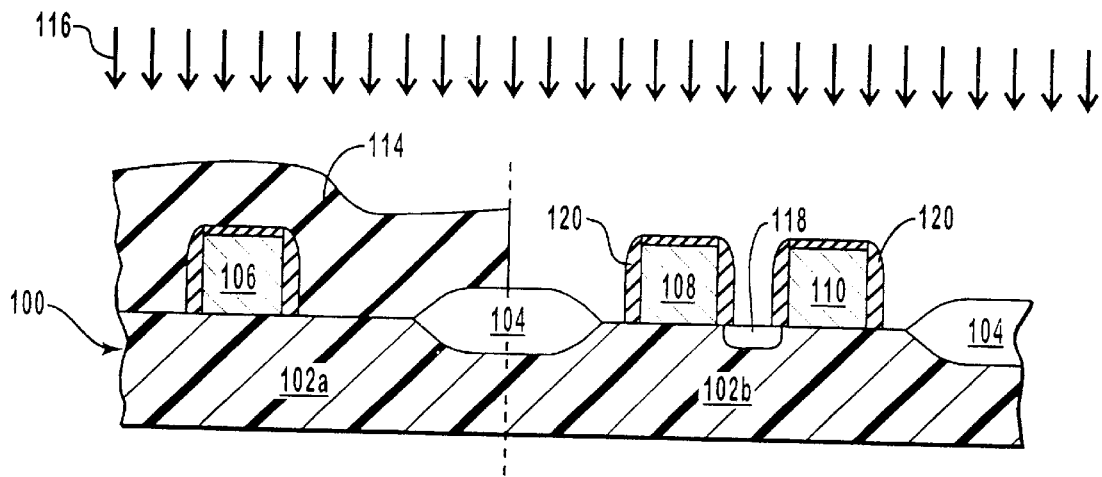
FIG. 27 is a cross-sectional view of the semiconductor wafer of FIG. 26, showing a further procedure in the fifth method of the present invention in which a PMOS portion of the semiconductor wafer is masked and in which ions are implanted into an NMOS portion of the semiconductor wafer.

In FIG. 27, a masking substrate such as a photoresist mask 114 is formed over PMOS portion 102a, leaving NMOS portion 102b exposed. After photoresist mask 114 is formed, implantation of ions into NMOS portion 102b is conducted using an appropriate type of ions to dope and form an NMOS active region 118 which serves as a MOS transistor source/drain region. After forming NMOS active region 118, photoresist mask 114 is removed.

Figure 28:
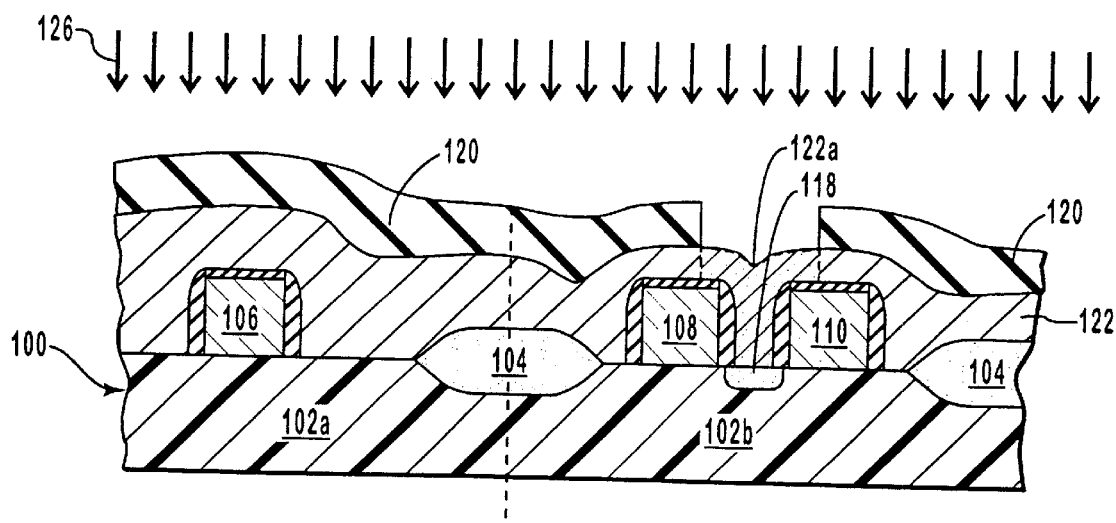
FIG. 28 is a cross-sectional view of the semiconductor wafer of FIG. 27, showing a further procedure in the fifth method of the present invention in which a polysilicon layer is formed over the structure of FIG. 27, a hard mask layer is formed and patterned thereon, and ions are implanted into exposed portions of the polysilicon layer.

FIG. 28 shows a volume of silicon-containing material in which the depicted embodiment is a polysilicon layer 122. Polysilicon layer 122 is deposited over PMOS and NMOS portions 102a, 102b. Once polysilicon layer 122 is deposited, a masking substrate is applied and patterned over the top of polysilicon layer 122. In the depicted embodiment, the masking substrate comprises a silicon nitride hard mask 124. Silicon nitride hard mask 124 is patterned so as to expose a portion of polysilicon layer 122 located above a selected NMOS active region 118 that is to be provided with electrical communication through an interconnect structure.

After the masking of polysilicon layer 122, an ion implantation operation is conducted substantially as described above for the first method. Arrows 126 indicate the ion implantation operation. The result of the ion implantation operation is a heavily implanted portion 122a in polysilicon layer 122 above NMOS active region 118, and a substantially unimplanted portion 122b elsewhere. The shape of heavily implanted portion 122a can be tailored by appropriate selection of the ion_plantation parameters as described above for the first and second methods. Ion implantation can be conducted in multiple implantation stages with the ion implantation parameters varied between the stages, including implantation with a combination of dopant ions and inert ions as described for the first method above.

Figure 29:
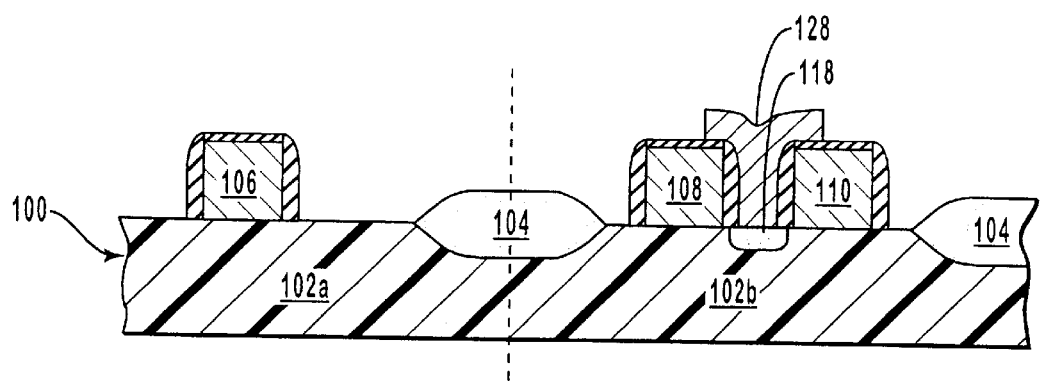
FIG. 29 is a cross-sectional view of the semiconductor wafer of FIG. 28, showing a further procedure in the fifth method of the present invention in which the hard mask layer of FIG. 28 is removed and the polysilicon layer of FIG. 28 is etched with an etching process which is selective to implanted silicon-containing material to form a polysilicon plug.

As shown in FIG. 29, after implanting ions into polysilicon layer 122, silicon nitride hard mask 124 is removed and an etching process which is selective to implanted silicon-containing material is conducted essentially in the same manner as described above for the first method. Consequently, substantially unimplanted portion 122b is etched away and a polysilicon plug 128 is left remaining to form an interconnect structure. The etching process parameters can also be appropriately selected to tailor the resultant shape of the interconnect structure.

Figure 30:
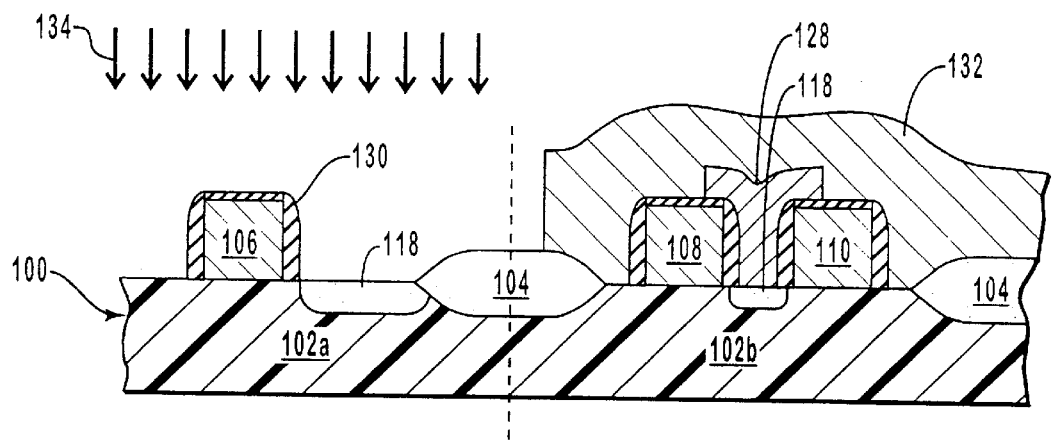
FIG. 30 is a cross-sectional view of the semiconductor wafer of FIG. 29, showing a further procedure in the fifth method of the present invention in which the NMOS portion of the semiconductor wafer is masked and ions are implanted into the PMOS portion of the semiconductor wafer.

Further processing of the fifth method is illustrated in FIG. 30, wherein a PMOS spacer 130 is shown adjacent to PMOS gate region 106. PMOS spacer 130 is desirable in conventional CMOS structures for proper alignment of active regions. Thereafter, NMOS portion 102 is masked with a masking substrate, which in the depicted embodiment is a photoresist mask 132. Appropriate dopant ions, shown as arrows 134, are subsequently implanted into PMOS portion 102a to form PMOS active regions represented in the depicted embodiment by a PMOS active region 136. Photoresist mask 132 is thereafter removed, and a conventional CMOS process flow is then followed to complete the integrated circuit.

A polysilicon interconnect structure is formed under the fifth method in a CMOS process flow with less process steps than conventional methods. Under the fifth method, the number of photoresist masking operations is reduced, thereby increasing throughput, and ultimately reducing the cost of the integrated circuits formed thereby. Also, the source/drain regions of the NMOS and PMOS regions are doped without cross-contamination from the ion implantation or etching processes.

Figure 31:
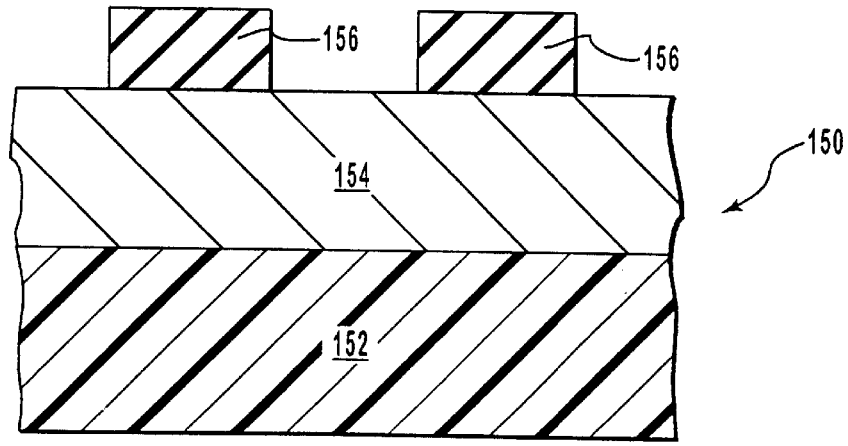
FIG. 31 is a cross-sectional view of a semiconductor wafer showing an initial procedure in a sixth method of the present invention in which a polysilicon layer is patterned with masking substrate islands.

6. Formation of a Free-standing Wall with the Etching Process which is Selective to Implanted Silicon-containing Material A sixth method of the present invention is illustrated in FIGS. 31 through 34. In the sixth method, a free-standing wall is formed with the etching process which is selective to implanted silicon-containing material. FIG. 31 illustrates an initial procedure in the sixth method, wherein a semiconductor substrate is provided. In the depicted embodiment, the semiconductor substrate is a semiconductor wafer 150 having thereon a silicon substrate 152. A polysilicon layer 154, formed of intrinsic polysilicon, is formed over silicon substrate 152. A masking substrate, depicted in FIG. 31 in the form of a photoresist mask 156, is formed over polysilicon layer 154. Photoresist mask 156 is patterned with islands above each location in polysilicon layer 154 wherein a free-standing wall is intended to be formed. In a first embodiment, wherein the free-standing wall comprises a plurality of columns, the islands are formed in a rectangular shape.

Figure 32:
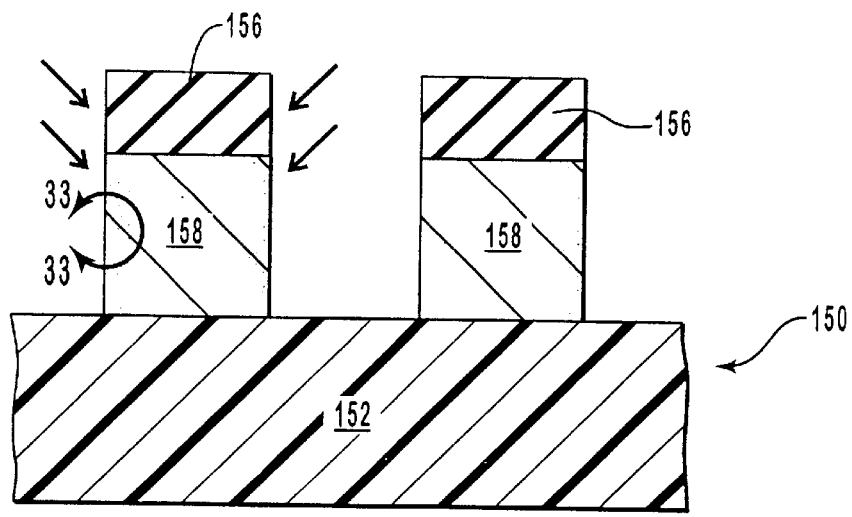
FIG. 32 is a cross-sectional view of the semiconductor wafer of FIG. 31, showing a further procedure in the sixth method in which the polysilicon layer is anisotropically etched to form polysilicon blocks and in which ions are directionally implanted into sidewalls of the polysilicon blocks.

As shown in FIG. 32, an anisotropic dry etching process or suitable equivalent is conducted to remove exposed portions of polysilicon layer 154, thereby forming patterned polysilicon blocks 158. Preferably, the aspect ratio between patterned polysilicon blocks 158 is greater than about one. The anisotropic dry etching process is followed by an ion implantation operation which is conducted in the manner described above with respect to the first method. The ion implantation operation is illustrated by the angled arrows seen in FIG. 32. The ions are implanted at an angle other than orthogonal to silicon substrate 152 so that the ions are implanted into one or more side surfaces of patterned polysilicon blocks 158. Opposing angles of implantation are used in FIG. 32 to implant opposing side surfaces of patterned polysilicon blocks 158. It is preferable to avoid heat treatment of silicon wafer 150 in order to maintain a sharp concentration profile of the implanted ions.

Figure 33:
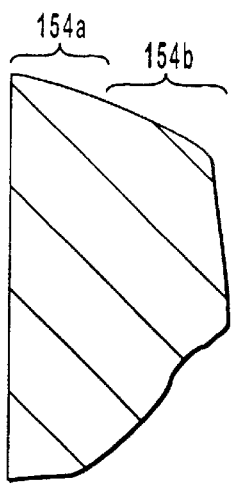
FIG. 33 is a cross-sectional closeup view of a sidewall of a polysilicon block of FIG. 32, showing an ion concentration profile created by the ion implantation operation of FIG. 32.

FIG. 33 illustrates section line 33—33 taken from FIG. 32, wherein the ion implantation operation, conducted without an intervening heat treatment, demarcates a sharp ion concentration profile of implanted ions characterized by heavily implanted polysilicon region 154a and relatively unimplanted polysilicon region 154b. To maintain a consistent ion concentration profile, ion implantation can be conducted in multiple implantation stages in the manner discussed above for the first method, and specifically as discussed with respect to FIG. 3.

Figure 34:
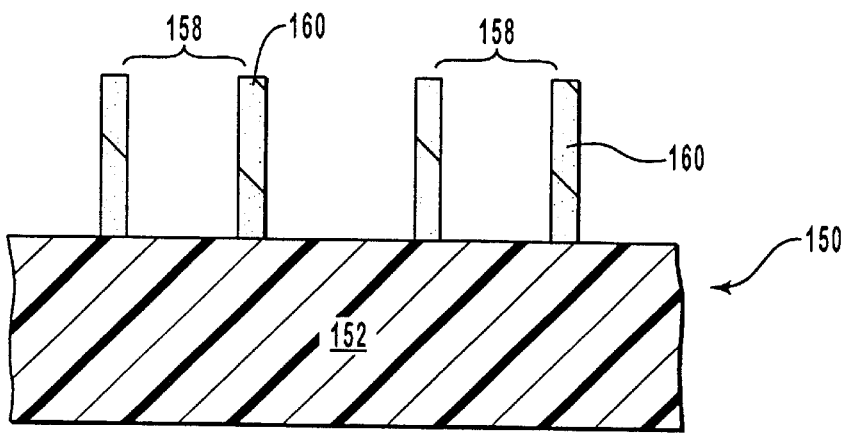
FIG. 34 is a cross-sectional view of the semiconductor wafer of FIG. 31, showing the results of a further procedure in the sixth method in which an etching process is conducted which is selective to implanted silicon-containing material to form a plurality of free-standing walls.

FIG. 34 is a cross-sectional illustration showing the results of an etching process which is selective to implanted silicon-containing material as discussed in the first method. Relatively unimplanted polysilicon region 154b is etched away, while heavily implanted polysilicon region 154a is left remaining. As a result of implanting ions from two opposing angles, the centers of patterned polysilicon blocks 158 are removed, leaving two thin, free-standing columns 160 formed at the location of each of patterned polysilicon blocks 158. Free-standing columns 160 extend a selected distance in a direction looking into the page of FIG. 34. Also, free-standing columns 160 can be elongated, forming, for instance, interconnect lines. Free-standing columns 160 can likewise be formed as non-linear structures. Pairs of thin free-standing columns 160, as shown in FIG. 34, are suitable for use as a stacked capacitor storage node.

Figure 38:
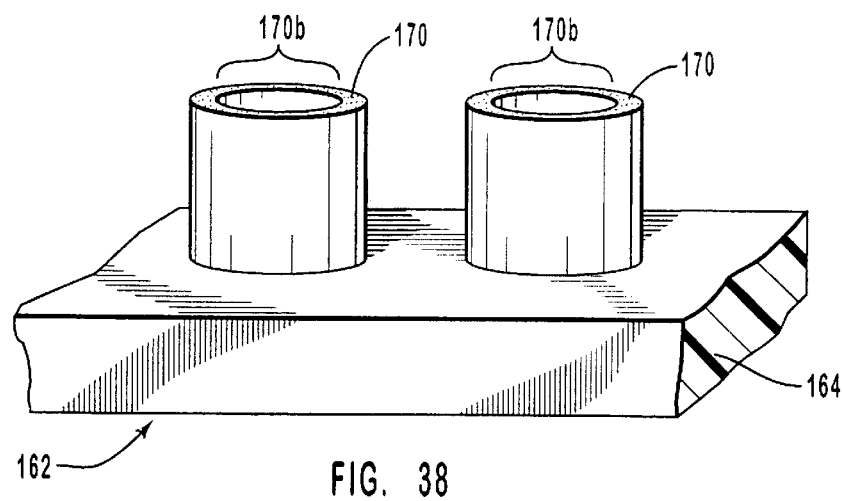
FIG. 38 is a perspective view of the semiconductor wafer of FIG. 36, showing the results of a further procedure in the seventh method in which an etching process which is selective to implanted silicon-containing material is conducted to produce a pair of annular free-standing walls.

In a further embodiment of the sixth method, photoresist mask 156 of FIG. 32 is formed with an island or islands having a circular shape that causes patterned polysilicon blocks 158 to have a corresponding circular surface shape. Also in the further embodiment, semiconductor wafer 150 is rotated during ion implantation, or various angles are used during ion implantation in order to implant the periphery of the side surfaces of patterned polysilicon blocks 158. The ions are preferably implanted to a uniform depth. The resulting structure is a substantially annular sidewall 168a seen in a perspective view in FIG. 38. FIG. 38 is discussed below with respect to the seventh method of the present invention.

The thickness of the free-standing wall formed by the sixth method, whether that of thin free-standing columns 160 or that of substantially annular sidewall of FIG. 38, is determined by the ion implantation parameters. For instance, less than an orthogonal angle of implantation will result a shallow ion penetration and a thicker free-standing wall. Alternatively, a lower implantation energy will result in a thinner free-standing wall. Further, the free-standing wall can be thinner than can be formed by conventional photolithography methods.

Free-standing walls of the sixth method can be formed into a structure having a high aspect ratio of which conventional photolithography and etching methods are incapable. The different embodiments of the free-standing wall provide a flexibility to the integrated circuit fabrication process. Additionally, the free-standing wall is formed in a simple and efficient manner, thereby maintaining a high throughput and low cost of the integrated circuit fabrication process.

Figure 35:
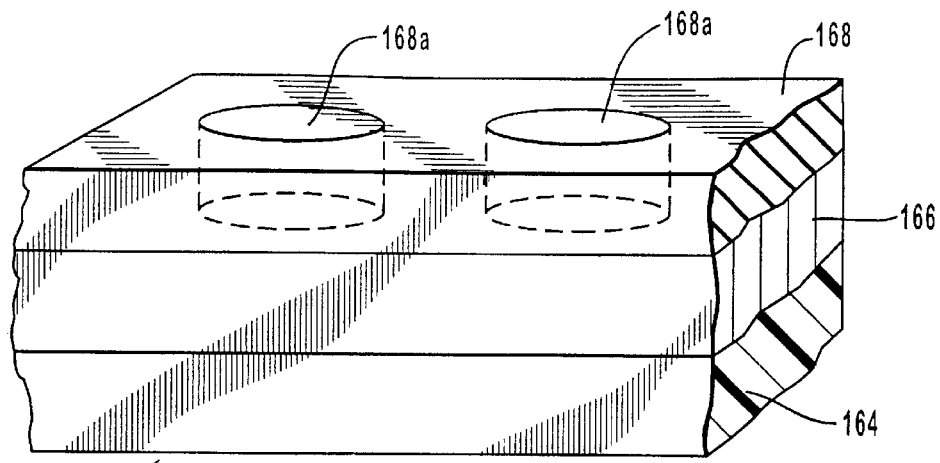
FIG. 35 is a perspective view of a semiconductor wafer showing initial procedure in a seventh method of the present invention in which a masking substrate is formed over a polysilicon layer and is patterned with circular openings shown in phantom.

7. Formation of a Continuous Free-standing Wall with the Etching Process which is Selective to Implanted Silicon-containing Material A seventh method is illustrated in FIGS. 35 through 38, and involves the formation of a continuous free-standing wall. In FIG. 35, a semiconductor substrate is provided as a semiconductor wafer 162. Semiconductor wafer 162 in the depicted embodiment is formed with a silicon substrate 164. A volume of silicon-containing material is formed over silicon substrate 164 as a polysilicon layer 166. A masking substrate, in the depicted embodiment having the form of a photoresist mask 168, is thereafter applied over polysilicon layer 166 and is patterned with photolithography. Photoresist mask 168 is patterned with circular openings 168a in the locations wherein continuous, free-standing walls are to be formed.

Figure 36:
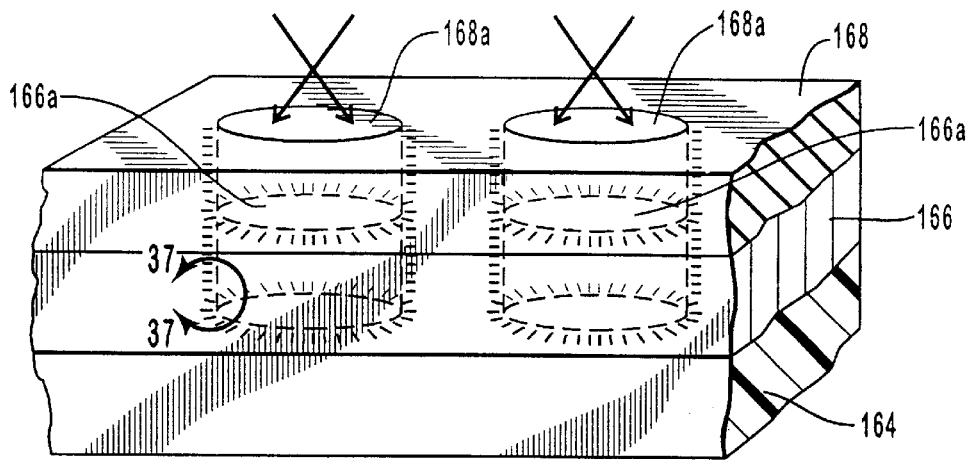
FIG. 36 is a perspective view of the semiconductor wafer of FIG. 35, showing a further procedure in the seventh method in which the polysilicon layer of FIG. 35 is anisotropically etched to form a pair of circular openings in the polysilicon layer, and in which ions are implanted into sidewalls of the circular openings depicted in phantom.

After photoresist mask 168 is patterned, as shown in FIG. 36, an anisotropic dry etch or equivalent etching process is conducted on polysilicon layer 166 through photoresist mask 168. Substantially circular openings 166a are formed in polysilicon layer 166 and silicon substrate 164 is exposed. The anisotropic dry etch is followed by implantation of ions, illustrated by angled arrows in FIG. 36, into the side surfaces of substantially circular openings 166a.

Figure 37:
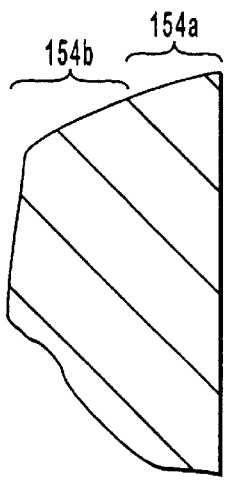
FIG. 37 is a cross-sectional closeup view of a sidewall of a polysilicon block of FIG. 36, showing an ion concentration profile created by the ion implantation operation of FIG. 35.

FIG. 37 illustrates section line 37—37 taken from FIG. 36 wherein, similar to the view of section line 33—33 of FIG. 32, ion implantation without an intervening heat treatment demarcates a sharp implantation concentration profile of implanted ions characterized by heavily implanted polysilicon region 154a and relatively unimplanted polysilicon region 154b. To maintain a uniform implantation concentration profile, ion implantation can once again be conducted in multiple stages in the manner discussed above for the first method.

FIG. 38 illustrates the results of further processing of the seventh method, wherein the etching process is conducted which is selective to implanted silicon-containing material discussed in the first method above. The etching process etches away relatively unimplanted polysilicon region 154b, while heavily implanted polysilicon region 154a is left remaining. The etching process produces continuous free-standing walls 170 that define therein a circular chamber 170b that is suitable for use as a stacked capacitor storage node. Continuous free-standing walls 170 have a thickness that is determined by the ion implantation parameters. For instance, a less than orthogonal angle of ion implantation will result in shallower ion implantation and a thinner sidewall. A high implantation energy will also result in a thicker sidewall. Further, continuous free-standing walls 170 can be of a width that is narrower than can be formed by conventional photolithography methods.

The seventh method is an alternative to the sixth method and provides similar advantages. It will be readily apparent to one of skill in the art that varying types of thin polysilicon sidewalls can be formed by varying the shape of open cylindrical wells 166*a* and the extent of the laterally extending surfaces of open cylindrical wells 166*a* that are implanted.

8. Formation of a MOS Surround-gate Transistor with the Etching Process which is Selective to Implanted Silicon-containing Material An eighth method of the present invention is directed to the formation of a MOS surround-gate transistor. Initially, there is provided a volume of a silicon-containing material extending from a planar surface on a semiconductor substrate, where, said volume of said of the silicon-containing material has thereon a side surface. Next, a plurality of ions are implanted into said volume of said side surface of said of a silicon-containing material at a non-orthogonal angle to said planar surface on said semiconductor substrate. The implantation forms in said of a silicon-containing material a first implanted portion and a second implanted portion, the first implanted portion having a concentration of said ions that is greater than that of the second implanted portion.

The following step is the selective removing of the silicon-containing material from the second implanted portion at a material removal rate that is at least two times greater than that of the first implanted portion to form a shaped structure extending from the planar surface on the semiconductor substrate.

The volume of the silicon-containing material extending from the planar surface of the semiconductor substrate can be provided by depositing a layer of the silicon-containing material on the planar surface of the semiconductor substrate, then forming a masking substrate on the layer of the silicon-containing material, the masking substrate having an opening therein below which is situated an unmasked portion of the layer of the silicon-containing material, and then anisotropically etching the layer of the silicon-containing material to substantially remove therefrom the unmasked portion and to form the volume of the silicon-containing material extending from the planar surface of the semiconductor substrate. Prior to the step of selectively removing the silicon-containing material from the second implanted portion, the step of removing the masking substrate on the layer of the silicon-containing material is conducted.

In an alternative embodiment of the eight method, the opening in the masking substrate has a closed perimeter; and the anisotropic etching of the layer of the silicon-containing material forms a void defined by the side surface of the volume of the silicon-containing material, the side surface being a continuous surface within the void. It may also be designed into the fabrication process that the opening in the masking substrate has a substantially circular cross-section, that the void defined by the side surface of the volume of silicon-containing material is substantially cylindrical, and that the shaped structure has a outside surface opposite and substantially parallel to the side surface, both the outside and side surfaces of the shaped structure being substantially circular in cross section.

Figure 39:
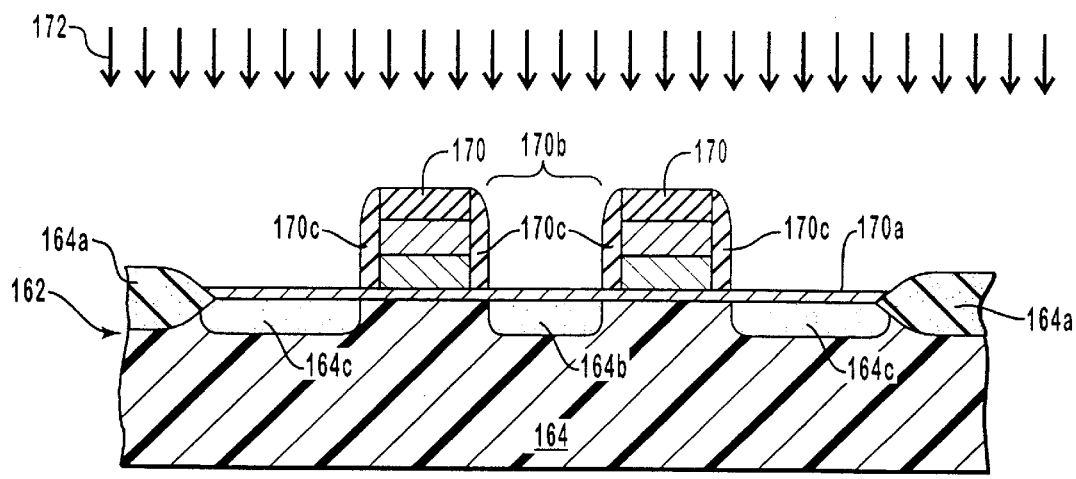
FIG. 39 is a cross-sectional view of a semiconductor wafer showing initial procedure in an eighth method of the present invention in which a MOS surround-gate transistor is formed with a conical sidewall and in which ions are implanted to form doped source/drain regions of the MOS surround-gate transistor.
Figure 40:
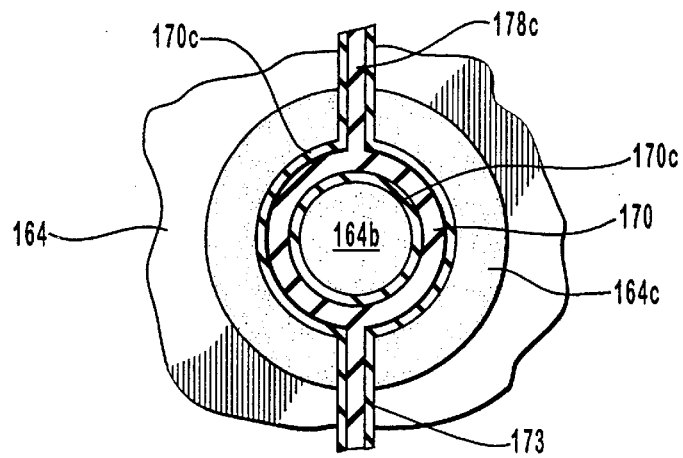
FIG. 40 is a top-down view of the semiconductor wafer of FIG. 39, showing the completed MOS surround-gate transistor thereon.
Figure 41:
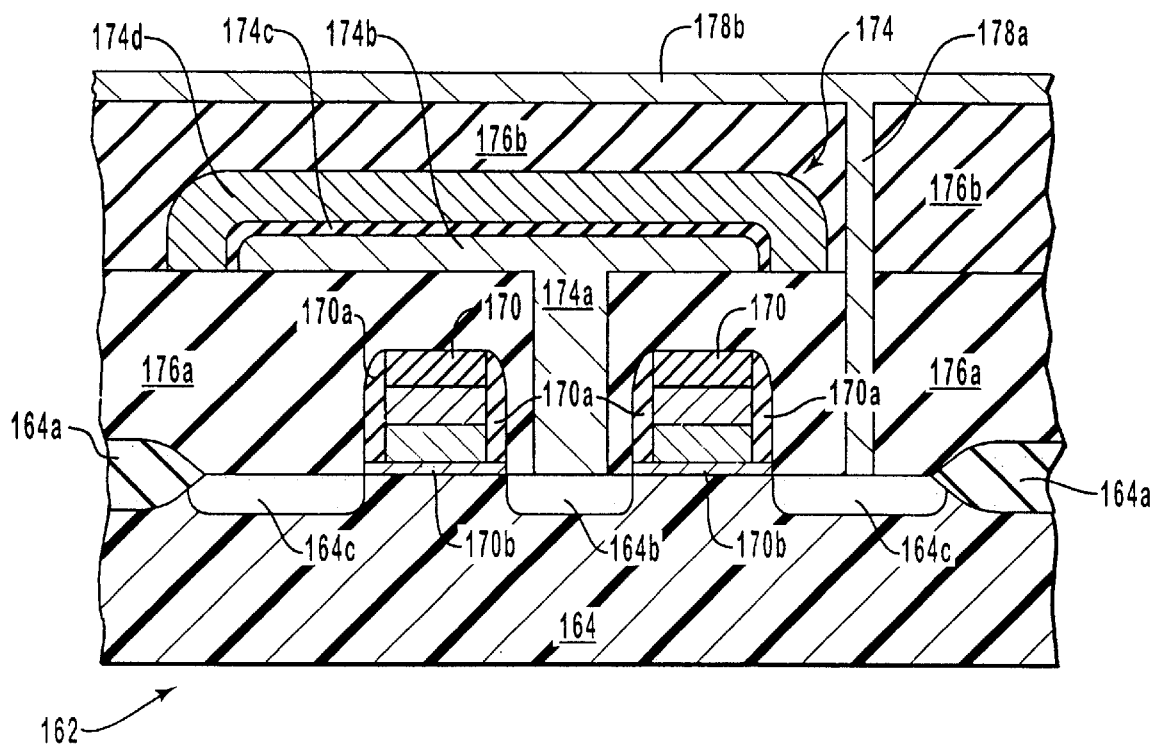
FIG. 41 is a cross-sectional view of the semiconductor wafer of FIG. 40, showing a procedure used in forming a memory cell incorporating the MOS surround-gate transistor of FIG. 40.

Referring now to FIGS. 39 through 41, there is illustrated an eighth method of the present invention which is directed to the formation of a MOS surround-gate transistor. FIG. 39 illustrates a semiconductor substrate comprising, in the depicted embodiment, a semiconductor wafer 162 on which is located a silicon substrate 164. LOCOS spacer regions 164*a* are formed on silicon substrate 164 defining an open region in the center thereof within which the surround-gate MOS transistor will be formed. A gate oxide layer 170*a* is subsequently formed in the open region on silicon substrate 164.

In further processing of the eighth method, a continuous free-standing wall, such as one of continuous free-standing walls 170 of FIG. 38, is provided on gate oxide layer 170*a*. It is preferred that the continuous free-standing wall be formed by either the sixth or seventh method. Thus, in one embodiment, a continuous free-standing sidewall 170 is formed with the etching process which is selective to implanted silicon-containing material of the present invention. Continuous free-standing wall 170 need not necessarily be annular, and could be of another continuous shape. For instance, a continuous free-standing wall could be used that forms a rectangle or a hexagon in cross-section thereof. Nevertheless, in the illustrated embodiment, a substantially annular continuous free-standing wall will be depicted and discussed.

Once continuous free-standing wall 170 has been formed, sidewall spacers 170*c*, seen in FIGS. 39 and 40, are formed on continuous free-standing wall 170, one at each of the interior and exterior thereof. Once sidewall spacers 170*c* are formed, ions are implanted into silicon substrate 164 at the interior of continuous free-standing wall 170 and around the exterior of continuous free-standing wall 170. The ion implantation operation, denoted by arrows 172, forms a center source/drain region 164*b* at the interior of continuous free-standing wall 170 and an outer source/drain region 164*c* at the exterior of continuous free-standing wall 170. Of course, one skilled in the art will appreciate that varying manners of implanting dopants to form a source/drain region can be used. For instance, the sequence of forming sidewall spacers 170*c*, center source/drain region 164*b*, and outer source/drain region 164*c* can be varied. A word line 178*c* extends below a field oxide region and is formed extending laterally to other memory cells, and is placed in electrical connection with gate 170 of the surround gate transistor.

A circular channel is located between center source/drain region 164*b* and outer source/drain region 164*c*. The circular channel is preferably lightly doped with a dopant type opposite the dopant type of center source/drain region 164*b* and outer source/drain region 164*c*. The doping of the circular channel is preferably conducted in a prior doping operation to that of silicon substrate 164.

A plan view of the MOS surround-gate transistor is shown in FIG. 40 wherein continuous free-standing wall 170 forms the gate region of the MOS surround-gate transistor. At either side of annular sidewall 170 is one of sidewall spacers 170*c*. In silicon substrate 164 within circular chamber 170*b* is shown center source/drain region 164*b*. Also in silicon substrate 164, and exterior to continuous free-standing wall 170 and the outer of sidewall spacers 170*c*, there is shown outer source/drain region 164*c*. LOCOS spacer regions 164*a*, not seen in FIG. 40, are located on silicon substrate 164 at the exterior of outer source/drain region 164*c*. From the view provided by FIG. 40, it can be seen that the MOS surround-gate transistor formed by the eighth method has a narrow width of the circular channel between center source/drain region 164*b* and outer source/drain region 164*c*.

The MOS surround-gate transistor can be formed with a circular channel length of less than a quarter micron. The channel length is determined by the thickness of annular sidewall 170, which in turn is determined by the angle and energy of the implanted ions, as described above for the sixth and seventh methods. Thus, under the eighth method, a MOS surround-gate transistor is provided with a channel length of less than about 0.5 microns. Preferably, the channel length is between about 0.125 and 0.25 microns, and most preferably, the channel length is about 0.25 microns.

FIG. 41 depicts a manner of completing a MOS DRAM memory cell based on the surround-gate transistor of the present invention. As shown in FIG. 41, a contact 174*a* is formed extending up from center source/drain region 164*b* at the interior of annular sidewall 170. In so doing, a lower insulating layer 176*a* is first formed of an insulating material such as BPSG, after which a contact opening is etched and filled with a conducting material such as aluminum. Contact 174*a* is, in the depicted embodiment, used for making contact with a capacitor storage node 174*b*, which is thereafter formed over lower insulating layer 176*a* in electrical contact with contact 174*a*.

After forming storage node 174*b*, a capacitor dielectric 174*c* is formed over the top thereof. An upper capacitor plate 174*d* is then formed over capacitor dielectric 174*c* to complete a capacitor 174. In the depicted embodiment, both of capacitor storage node 174*b* and upper plate 174*d* are formed of polysilicon. Capacitor 174 and contact 174*a* connecting thereto can be formed at the center of the opening between LOCOS spacer regions 164*a*. The arrangement allows the memory cell to be highly compact, while also allowing capacitor 174 to be spaced apart from LOCOS spacer regions 164*a*. This spacing is advantageous in that conventional capacitors must generally be formed in close proximity to LOCOS spacer regions, causing charge leakage through stress cracks in LOCOS spacer regions. Spacing conventional capacitors apart from LOCOS spacer regions will take up more space on the silicon substrate, thus frustrating miniaturization efforts. Accordingly, the placement of capacitor 174 results in a reduced amount of charge leakage compared to conventional memory cells and promotes greater miniaturization of the integrated circuit being formed.

In completing the DRAM memory cell, an upper insulating layer 176*b* is formed over lower insulating layer 176*a* and capacitor top plate 174*d*. A bit line contact 178*a* is formed through upper insulating layer 176*b* and lower insulating layer 176*a* extending down to outer source/drain region 164*c*.

The MOS surround-gate transistor described above occupies a minimum of space on the silicon substrate and is formed in a more streamlined manner than surround-gate transistors of the prior art due to the use of the etching process which is selective to implanted silicon-containing material in forming a continuous free-standing annular sidewall. The MOS surround-gate transistor can be formed with a channel of less than a quarter micron. The MOS surround-gate transistor is also easily incorporated into a DRAM memory cell which is compact and exhibits minimal charge leakage.

9. Formation of a Stacked Capacitor Storage Node with the Etching Process which is Selective to Implanted Silicon-containing Material FIGS. 42–45 illustrate a ninth method of the present invention, in which a stacked capacitor storage node is created within a small surface area and in a self-aligned manner using the etching process which is selective to implanted silicon-containing material of the present invention.

Figure 42:
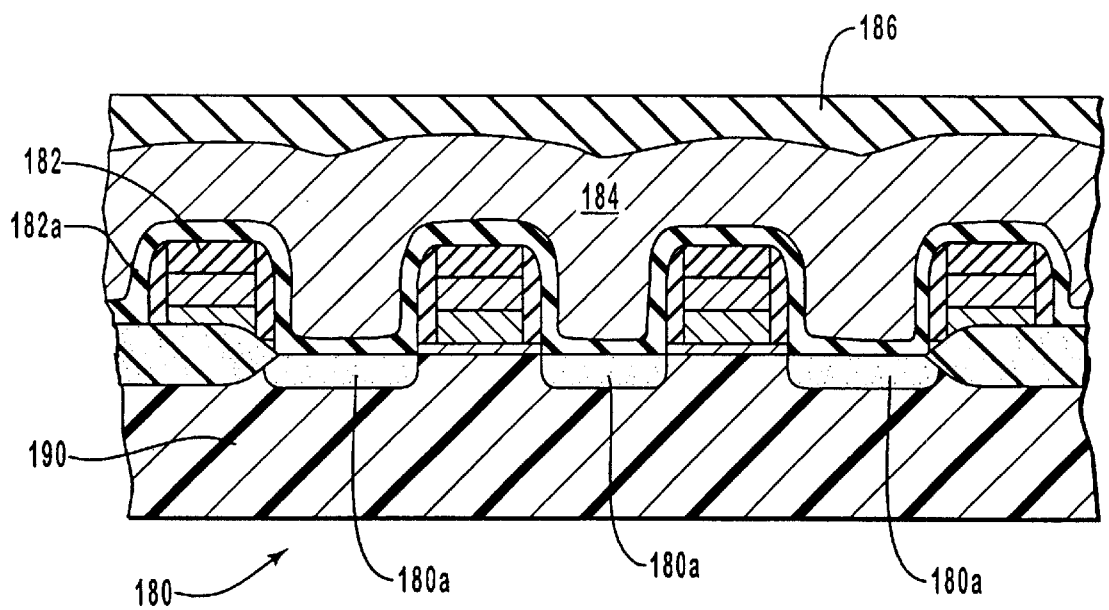
FIG. 42 is a cross-sectional view of a semiconductor wafer showing an initial procedure in a ninth method of the present invention in which a series of gate structures are provided on a semiconductor wafer and are covered by a polysilicon layer and a silicon nitride layer.

As illustrated in FIG. 42, conventional process flow is initially followed under the ninth method until gate regions are formed. As shown, a semiconductor substrate is provided in the form of a semiconductor wafer 180. Semiconductor wafer 180 is formed with a silicon substrate 190 thereon, upon which is formed active regions 180*a* adjoined by gate regions 182. A dielectric layer such as a TEOS layer 182*a* is formed over active regions 180*a* and gate regions 182. A polysilicon layer 184 is deposited over TEOS layer 182*a*. Polysilicon layer 184 is formed of intrinsic polysilicon as described above, and could comprise HSG polysilicon. Above polysilicon layer 184 is formed a hard mask layer, such as a silicon nitride hard mask layer 186. The hard mask layer serves as both a hard mask for an ion implantation process and as an etch barrier for a subsequently conducted height reduction process. Silicon dioxide is also a suitable material for forming the hard mask layer.

Figure 43:
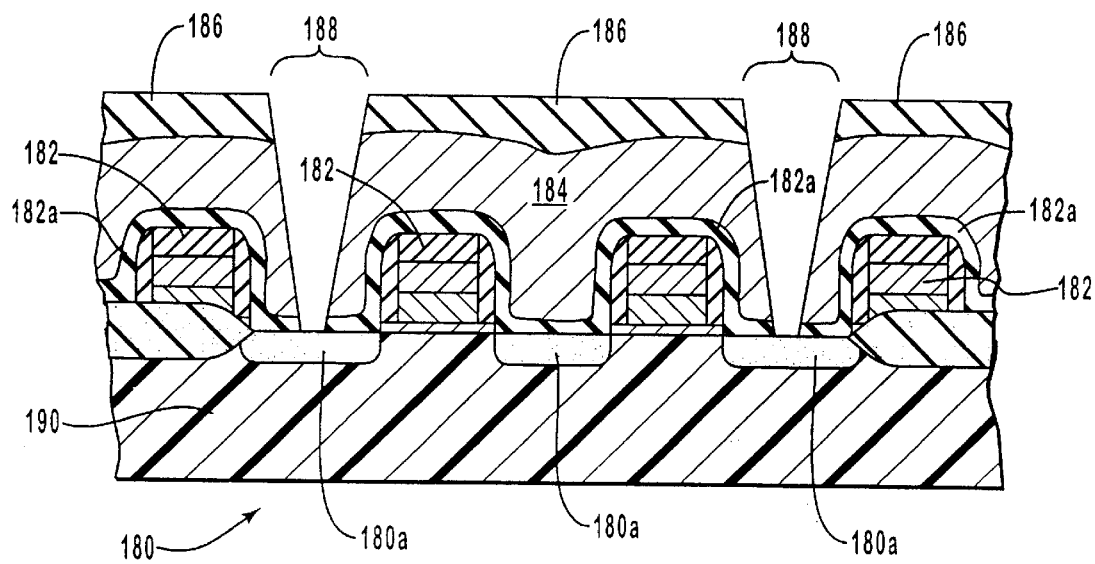
FIG. 43 is a cross-sectional view of the semiconductor wafer of FIG. 42, showing a further procedure in the ninth method of the present invention in which a conical opening is etched through the silicon nitride layer and the polysilicon layer of FIG. 42.

FIG. 43 illustrates further processing of the ninth method, wherein silicon nitride hard mask layer 186 is patterned with circular openings in each location wherein a stacked capacitor storage node is to be formed. Once silicon nitride hard mask 186 is patterned, an isotropic etching process is conducted to create a conical opening 188 in polysilicon layer 184 extending down to active region 180*a* in silicon substrate 190. Due to its sloped profile, conical opening 188 contacts silicon substrate 190 with a small surface area. This small surface area allows conical opening 188 to be provided with a broad latitude of space for landing upon one of active regions 180*a*. Consequently, active regions 180*a* can also be formed more compactly, thus allowing for greater miniaturization of the resulting integrated circuit.

Figure 44:
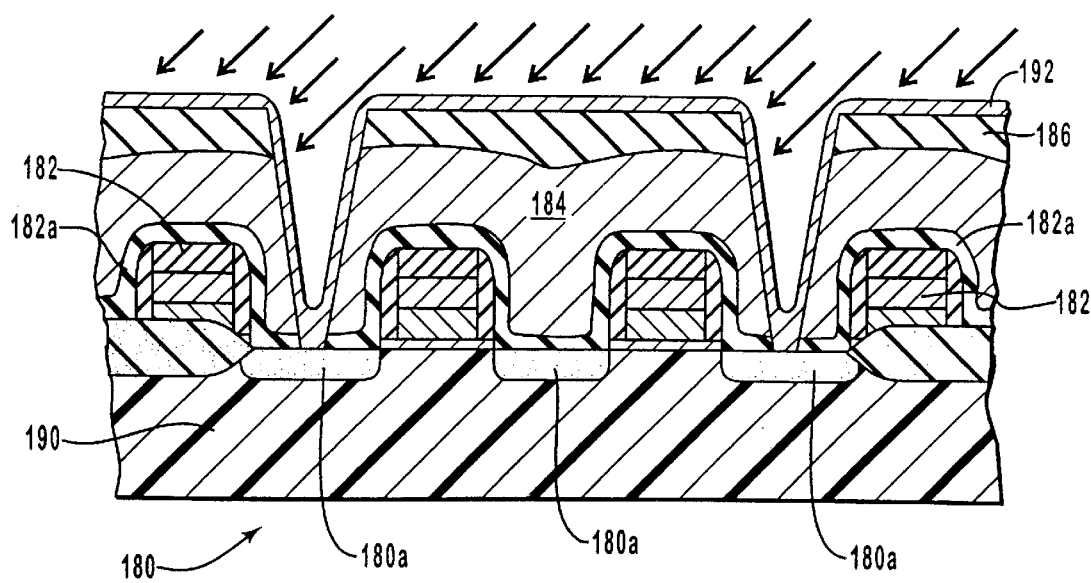
FIG. 44 is a cross-sectional view of the semiconductor wafer of FIG. 43, showing a further procedure in the ninth method of the present invention in which a second polysilicon layer is deposited and into which ions are implanted.
Figure 45:
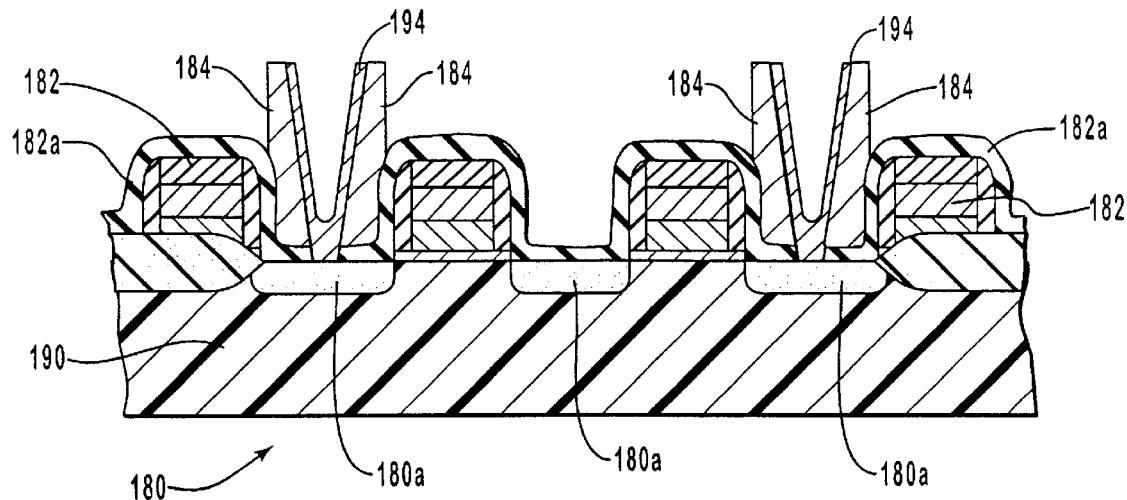
FIG. 45 is a cross-sectional view of the semiconductor wafer of FIG. 44, showing a further procedure in the ninth method of the present invention in which an etching process which is selective to implanted silicon-containing material is conducted to obtain a pair of small surface area polysilicon capacitor storage nodes.

As shown in FIG. 44, after conical opening 188 is constructed, a second polysilicon layer 192 is deposited over silicon nitride hard mask layer 186 and over conical opening 188 in order to make electrical contact with active region 180*a*. An ion implantation process, represented by arrows in FIG. 44, is then conducted to implant ions into the portion of second polysilicon layer 192 that is located within conical opening 188. The ions can be implanted at an angle orthogonal to semiconductor wafer 180, or can be implanted in multiple implantation stages in the manner discussed above for the first method, and by varying the angle of implantation or other parameters between the different implantation stages. The ions are implanted with a predetermined depth achieved by the proper selection of the ion implantation parameters. The predetermined depth in turn determines the thickness of a sidewall of the stacked capacitor storage node that is to be formed.

An uppermost surface of second polysilicon layer 192 which overlies silicon nitride hard mask 186 is then removed by a height reduction process such as chemical-mechanical planarization (CMP). Silicon nitride hard mask layer 186 is thereafter removed by an etching process which is selective to polysilicon, or by a height reduction process such as CMP. Other ion implantation parameters can also be appropriately selected, as described above for the first method, in order to tailor the ion concentration profile formed by the implanted ions.

Once the ion implantation operation is conducted, the etching process is conducted which is selective to implanted silicon-containing material of the present invention. The etching process is conducted substantially in the same manner as described above for the first method. Consequently, the unimplanted polysilicon of first polysilicon layer 184 is removed, leaving conical structures 194 seen in FIG. 45. Conical structures 194 are free-standing and preferably have an aspect ratio greater than about 2 to 1. As such, conical structures 194 can be designed to have a relatively small surface area contact to active region 180*a*, and are suitable for use as stacked capacitor storage nodes. HSG or CSG polysilicon may also be deposited on the surface of conical structures 194 so as to increase the surface area thereof.

The ninth method is advantageous in that it eliminates a masking step of prior art stacked capacitor storage node formation processes. The stacked capacitor storage node formation process is thereby simplified, yield is increased, and the throughput of the integrated circuit fabrication process is also increased. The resulting stacked capacitor storage node is self-aligned, further increasing yield, and further facilitating greater miniaturization of the integrated circuit being manufactured.

Figure 46:
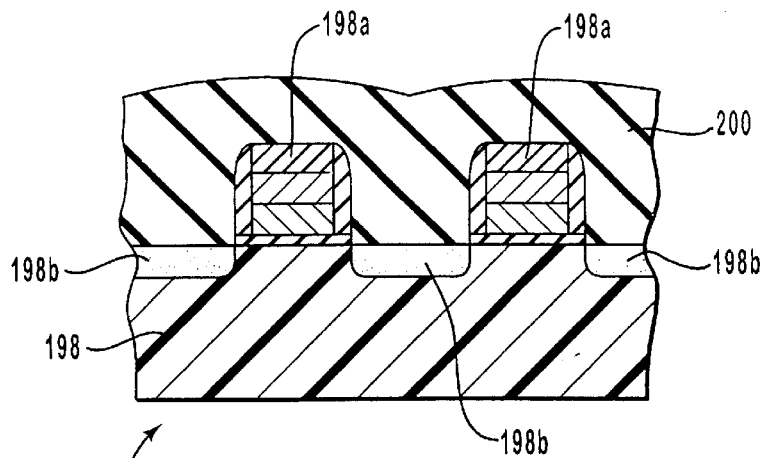
FIG. 46 is a cross-sectional view of a semiconductor wafer depicting an initial procedure of a tenth method of the present invention in which a pair of gate regions and an intervening active region are formed on a semiconductor wafer and wherein a polysilicon layer is formed thereover.
Figure 47:
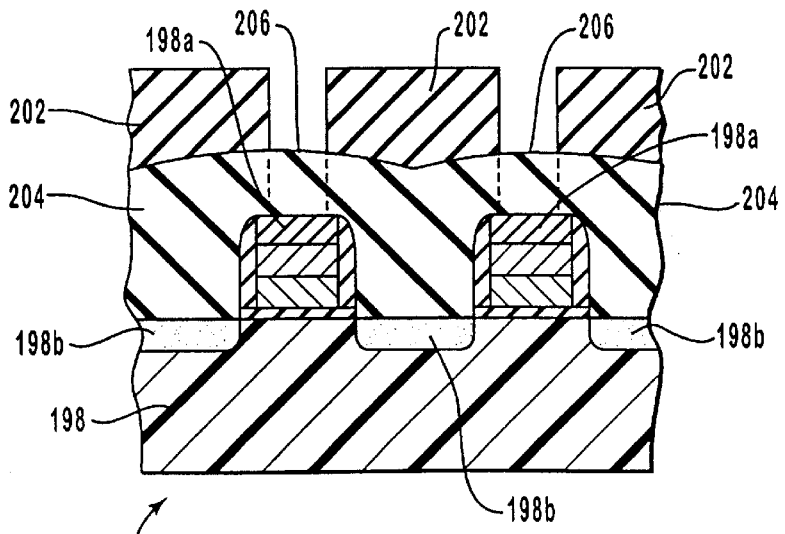
FIG. 47 is a cross-sectional view of the semiconductor wafer of FIG. 46, depicting a further procedure of the tenth method of the present invention in which a masking substrate is formed and patterned over the active region of FIG. 46.

10. Formation of a Polysilicon Plug with the Etching Process which is Selective to Unimplanted Silicon-containing Material A tenth method of the present invention, illustrated in FIGS. 46–49, uses the etching process which is selective to unimplanted silicon-containing material of the second method to form a polysilicon plug. As shown in FIG. 46, the tenth method initially involves providing a semiconductor substrate. In the depicted embodiment, the semiconductor substrate is a semiconductor wafer 196 which has provided thereon a silicon substrate 198. A plurality of gate regions 198a and adjacent active regions 198b are formed on the semiconductor substrate, and a layer of silicon-containing material, which in the depicted embodiment is a polysilicon layer 200, is formed over gate regions 198a and over active regions 198b. In subsequent processing of the tenth method, a masking substrate, in one embodiment a photoresist mask 202, is applied over polysilicon layer 200 and is patterned with an island located over active regions 198b as shown in FIG. 47. Polysilicon layer 200 is thus functionally divided into a first portion 204 that is covered with photoresist mask 202, and a second portion 206 that is unmasked.

Figure 48:
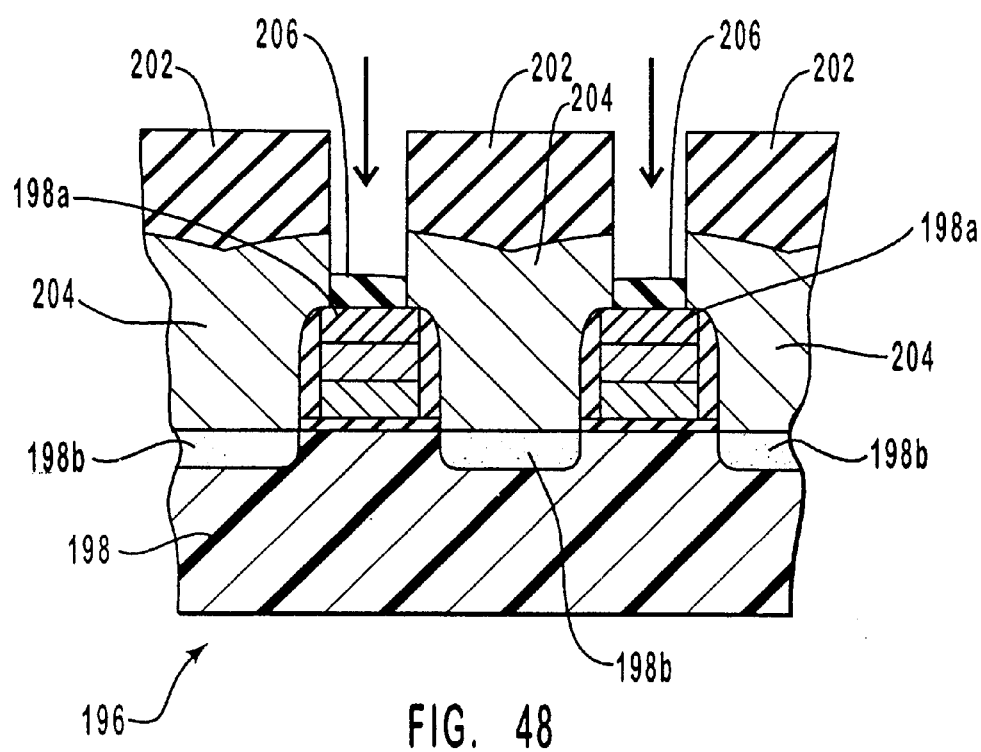
FIG. 48 is a cross-sectional view of the semiconductor wafer of FIG. 47, depicting a further procedure of the tenth method of the present invention in which exposed regions of the polysilicon layer are partially etched and wherein ions are implanted into the partially etched exposed regions of the polysilicon layer.
Figure 49:
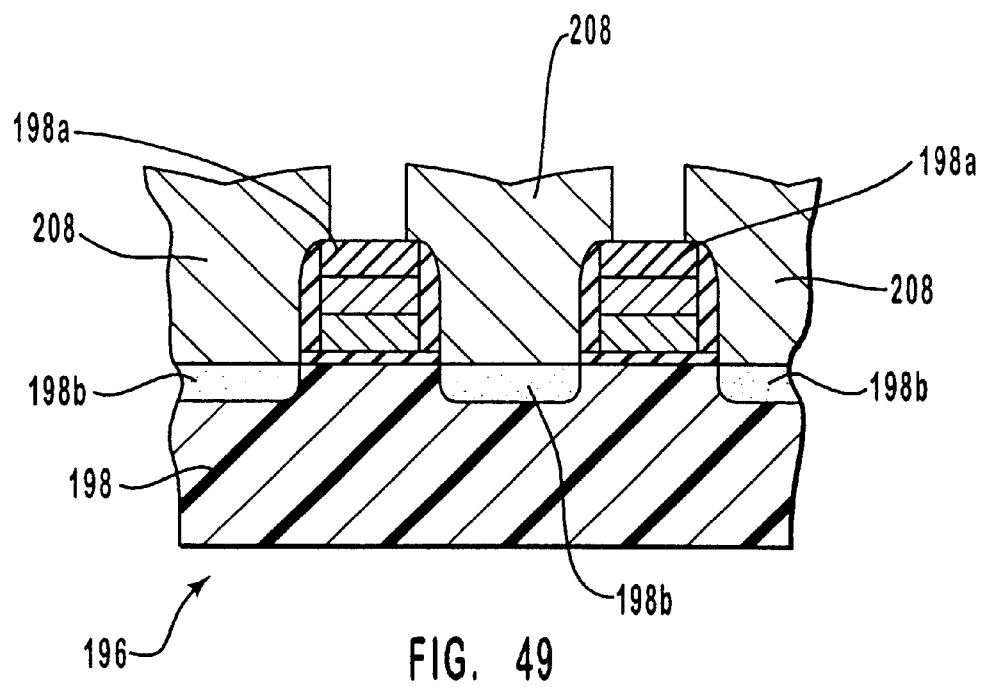
FIG. 49 is a cross-sectional view of the semiconductor wafer of FIG. 48, showing a further procedure in the tenth method of the present invention in which an etching process which is selective to unimplanted polysilicon is conducted to obtain a polysilicon plug.

As shown in FIG. 48, an anisotropic etching process is subsequently conducted to partially reduce the height of second portion 206 of polysilicon layer 200. Once the height of second portion 206 has been partially reduced, ions are first implanted into the remainder of second portion 206 in the manner discussed above for the second method. The ions are of a selected type chosen in accordance with an etching process which is selective to unimplanted silicon-containing material, as discussed above for the second method. Arsenic ions are preferred because they tend to diffuse more slowly than do other ions such as phosphorous ions. Photoresist mask 202 is then removed to expose first portion 204 which is relatively unimplanted and second portion 206 which is heavily implanted.

In a further procedure of the tenth method, and in order to remove the remainder of second portion 206, an etching process is conducted which is selective to unimplanted silicon-containing material substantially as discussed above in the description of the second method. Consequently, second portion 206, which was implanted with ions, is removed, and first portion 204, which was covered with photoresist mask 202 and consequently is relatively unimplanted, is left remaining. The structure seen in FIG. 49 results, wherein polysilicon plugs 208 have been formed.

The tenth method involves fewer processing steps than conventional polysilicon plug formation processes. It also avoids planarization and structural stresses that are caused by planarization, thereby increasing integrated circuit manufacturing process yield. A masking and dry etching operation of conventional interconnect structure opening formation is also eliminated, together with the problems discussed above that are attendant thereto.

11. Formation of a Self-aligned Interconnect Structure Using Stop on Nitride Planarization and the Etching Process which is Selective to Implanted Silicon-containing Material An eleventh method of the present invention is illustrated in FIGS. 50 through 53. The eleventh method uses an etching process which is selective to implanted silicon-containing material together with a planarization process to form a self-aligned interconnect structure.

Figure 50:
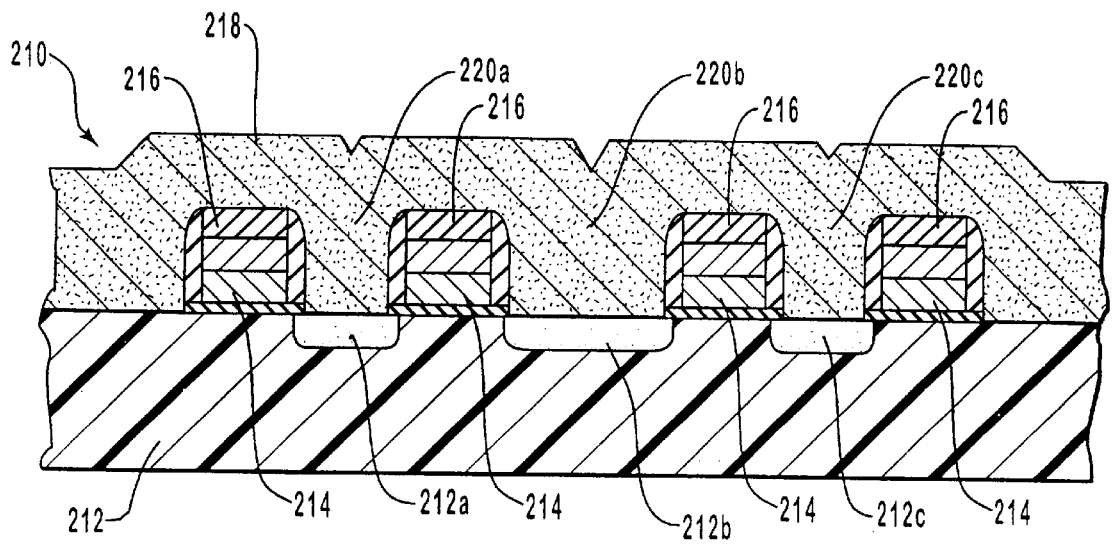
FIG. 50 is a cross-sectional view of a semiconductor wafer showing an initial procedure in an eleventh method of the present invention in which a plurality of gate regions and intervening active regions are formed on a semiconductor wafer and in which a polysilicon layer is formed thereover.

A starting structure for the eleventh method is shown in FIG. 50 where a semiconductor substrate is provided in the form of a semiconductor wafer 210. Semiconductor wafer 210 is comprised of a silicon substrate 212 upon which is provided a plurality of charge conducting regions, which in the depicted embodiment have the form of active regions 212a, 212b, and 212c. The charge conducting regions could also be, for example, the tops of contacts that extend down to semiconductor device features (not shown) located lower on the semiconductor substrate. Also provided on silicon substrate 212, adjacent active regions 212a through 212c are gate regions 214. Each of gate regions 214 has provided on the top thereof a silicon nitride cap 216.

Located over active regions 212a through 212c and gate regions 214 is a volume of silicon-containing material. In the depicted embodiment, the volume of silicon-containing material comprises a polysilicon layer 218. Polysilicon layer 218 is formed over at least one of active regions 212a, 212b, and 212c, and over silicon nitride caps 216. A cleaning process may be conducted on the surface of semiconductor wafer 210 prior to depositing polysilicon layer 218 in order to remove undesirable native oxides that may be present.

Figure 51:
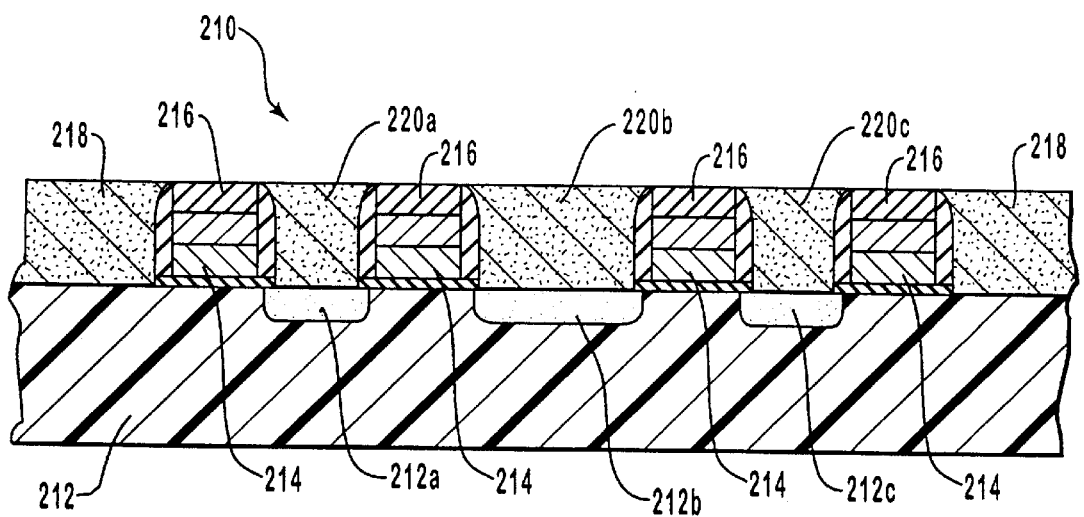
FIG. 51 is a cross-sectional view of the semiconductor wafer of FIG. 50, showing a further procedure of the eleventh method of the present invention in which the polysilicon layer of FIG. 50 is planarized down to the level of the gate regions of FIG. 50.

As shown in FIG. 51, polysilicon layer 218 is subsequently reduced in height. The height is reduced preferably by a planarization process, and more preferably is achieved with a CMP process. The height reduction is preferably conducted selective to silicon nitride in order to reduce the height of polysilicon layer 218 down to the top of silicon nitride caps 216. Silicon nitride caps 216 are thus used as an etch barrier for stopping the height reduction operation. A further brief polysilicon etching process may be needed to fully clear polysilicon layer 218 from the tops of silicon nitride caps 216. A heat treatment process can also be conducted, before or after planarization, to cure seams that may form in polysilicon layer 218 due to the underlying topography.

Figure 52:
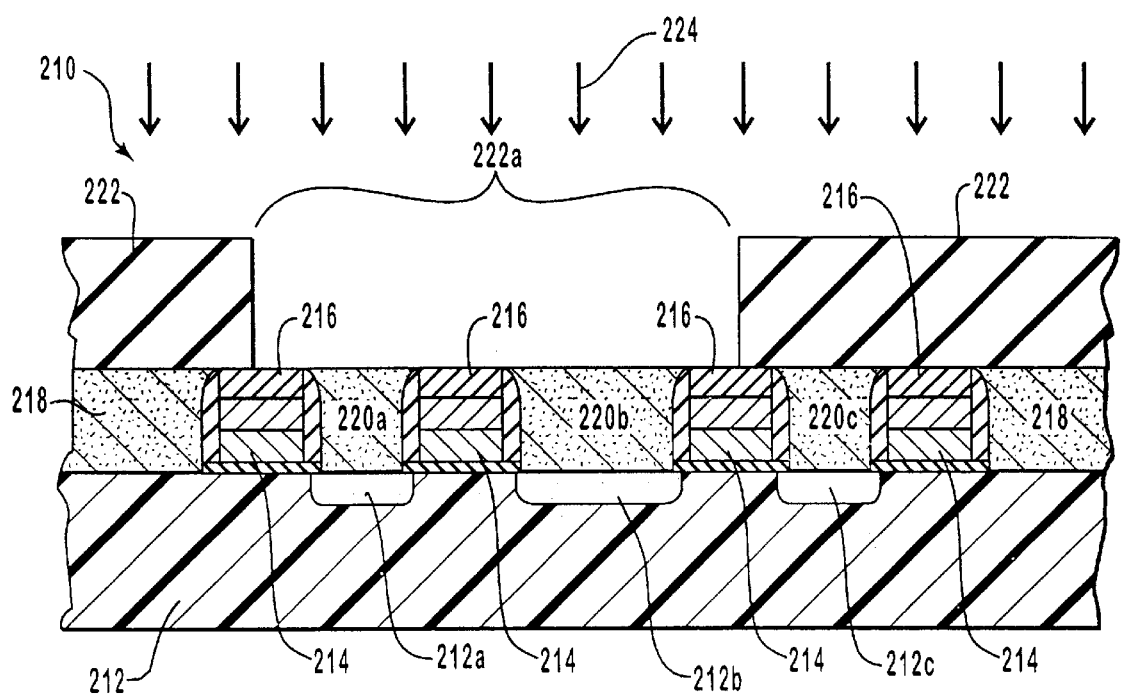
FIG. 52 is a cross-sectional view of the semiconductor wafer of FIG. 51, showing a further procedure of the eleventh method in which an insulating layer is formed over the polysilicon layer of FIG. 51, an opening is formed in the insulating layer, and ions are implanted into polysilicon regions between the gate regions of FIG. 51 under the opening in the insulating layer.

As shown in FIG. 52, after planarizing polysilicon layer 218, polysilicon layer 218 is covered with a masking substrate. In the depicted embodiment, the masking substrate is a silicon nitride hard mask 222, though, as discussed above, any layer that is an effective barrier to implanted ions can be used. Silicon nitride hard mask 222 exposes one or more selected segments of polysilicon layer 218 that overlie and contact active regions 212a and 212b and that are intended to form interconnect structures. Other portions of polysilicon layer 218 that are intended to be removed are covered by silicon nitride hard mask 222. Ion implantation can then be conducted in multiple implantation stages with the ion implantation parameters varied between the implantation stages, and could be conducted with a combination of dopant ions and inert ions as described above for the first method.

In order to properly locate silicon nitride hard mask 222 over the selected segments of polysilicon layer 218 that overlie and contact active regions 212a and 212b, the present invention provides for self-alignment of silicon nitride hard mask 222. In so doing, silicon nitride hard mask 222 is patterned with an opening 222a of a greater width than the selected segments of polysilicon layer 218 that overlie active regions 212a and 212b. The periphery or edges of opening 222a are situated on the tops of two of gate regions 214. The two gate regions 214 are preferably located in contact with selected segments 220a and 220b of polysilicon layer 218 that overlie active regions 212a and 212b, respectively.

Self-alignment occurs due to silicon nitride spacers 214 which act as barriers to ions which are to be implanted into unmasked portions of polysilicon layer 218 in a further stage of the eleventh method. Consequently, a slight misalignment of opening 222a will relocate the edges of opening 222a along the tops of silicon nitride caps 216. As long as the misalignment of opening 222a is not greater than the amount of overlap of opening 222a over gate regions 214, the ions will be confined to the selected segments of polysilicon layer 218 that overlie active regions 212a and 212b and to the tops of selected gate regions 214 adjoining active regions 212a and 212b. If an interconnect structure is intended to be constructed over active region 212c, opening 222a will be formed to also expose the segment of polysilicon layer 218 that is located over active region 212c.

As depicted in FIG. 52, ions of a selected type are subsequently implanted into the unmasked portions 220a and 220b of polysilicon layer 218. The implantation of ions is represented by downward pointing arrows 224. The type of ions to be implanted is selected, as discussed above for the first method, in conjunction with an etching process which is selective to implanted silicon-containing material. In one embodiment, phosphorus ions are implanted. Also, as discussed above, the shape of the selected segment that is implanted with ions can be tailored by varying the implant parameters and by conducting the ion implantation operation in multiple stages, as described above for the first and second methods. The ion implantation operation implants ions into the selected segments 220a and 220b of polysilicon layer 218 located above active regions 212a and 212b, respectively. The remainder of polysilicon layer 218, at 220c for example, is relatively unimplanted. The relatively unimplanted portion of polysilicon layer 218 corresponds to the portion of polysilicon layer 218 that is to be removed, and the selected segments, 220a and 220b, correspond to the portion of polysilicon layer 218 which are to remain. Silicon nitride hard mask 222 is removed after concluding the ion implantation operation.

Figure 53:
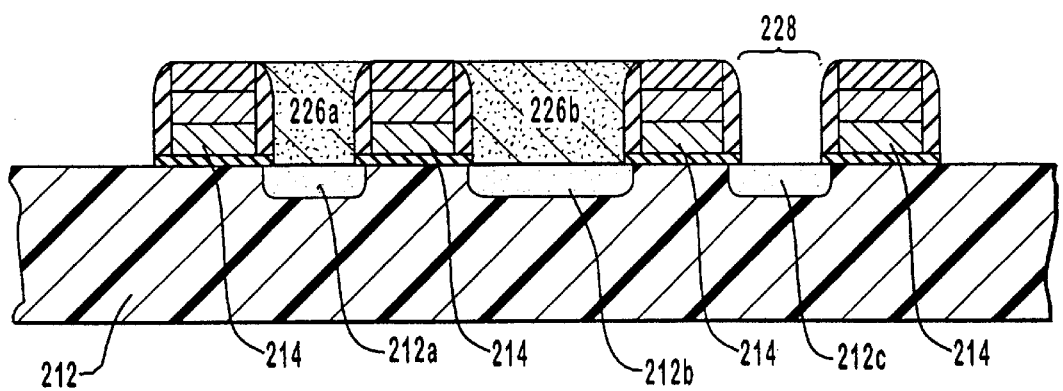
FIG. 53 is a cross-sectional view of the semiconductor wafer of FIG. 52, showing a further procedure of the eleventh method of the present invention in which the insulating layer is removed and the polysilicon layer is etched with an etching process which is selective to implanted silicon-containing material to obtain a pair of polysilicon plugs.

As shown in FIG. 53, polysilicon layer 218 is subsequently etched with the etching process which is selective to implanted silicon-containing material substantially as described in the discussion above of the first method. The etching process parameters can be appropriately selected as also described above, to further tailor the interconnect structures being formed. The etching process which is selective to implanted silicon-containing material results in patterned interconnect structures, shown in the depicted embodiment in the form of polysilicon plugs 226a and 226b. Polysilicon plugs 226a, 226b are formed from the selected segments of polysilicon layer 218 that overlie and contact active regions 212a and 212b and which were implanted in the ion implantation operation.

In the depicted embodiment, the segment of polysilicon layer 218 located above active region 212c which was masked by silicon nitride hard mask 222, and consequently was not implanted with ions, is removed to form an open area 228 therein. Open area 228 can be left open and later filled with insulating material, or can be filled with a conductive material at a later stage in the process flow.

The eleventh method simplifies the polysilicon interconnect structure formation process by eliminating several steps of the conventional process discussed above. The need for a dry etching process is eliminated, as no interconnect structure opening need be formed. Also, the insulating layer need not be deposited until a later stage in the process flow and can be formed concurrently with intermetal dielectric layer formation, thereby eliminating insulating material deposition and reflow steps. The simplified process increases integrated circuit manufacturing process throughput and reduces cost. A higher yield of the integrated circuit manufacturing process is also seen due to reduced opportunities for yield reducing errors to occur in the simplified process. Also, the etching process which is selective to implanted silicon-containing material has greater etching uniformity than the dry etching process of the prior art, thus further improving yield.

12. Formation of a High Aspect Ratio Interconnect Structure Opening Using a Sacrificial Interconnect Structure and the Etching Process which is Selective to Implanted Silicon-containing Material A twelfth method of the present invention is illustrated in FIGS. 54 through 59. Under the twelfth method, a self-aligned interconnect structure opening is etched using a sacrificial interconnect structure.

Figure 54:
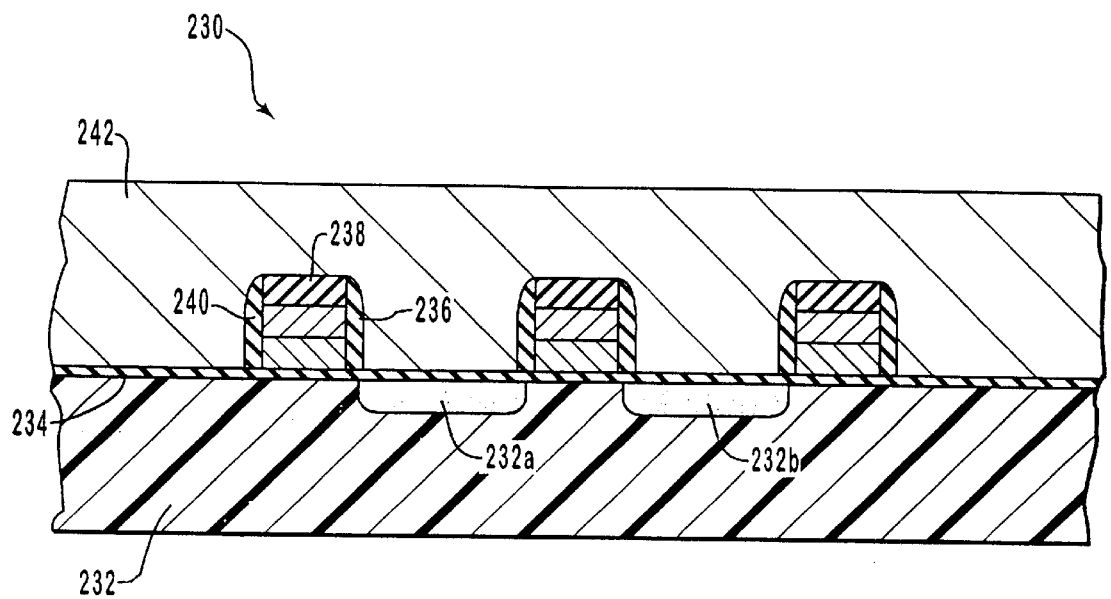
FIG. 54 is a cross-sectional view of a semiconductor wafer showing an initial procedure of a twelfth method of the present invention in which a set of gate regions and intervening active regions are formed on a semiconductor wafer and a polysilicon layer is formed thereon.

FIG. 54 illustrates an initial structure of the twelfth method. The twelfth method essentially incorporates the eleventh method up until the stage wherein a polysilicon plug is constructed. In the twelfth method, however, a thin insulating layer is preferably formed prior to depositing a polysilicon layer. Thus, in the depicted embodiment, charge conducting regions in the form of active regions 232a and 232b are formed on a semiconductor substrate comprising a silicon substrate 232 on a semiconductor wafer 230. A thin insulating layer is formed over at least one charge conducting region, down to which the self-aligned interconnect structure opening is intended to extend. In the depicted embodiment, a thin oxide layer 234 is formed over silicon substrate 232, and the charge conducting regions comprise active regions 232a and 232b. An oxide layer 234 could be a grown or re-grown oxide, or could be an oxide layer remaining from active region formation or gate region formation.

Also, as in the eleventh method, a plurality of raised insulating surfaces are formed on silicon substrate 232 leaving intervening openings located over the charge conducting regions. In the depicted embodiment, the plurality of raised insulating surfaces comprise a trio of gate regions 236, each of which is located adjacent one of active regions 232a and 232b. Gate regions 236 are each covered with one of silicon nitride caps 238, and are encased in silicon nitride spacers 240. A volume of silicon-containing material is formed over active regions 232a and 232b as well as over gate regions 236, filling in the intervening openings over active regions 232a and 232b. In the depicted embodiment, the volume of silicon-containing material is a polysilicon layer 242.

Figure 55:
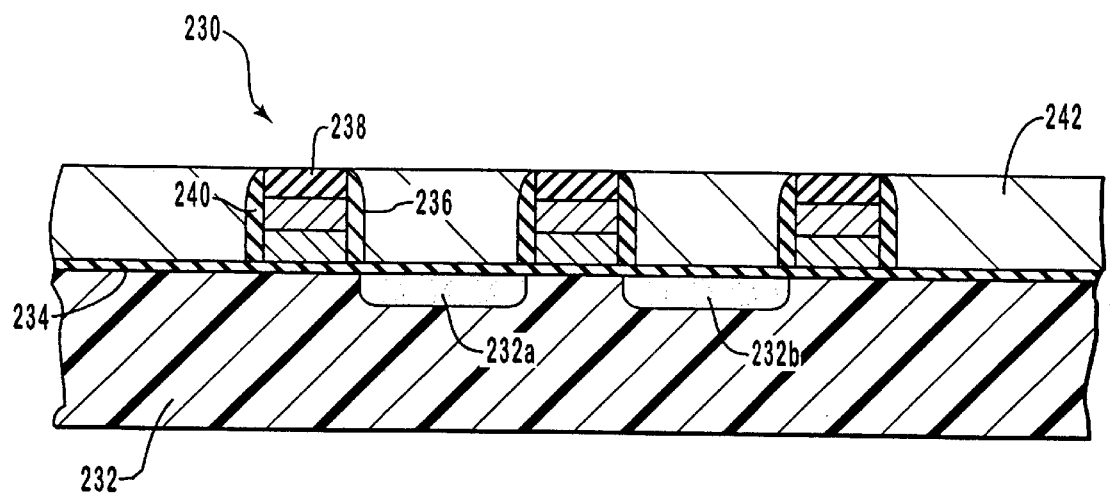
FIG. 55 is a cross-sectional view of the semiconductor wafer of FIG. 54, showing a further procedure of the twelfth method of the present invention in which the polysilicon layer of FIG. 54 is planarized down to the level of the tops of the gate regions of FIG. 54.

The height of polysilicon layer 242, as shown in FIG. 55, is reduced down to the tops of the plurality of insulating surfaces. As discussed for the eleventh method, the height reduction is in one embodiment accomplished with a planarization process, and preferably with a CMP process that stops on silicon nitride caps 238.

Figure 56:
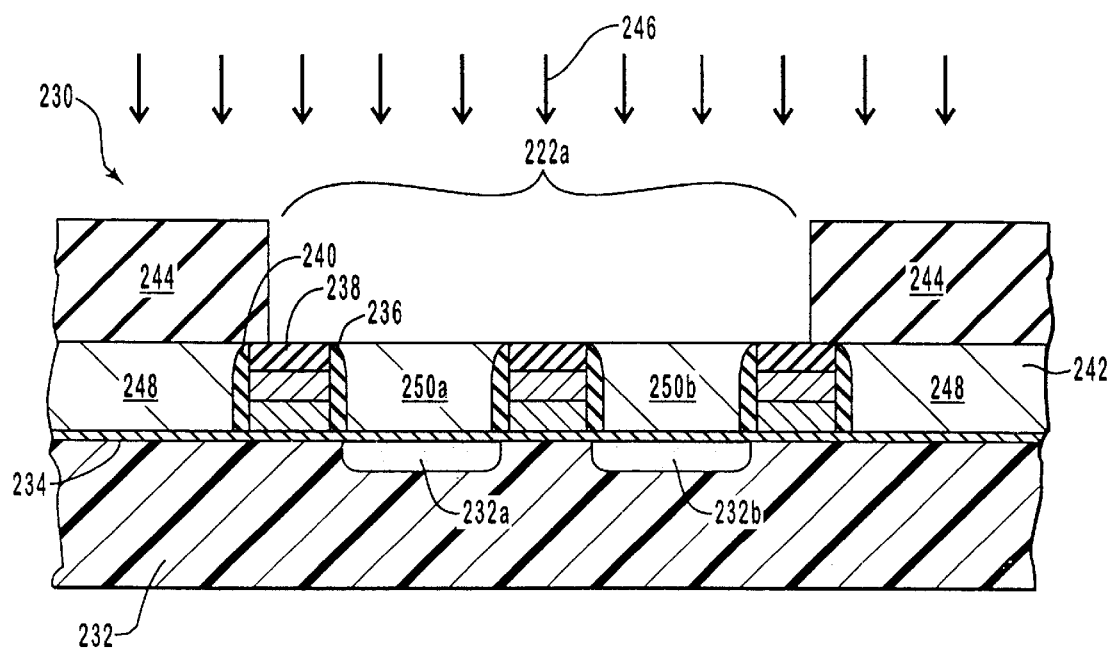
FIG. 56 is a cross-sectional view of the semiconductor wafer of FIG. 55, showing a further procedure of the twelfth method of the present invention in which an insulating layer is formed over the polysilicon layer of FIG. 55, an opening is formed in the insulating layer, and ions are implanted into polysilicon regions between the gate regions under the opening in the insulating layer.

FIG. 56 shows subsequent steps of the twelfth method, wherein polysilicon layer 242 is covered with a masking substrate. In the depicted embodiment, the masking substrate comprises a silicon nitride hard mask 244, though, as discussed in the first method above, silicon dioxide, silicon nitride or any other material that is substantially impermeable to ion implantation can be used. Photoresist mask 244 is patterned to expose selected segments of polysilicon layer 242 overlying active regions 232a and 232b that are intended to form interconnect structures. Other portions of polysilicon layer 242 that are intended to be removed are covered by photoresist mask 244.

As shown in FIG. 56, ions are subsequently implanted into the unmasked portions of polysilicon layer 242. The ion implantation operation is represented in FIG. 56 by arrows 246. The ions are of a selected type chosen, as discussed above, in conjunction with an etching process which is selective to implanted silicon-containing material that is to be conducted at a further stage in the twelfth method. In one embodiment, phosphorus ions are implanted. Since one or both of implanted portions 250a and 250b are intended to be later sacrificially etched, there is a flexibility in the selected type of ions that can be implanted, as the sacrificial polysilicon plugs formed thereby are not required to be doped in any specific manner. Accordingly, any suitable type of ions, as discussed above for the first method, can be implanted. In one embodiment, the implanted ions are silicon ions. The ion implantation operation creates heavily implanted portions 250a and 250b in polysilicon layer 242 below opening 222a, and creates relatively unimplanted portions 248 below silicon nitride hard mask 244.

Also, as discussed above, the shape of heavily implanted portions 250a and 250b can be tailored by appropriate selection of the ion implantation parameters as described above for the first and second methods. Ion implantation can be conducted in multiple stages with parameters varied between the stages, and can be conducted with a combination of dopant ions and inert ions as described for the first method above.

Figure 57:
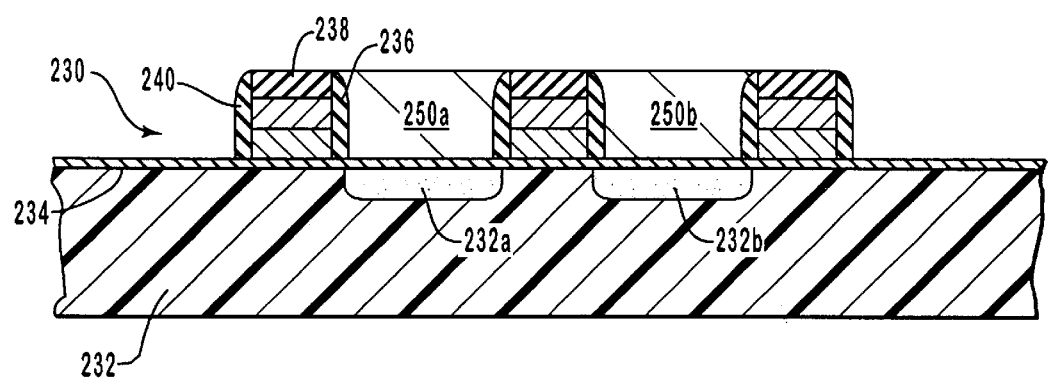
FIG. 57 is a cross-sectional view of the semiconductor wafer of FIG. 56, showing a further procedure of the twelfth method of the present invention in which the insulating layer of FIG. 56 is removed and the polysilicon layer of FIG. 56 is etched with an etching process which is selective to implanted silicon-containing material to obtain a pair of polysilicon plugs.

In subsequent processing illustrated in FIG. 57, polysilicon layer 218 is etched with the etching process which is selective to implanted silicon-containing material as described for the first embodiment above. The etching process is conducted substantially as described for the first method above, with etching parameters that can be appropriately selected to further tailor the profile of the polysilicon interconnect structures being formed. Sacrificial interconnect structures result from the etching process in the form of polysilicon plugs 250a and 250b. Either of polysilicon plugs 250a and 250b can be used as a sacrificial "dummy" plug to be etched away in the process of forming an extended depth self-aligned interconnect structure opening.

Figure 58:
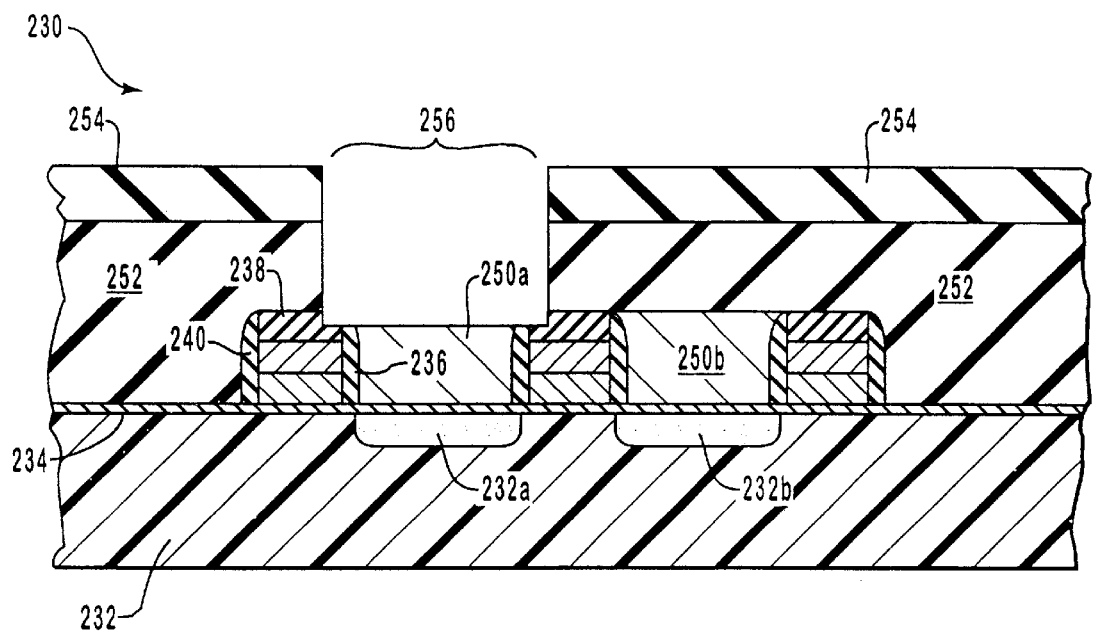
FIG. 58 is a cross-sectional view of the semiconductor wafer of FIG. 57, showing a further procedure of the twelfth method of the present invention in which an insulating layer is formed over the gate regions of FIG. 57 and an opening is etched down to one of the polysilicon plugs of FIG. 58.
Figure 59:
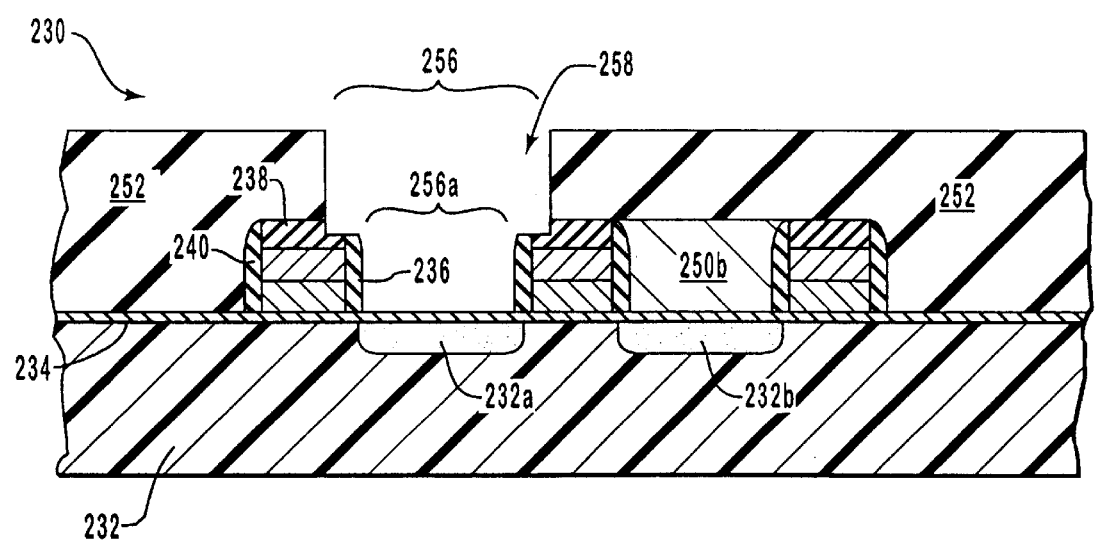
FIG. 59 is a cross-sectional view of the semiconductor wafer of FIG. 58, showing a further procedure of the twelfth method of the present invention in which the polysilicon plug of FIG. 58 is removed to form an extended depth interconnect structure opening.

In order to create an extended depth self-aligned interconnect structure opening, a blanket layer of insulating material is formed over polysilicon plugs 250a and 250b as shown in FIG. 58. In the depicted embodiment, the blanket layer of insulating material comprises a borophosphosilicate glass (BPSG) layer 252 that is deposited and reflowed. BPSG layer 252 is preferably planarized to provide a smooth surface, and has a thickness selected in accordance with a desired depth of the extended depth self-aligned interconnect structure opening.

After forming BPSG layer 252, two separate interconnect structure opening etching procedures are used to form an extended depth interconnect structure opening extending down through BPSG layer 252 to polysilicon plug 250a. A first interconnect structure opening etching procedure is represented in FIG. 58. As shown therein, a conventional photolithography process is used to form a photoresist mask 254 having an opening above polysilicon plug 250a. An etch chemistry that preferably etches BPSG selective to silicon-containing material is then used to etch an interconnect structure opening upper portion 256 into BPSG layer 252. In one embodiment, a dry etching process is initially used to open BPSG layer 252 and is followed by an overetch to remove any remaining BPSG over polysilicon plug 250a. Interconnect structure opening upper portion 256 is preferably formed with a somewhat larger circumference than polysilicon plug 250a, and a dry etching process is selected that does not etch silicon nitride caps 238 of gate regions 236. Accordingly, interconnect structure opening upper portion 256 is self-aligned to gate regions 236. A second interconnect structure opening etching procedure is subsequently used to remove polysilicon plug 250a. The second interconnect structure opening etching procedure preferably etches silicon-containing material selective to silicon nitride and BPSG. One example of a suitable etching chemistry for so doing is a TMAH wet etch. The TMAH wet etch is conducted in a manner similar to that described in the first method above. The TMAH wet etch etches polysilicon which been implanted with ions somewhat slowly, but etches photoresist, silicon nitride, and silicon oxide even slower, thereby allowing polysilicon plug 250a to be etched selective to gate regions 236 and to underlying oxide layer 234. The second interconnect structure opening etching procedure thus removes polysilicon plug 250a to form a self-aligned interconnect structure opening lower portion 256a shown in FIG. 59. Together, interconnect structure opening upper portion 256 and self-aligned interconnect structure opening lower portion 256a form an extended depth self-aligned interconnect structure opening 258 that passes through BPSG layer 252 down to expose a surface on active region 232. The extended depth interconnect structure opening is formed with a high aspect ratio, preferably at least about 2 to 1.

A conductive material such as aluminum can be deposited into the extended depth interconnect structure opening to form an interconnect structure. The interconnect structure may also be formed with a refractory metal silicide lining which can cover the entire sidewall of the extended depth interconnect structure opening. An alternate structure for which the extended depth interconnect structure opening is especially useful is an integral stacked capacitor storage node and base. The integral stacked capacitor storage node and base can be integrally formed with a single material deposition and patterning process after the formation of the extended depth interconnect structure opening.

The twelfth method forms an extended depth self-aligned interconnect structure opening having the advantages discussed above involving the etching process which is selective to implanted silicon-containing material of the present invention. These advantages include a simplification of the process flow by eliminating a dry etching process by the use of a "dummy" polysilicon plug. Integrated circuit manufacturing cost is thereby decreased, and yield is increased. In addition, the extended depth self-aligned interconnect structure opening is formed efficiently with a high aspect ratio. The extended depth self-aligned interconnect structure opening can be used to form an integral stacked capacitor storage node and base that provides higher cell capacitance compared with stacked capacitors formed with a separate storage node and interconnect structure serving as the base of the stacked capacitor.

13. Formation of a Container Capacitor Cell Using an in-situ Deposition with the Etching Process which is Selective to Implanted Silicon-containing Material A thirteenth method of the present invention is illustrated in FIGS. 60 through 64. Under the thirteenth method, a storage node of a stacked capacitor is formed that provides a large surface area of the stacked capacitor and that occupies a minimum of surface area on a semiconductor substrate.

Figure 60:
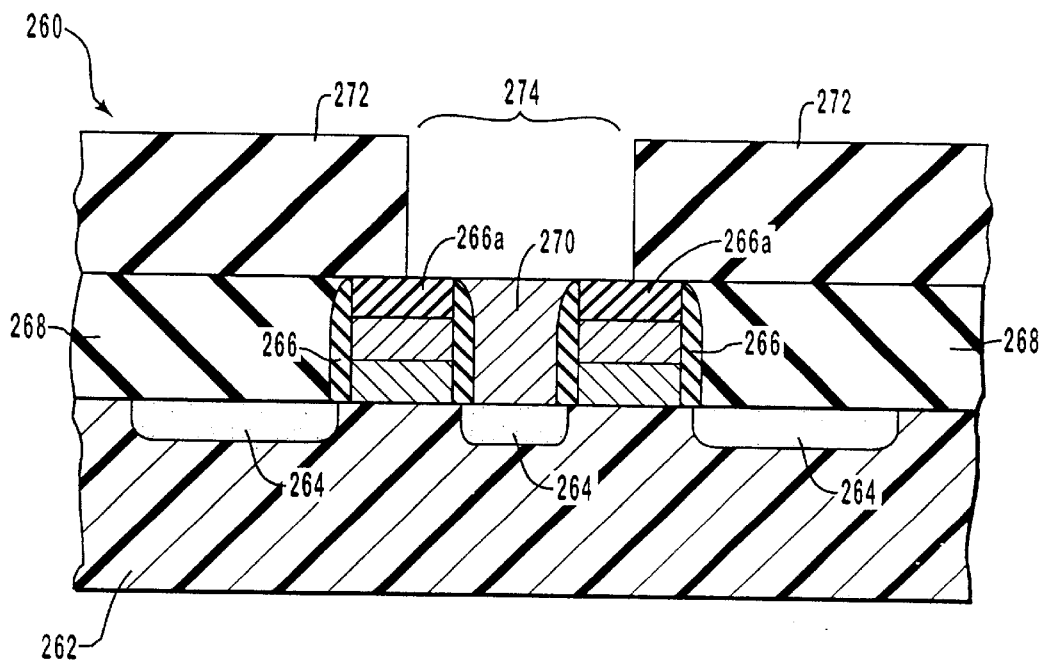
FIG. 60 is a cross-sectional view of a semiconductor wafer showing an initial procedure of a thirteenth method of the present invention in which an opening is formed in an oxide layer located over a polysilicon plug that is situated between two gate regions.

FIG. 60 illustrates an initial structure for use in the thirteenth method. The structure of FIG. 60 can be arrived at by following the eleventh method or equivalents thereof.

Conventional methods can also be followed in obtaining the structure of FIG. 60. In the depicted embodiment, a semiconductor wafer 260 has thereon a silicon substrate 262. Portions of silicon substrate 262 are doped to form active regions 264 as are typically employed as source/drain regions of MOS transistors. A pair of gate regions 266 are, in the depicted embodiment, formed on silicon substrate 262 adjacent active regions 264, and are encapsulated in insulating material. The insulating material includes silicon nitride caps 266a on the tops of gate regions 266. A lower insulating layer 268 is formed over gate regions 266 and is planarized down to the level of the tops of silicon nitride caps 266a. A polysilicon plug 270 is formed in lower insulating layer 268, and in the depicted embodiment is located between two of gate regions 266.

Once lower insulating layer 268 is planarized and polysilicon plug 270 is formed, an upper insulating layer 272 is deposited over lower insulating layer 268. After forming upper insulating layer 272, an opening 274 is formed in upper insulating layer 272. Opening 274 partially overlaps gate regions 266 and exposes the top of polysilicon plug 270. The periphery or edges of opening 274 are situated on the tops of silicon nitride caps 266a, providing for self-alignment of opening 274 in the manner described for the twelfth method. Opening 274 is preferably circular in cross-section, with a horizontal bottom and vertical sidewalls. Opening 274 can also be formed over charge conducting regions other than polysilicon plug 270 and active regions 264.

Figure 61:
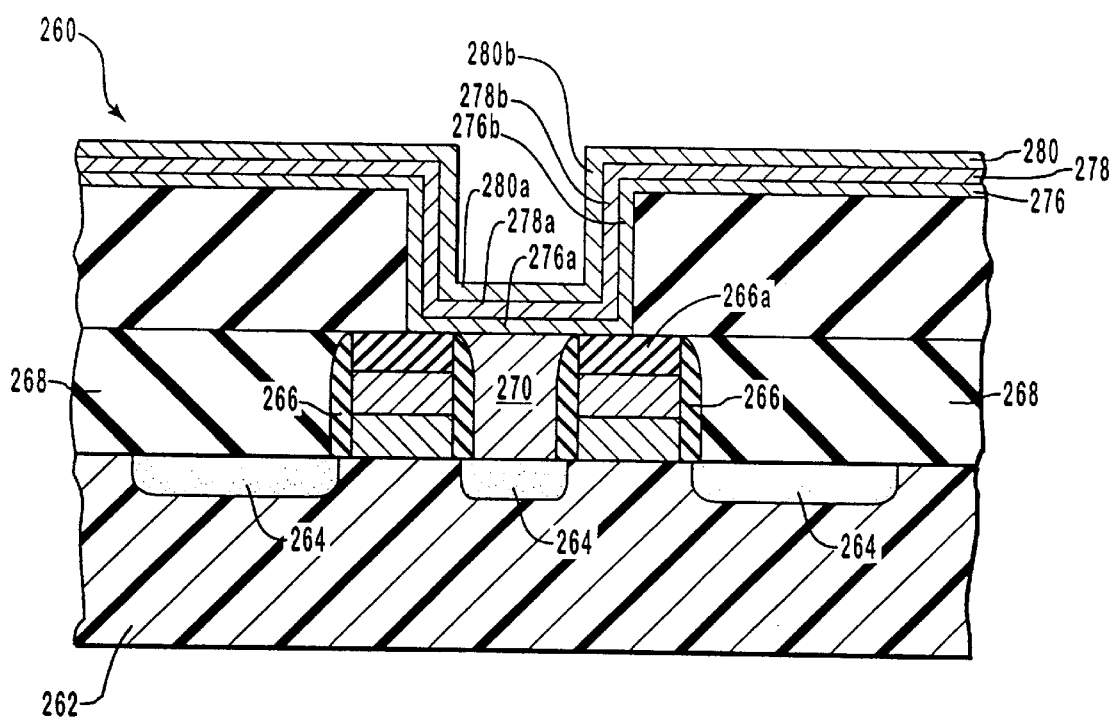
FIG. 61 is a cross-sectional view of the semiconductor wafer of FIG. 60, showing a further procedure of the thirteenth method of the present invention in which three adjacent polysilicon layers are formed in the opening of FIG. 60.

FIG. 61 depicts further processing in accordance with the thirteenth method. As shown in FIG. 61, a layer of silicon containing material such as a lower polysilicon layer 276 is formed in opening 274. Lower silicon-containing layer 276 is formed with a horizontally extending bottom section 276a contacting polysilicon plug 270 in the bottom of opening 274. A side section 276b is formed extending substantially vertically upward from the terminal ends of bottom section 276a and contacts the sidewalls of opening 274. As opening 274 is preferably a continuous circular opening, side section 276b is also preferably continuous and circular.

An intermediate layer of silicon-containing material, such as a polysilicon layer 278, is subsequently formed above and immediately adjacent lower polysilicon layer 276 in opening 274. A horizontally extending bottom section 278a of intermediate polysilicon layer 278 is formed above and immediately adjacent bottom section 276a, and a substantially vertically extending side section 278b is formed immediately adjacent side section 276b extending upward from the terminal ends of bottom section 278a.

A layer of silicon-containing material, such as an upper polysilicon layer 280, is thereafter formed above and immediately adjacent intermediate polysilicon layer 278 in opening 274. A horizontally extending bottom section 280a of upper polysilicon layer 280 is formed above and immediately adjacent bottom section 278a, and a substantially vertically extending side section 280b thereof is formed immediately adjacent side section 278b extending upward from the terminal ends of bottom section 278a.

Lower polysilicon layer 276 and upper polysilicon layer 280 are preferably heavily doped with impurities in order to cause lower polysilicon layer 276 and upper polysilicon layer 280 to be etched at a substantially lower rate than silicon-containing material that is not doped when using an etching process which is selective to implanted silicon-containing material as described for the first method above. The impurities can be of the same type as the ions that are implanted in the first method and can be implanted or intrinsically doped during deposition.

As can be seen in FIG. 61, each of lower polysilicon layer 276, intermediate polysilicon layer 278, and upper polysilicon layer 280 are preferably deposited as blanket layers over the surface of silicon substrate 262. Consequently, a portion of each of lower polysilicon layer 276, intermediate polysilicon layer 278, and upper polysilicon layers 280 is also formed extending parallel to the surface of upper insulating layer 272.

Figure 62:
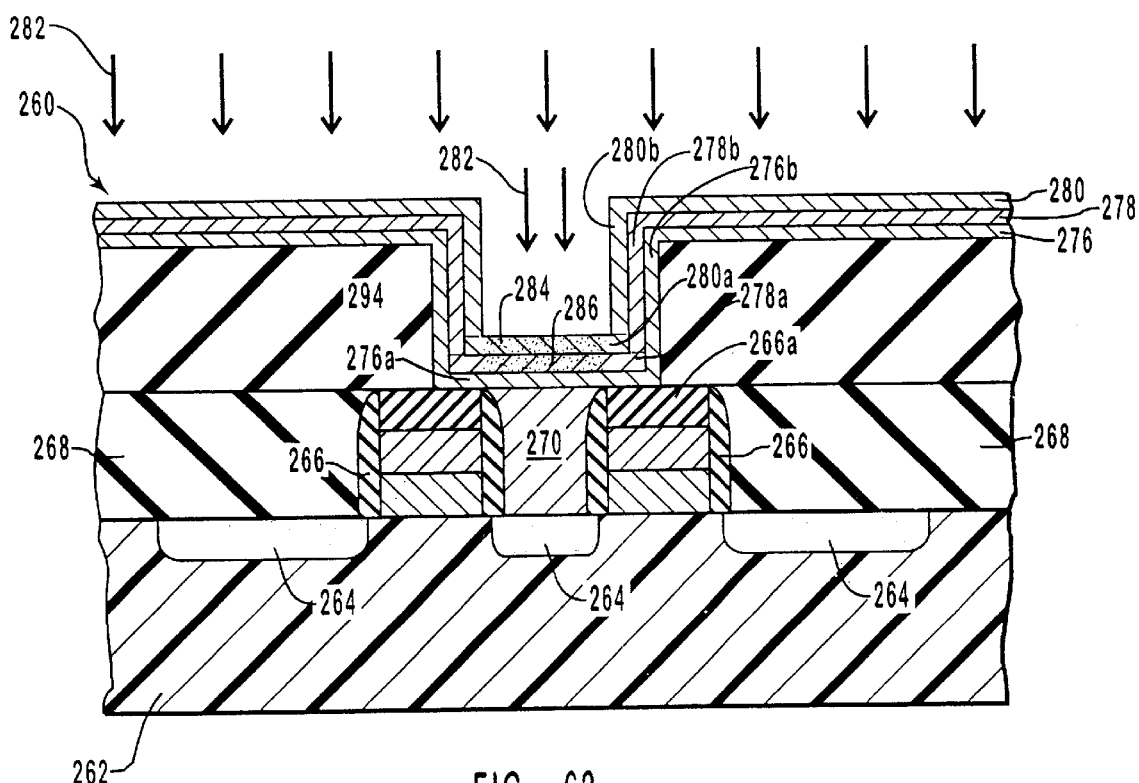
FIG. 62 is a cross-sectional view of the semiconductor wafer of FIG. 61, showing a further procedure of the thirteenth method in which ions are implanted into a central portion of a bottom section of a middle polysilicon layer of the three adjacent polysilicon layers of FIG. 61.

FIG. 62 illustrates further processing according to the thirteenth method. As shown in FIG. 62, once lower polysilicon layer 276, intermediate polysilicon layer 278, and upper polysilicon layer 280 are formed, ions of a selected type, represented by arrows 282, are implanted into opening 274. The selected type of ions to be implanted is determined in accordance with the etching process which is selective to implanted silicon-containing material as discussed in the description of the first embodiment above. The ions of the ion implantation operation are preferably implanted in a direction orthogonal to the plane of semiconductor wafer 260. An implantation energy range is used that is sufficient to implant the ions through bottom section 280a and into the portion of bottom section 278a of intermediate polysilicon layer 278 that is not covered by sidewall sections 280b of upper polysilicon layer 280. Implanted regions 284 and 286 are formed in bottom sections 278a and 280a. Implanted regions 284 and 286 have smaller horizontal areas than that of bottom sections 278a and 280a, respectively.

After the ion implantation operation is conducted, portions of lower polysilicon layer 276, intermediate polysilicon layer 278, and upper polysilicon layer 280 which are located above the uppermost surface of upper insulating layer 272 and which extend above the top of opening 274 are removed with a height reduction process. The height reduction process is preferably conducted in the form of planarization, and more preferably in the form of CMP operation that stops on oxide.

Figure 63:
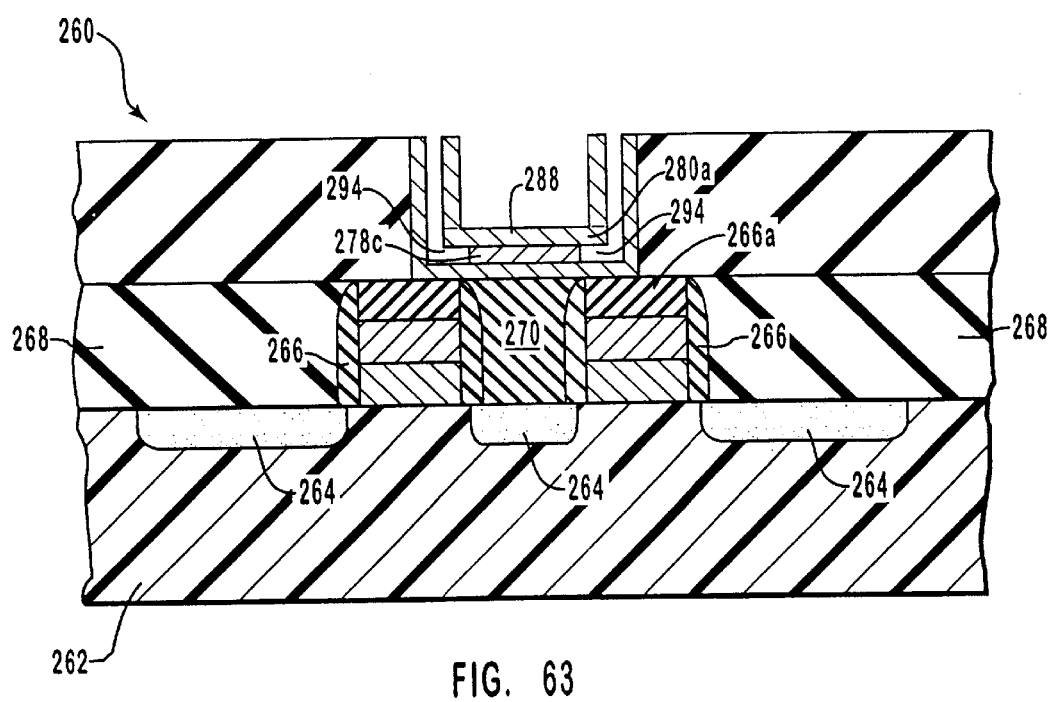
FIG. 63 is a cross-sectional view of the semiconductor wafer of FIG. 61, showing a further procedure of the thirteenth method in which an etching process which is selective to implanted silicon-containing material is conducted to remove relatively unimplanted portions of the middle polysilicon layer of FIG. 62.

Further processing in the thirteenth method is shown in FIG. 63. An etching process which is selective to implanted silicon-containing material is conducted. The etching process is conducted in substantially the same manner as is described for the first method above. Because portions of lower polysilicon layer 276 and upper polysilicon layer 280 are doped with impurities that cause the etching process which is selective to implanted silicon-containing material to etch slowly, such portions of lower polysilicon layer 276 and upper polysilicon layer 280 are not substantially etched by the selective etching process. Implanted regions 284 and 286 is also not etched, while the portions of intermediate polysilicon layer 278 that were not implanted are substantially removed by the etching process which is selective to implanted silicon-containing material. In further processing, upper insulating layer 272 is removed with a still further etching process that is selective to polysilicon.

Figure 64:
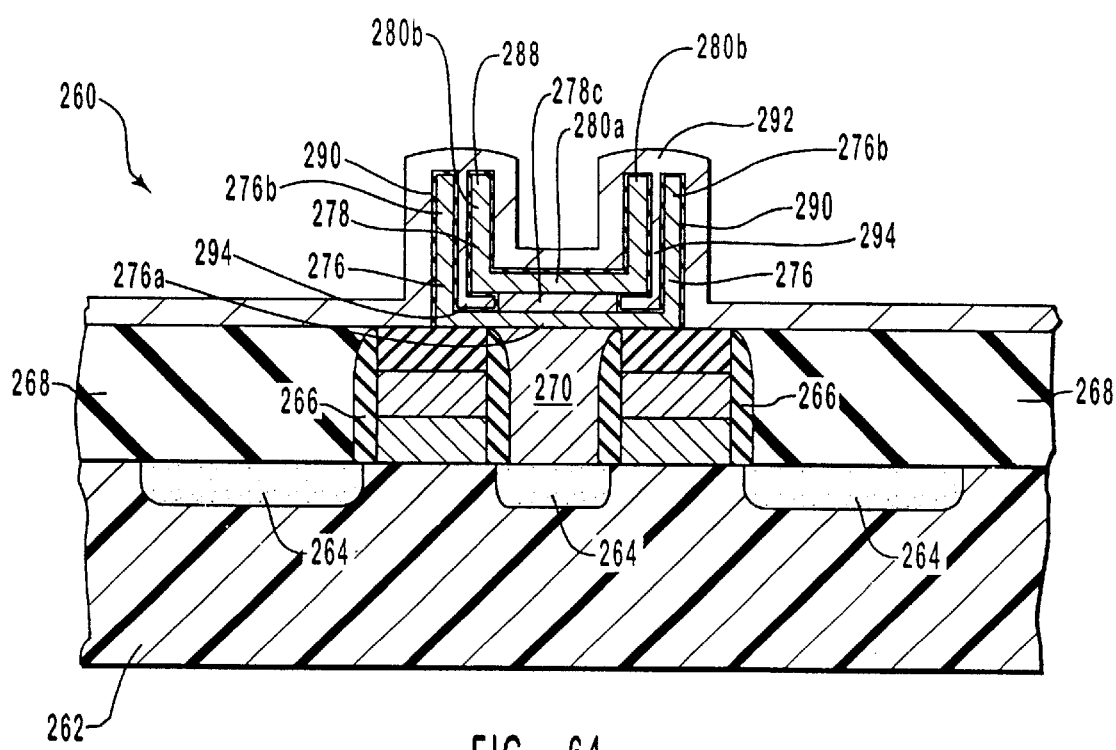
FIG. 64 is a cross-sectional view of the semiconductor wafer of FIG. 63, showing a further procedure of the thirteenth method of the present invention in which a dielectric layer is formed over the finished storage node of FIG. 63 and a top capacitor plate is deposited over the dielectric layer.

From the foregoing, a structure results that is suitable for use as a stacked capacitor storage node. FIG. 64 depicts one such stacked capacitor storage node 288 that comprises lower polysilicon layer 276 which in turn is formed with a horizontally extending bottom section 276a and a substantially vertically extending side section 276b extending upward from bottom section 276a. Intermediate polysilicon layer 278 now has a horizontally extending bottom section 278c that is reduced in surface area and which is situated above and immediately adjacent bottom section 276a of lower polysilicon layer 276. Upper polysilicon layer 280 is situated above and immediately adjacent reduced bottom section 278c of intermediate polysilicon layer 278 and has a horizontally extending bottom section 280a and a substantially vertically extending side section 280b extending upward therefrom. Bottom section 280a of upper polysilicon layer 280 and bottom section 276a of lower polysilicon layer 276 are of a larger surface area than reduced bottom section 278c of intermediate polysilicon layer 278, allowing an open area 294 to be formed between side section 276b and side section 280b that also extends partially between bottom section 276a and bottom section 280a.

The structure of FIG. 64 is advantageous in that it provides a large surface area in a limited horizontal space on silicon substrate 262. The surface area of the structure of FIG. 64 is greater than that which can be formed by conventional methods, due to the reduction in surface area of intermediate polysilicon layer 278 provided by the thirteenth method.

In completing a stacked capacitor using stacked capacitor storage node 288, and as shown in FIG. 64, a thin dielectric layer 290 is formed over the exposed surface of storage node 288. Thereafter, an upper capacitor plate 292 is formed thereon. Upper capacity plate 292 is typically formed by depositing a blanket polysilicon layer over the top of thin dielectric layer 290. Upper capacitor plate 292 can also be formed of materials other than polysilicon.

A stacked capacitor storage node is formed under the thirteenth method with a large surface area and thereby a high charge retention of the stacked capacitor formed therefrom. Miniaturization of the resulting integrated circuit is furthered, as the stacked capacitor node occupies an appreciably smaller space on the semiconductor substrate. The stacked capacitor is also formed in a simple and efficient manner, thereby providing a high yield and a low cost of the integrated circuit manufacturing process.

14. Formation of a Stacked Capacitor Storage Node Having a Sidewall Thickness Determined by an Ion Implantation Angle A fourteenth method of the present invention is illustrated in FIGS. 65 through 68. Under the fourteenth method, a storage node of a stacked capacitor is formed. The storage node is formed in a manner which provides a large surface area and a consequent high charge retention, while consuming minimal space on a semiconductor substrate on which it is formed. The fourteenth method provides flexibility as to the thickness with which a free-standing wall of the storage node is formed, and the free-standing wall can be formed with sub-photolithography resolution dimensions.

Figure 65:
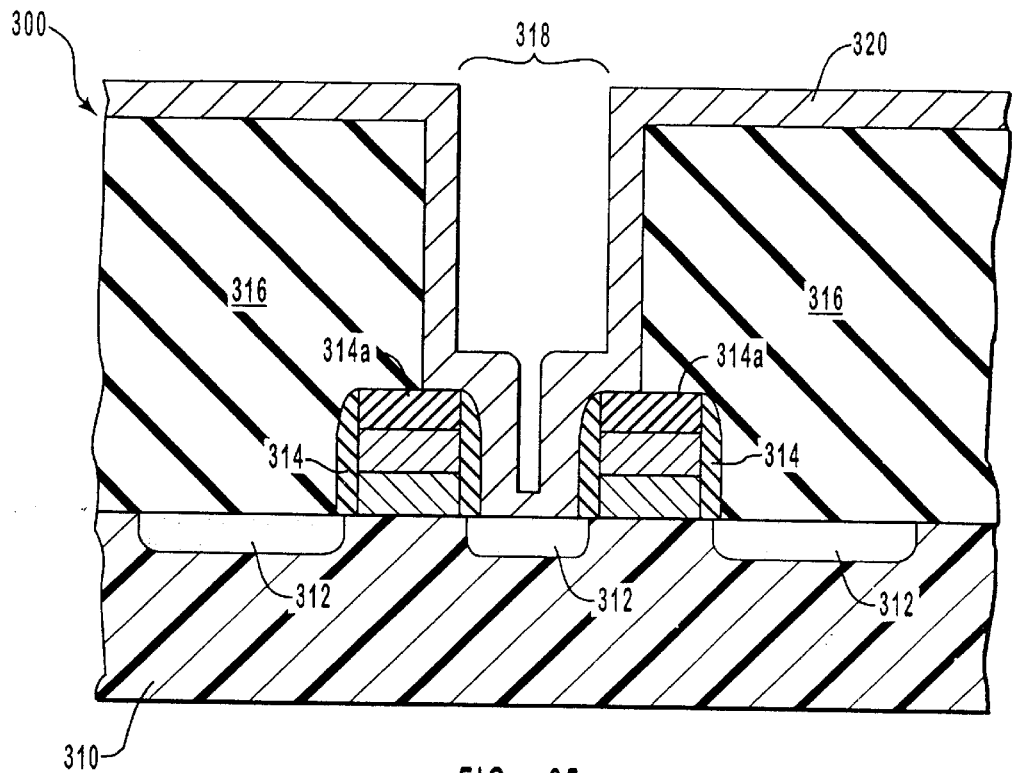
FIG. 65 is a cross-sectional view of a semiconductor wafer showing an initial procedure of a fourteenth method of the present invention in which an opening is formed through an insulating layer down to a junction situated between two gate regions, and in which a polysilicon layer is formed in the opening.

FIG. 65 illustrates a starting structure of the fourteenth method in which a semiconductor substrate is provided. In the depicted embodiment, the semiconductor substrate has the form of a semiconductor wafer 300 having situated thereon a silicon substrate 310. A plurality of active regions 312 are formed in silicon substrate 310, one of which is adjacent to a pair of gate regions 314. A silicon nitride cap 314a is formed on each of gate regions 314.

In a further procedure of the fourteenth method, an insulating layer is formed over silicon substrate 310 and gate regions 314. The insulating layer, in the depicted embodiment, comprises a BPSG layer 316. A planarization process is thereafter conducted to form a planar surface on BPSG layer 316. The planarization process preferably comprises CMP. The height to which BPSG layer 316 is formed and planarized corresponds to the height of the free-standing storage node formed by the fourteenth method and is selected accordingly.

After forming and planarizing BPSG layer 316, an opening 318 is formed in BPSG layer 316. In the depicted embodiment, opening 318 is formed over gate regions 314 and extends down to an active region 312 situated between gate regions 314. Opening 318 is self-aligned to active region 312 by forming opening 318 partially overlapping silicon nitride caps 314a of gate regions 314. Of course, charge conducting regions other than an active region could be located beneath opening 318, and opening 318 could be located elsewhere on a semiconductor substrate as needed. For instance, opening 318 could be connected with a polysilicon plug, which in turn extends down to an underlying charge conducting region 312 or to some other semiconductor device, as needed for the particular application.

After forming opening 318, a polysilicon layer 320 is formed in opening 318, partially filling opening 318. Polysilicon layer 320 preferably is deposited as a blanket layer and is formed of intrinsic polysilicon in the manner discussed for the first method. The thickness of polysilicon layer 320 will determine the amount of open space that will be formed between the free-standing storage node sidewalls and the periphery or edge of opening 318. Generally, a greater thickness of polysilicon layer 320 will result in a greater amount of open space.

Figure 66:
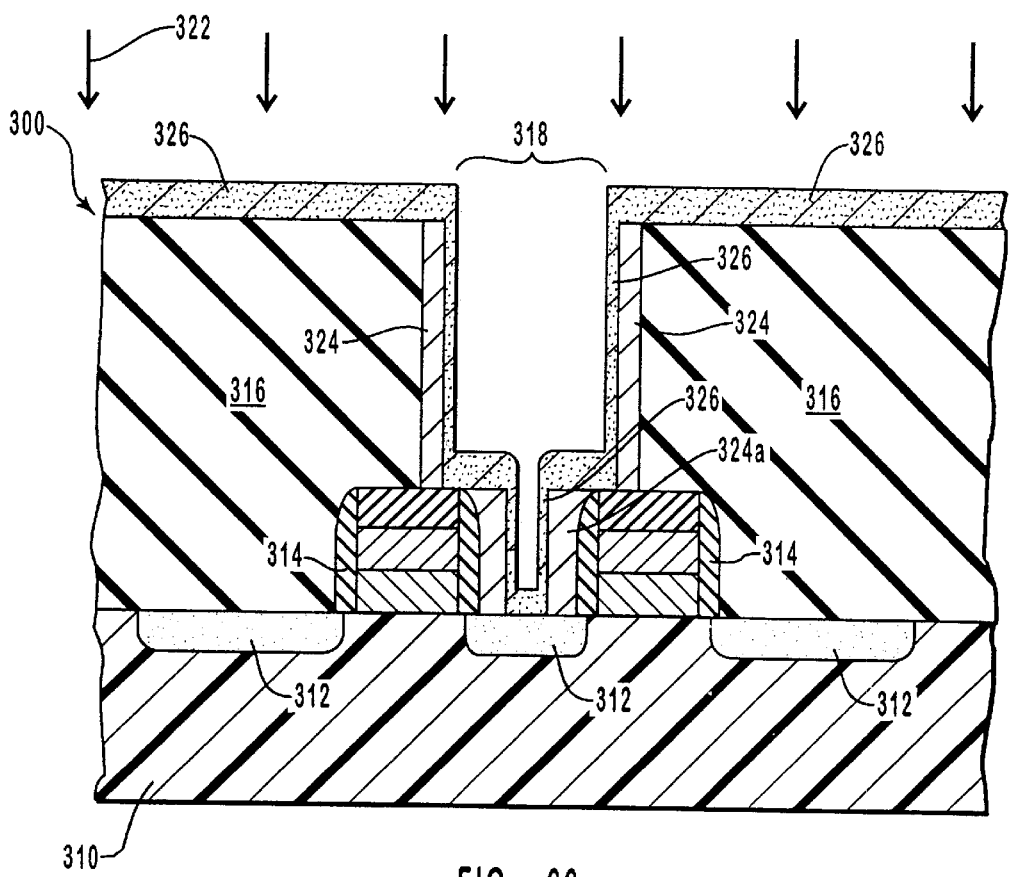
FIG. 66 is a cross-sectional view of the semiconductor wafer of FIG. 65, showing a further procedure of the fourteenth method of the present invention in which ions of a selected type are implanted into the polysilicon layer of FIG. 65 to form an implanted region thereat and leaving an unimplanted region under the implanted region.

Further processing of the fourteenth method is depicted in FIG. 66. As shown therein, ions, represented by arrows 322, are implanted into polysilicon layer 320. The ion implantation operation is conducted in the manner discussed above for the first embodiment, and the type of ions which are implanted is selected as discussed therein, in accordance with an etching process which is selective to implanted silicon-containing material. The ions are implanted with an angle of implantation and an implantation energy selected to result in a desired thickness of a free-standing wall of the resulting storage node. For instance, changes in implantation angle or a implantation energy will result in different portions of polysilicon layer 320 being implanted, and different thickness of the resulting free-standing wall for the storage node. Ion implantation creates an implanted portion 326 and a relatively unimplanted portion 324 of polysilicon layer 320. In the depicted embodiment, implanted portion 326 forms an inner ring around the inside of opening 318, and relatively unimplanted portion 324 forms an outer ring around implanted portion 326.

Figure 67:
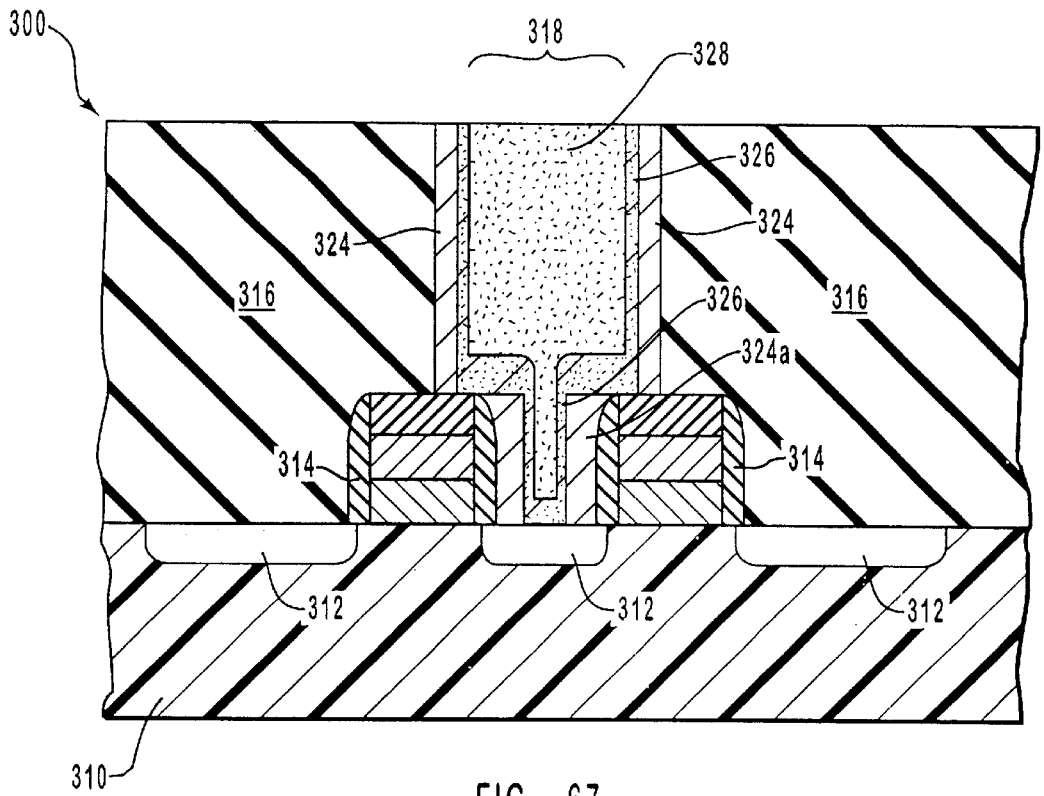
FIG. 67 is a cross-sectional view of the semiconductor wafer of FIG. 66, showing a further procedure of the fourteenth method of the present invention in which the opening of FIG. 66 is filled with photoresist material and in which portions of the polysilicon layer located over the opening are planarized.

As shown in FIG. 67, after the ion implantation operation is conducted, a volume of material, such as photoresist plug 328, is applied and patterned to fill opening 318 in preparation for conducting a planarization process. Photoresist plug 328 preserves the interior of opening 318 from damage during planarization and is preferably deposited using conventional methods. Once photoresist plug 328 is in place, a planarization process such as CMP is conducted to remove portions of polysilicon layer 320 that extend above the surface of BPSG layer 316. Photoresist plug 328 is thereafter removed.

Figure 68:
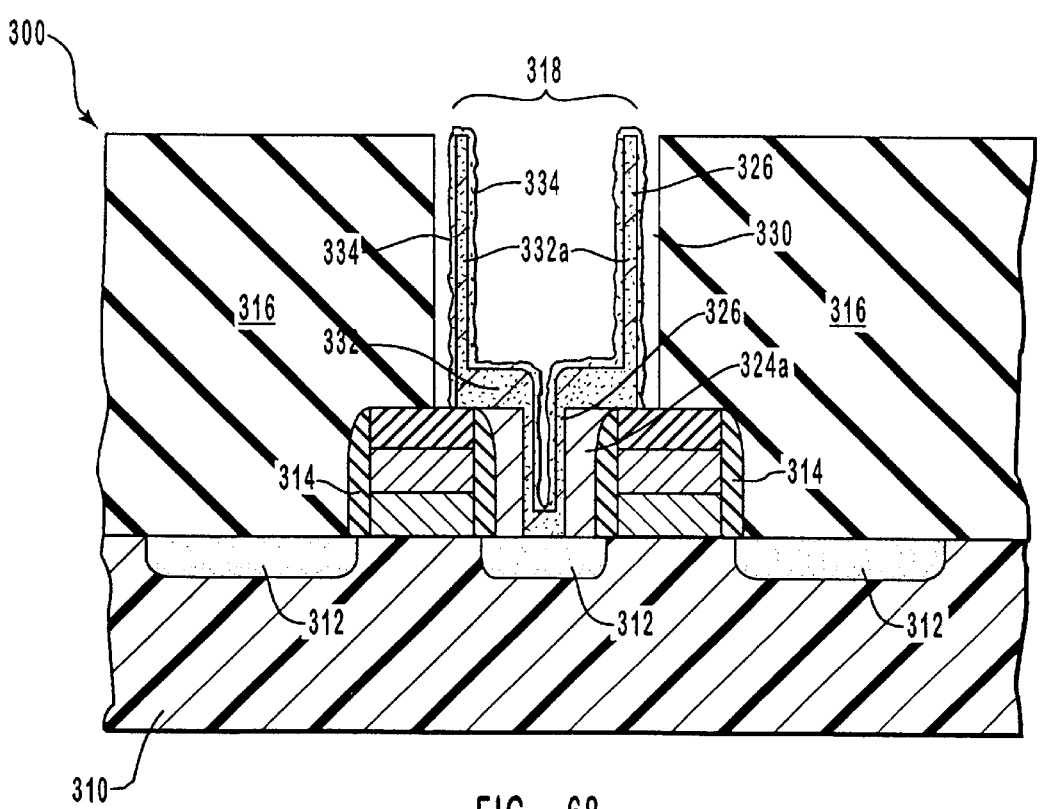
FIG. 68 is a cross-sectional view of the semiconductor wafer of FIG. 66, showing a further procedure of the fourteenth method of the present invention in which an etching process is conducted which is selective to implanted silicon-containing material to remove the unimplanted inner portion of the polysilicon layer and in which HSG polysilicon is deposited on the inner and outer faces of a freestanding wall formed thereby.

As shown in FIG. 68, once planarization is conducted, an etching process which is selective to implanted silicon-containing material as discussed in the first method is conducted. As a result, relatively unimplanted portion 324 is removed, and implanted portion 326 is left remaining to form a free-standing wall 332a. Free-standing wall 332a does not physically contact the edge of opening 318 and is separated from the edge of opening 318 by a predetermined width of open space 330. A dielectric layer and an upper capacitor plate can be deposited in open space 330 without having to remove or re-deposit BPSG layer 316. Thus, free-standing wall 332a is suitable for use as a storage node for a stacked capacitor.

The surface of the stacked capacitor storage node is, under the fourteenth method, roughened in order to increase the surface area thereof. The inner surface of the stacked capacitor storage node can be roughened after removal of photoresist plug 328, while either of both the inner and outer surfaces of polysilicon layer 320 can be roughened after formation of open space 330. Roughening the surface of polysilicon layer 320 results in a greater surface area per square centimeter than a non-roughened surface, thereby increasing charge retention of the completed capacitor. The roughened surface is preferably obtained by depositing a layer of hemispherical grain (HSG) polysilicon or cylindrical grain polysilicon (CSG) on the surface of polysilicon layer 320. The HSG polysilicon or CSG polysilicon layer is preferably deposited selectively with CVD in a manner known in the art. Summarily, this comprises depositing a thin undoped or lightly doped layer of amorphous silicon over polysilicon layer 20 and subsequently applying a high pressure and temperature. The high pressure and temperature result in a nucleation of the amorphous silicon layer into discrete grains.

Once storage node 332 is formed, conventional process flow can be followed to complete a stacked capacitor. Completion of a stacked capacitor typically comprises depositing a thin dielectric layer over storage node 332 and forming an upper capacitor plate thereover, as described in the thirteenth method.

The fourteenth method has several advantages over the stacked capacitors and stacked capacitor formation methods of the prior art. For instance, a stacked capacitor is formed by the fourteenth method that has large surface area due both to the roughened surface area and to the use of both sides of free-standing wall 332a. The large surface area does not come at the expense of occupying a large amount of surface area of the silicon substrate. In addition, these benefits are achieved with a method that is simple, efficient, and with fewer process steps, thereby maintaining a high integrated circuit manufacturing process throughput and a corresponding low cost.

15. Formation of Shaped Polysilicon Structures Using Ion Implantations of Differing Depth Ranges and Using the Etching Process which is Selective to Implanted Silicon-containing Material A fifteenth method of the present invention is illustrated in FIGS. 69 through 77. Under the fifteenth method, shaped structures of polysilicon or other silicon-containing material are formed with a single material deposition and a minimum of masking operations. Several embodiments of the fifteenth method are provided. Each embodiment forms a shaped structure through the implantation of ions. Ions are implanted into a first selected region of a layer of silicon-containing material with a first selected depth range and into a second selected region with a second selected depth range. The second selected depth range extends shallower into the layer of silicon-containing material than the first selected depth range. Thereafter, the etching process is conducted which is selective to implanted silicon-containing material discussed above for the first method. Shaped structures are formed that generally comprise integrally connecting the first and second selected regions.

Figure 69:
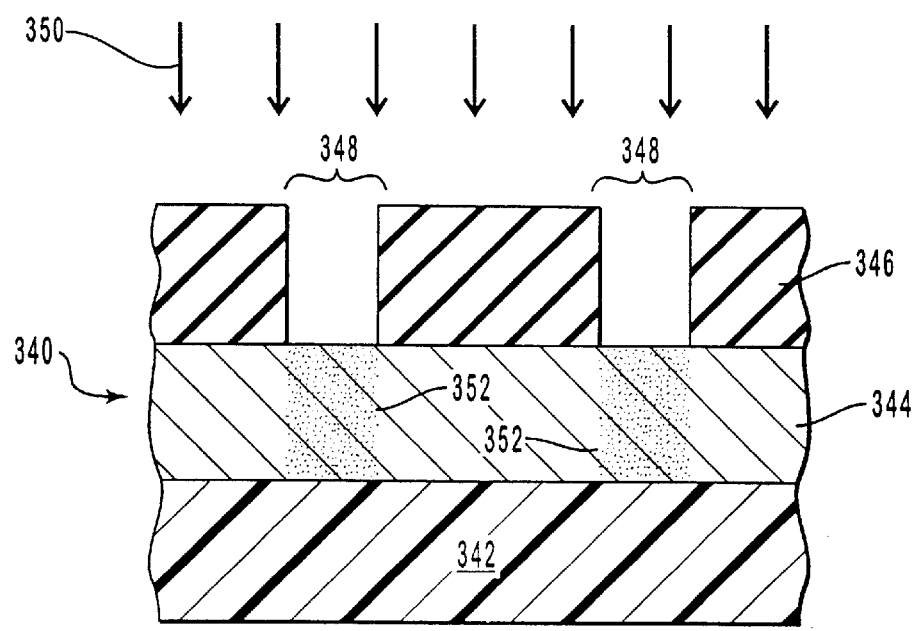
FIG. 69 is a cross-sectional view of a semiconductor wafer showing an initial procedure of one embodiment of a fifteenth method of the present invention in which a photoresist mask is formed over a polysilicon layer and ions are implanted through a first set of openings in the photoresist mask and into the polysilicon layer.

FIG. 69 illustrates an initial structure of a basic embodiment of the fifteenth method, which is used to form a shaped structure in the form of a free-standing polysilicon bridge. Shown in FIG. 69 is a semiconductor substrate having the form of a semiconductor wafer 340 that is formed with a silicon substrate 342. Upon silicon substrate 342 is provided a layer of silicon-containing material comprising, in the depicted embodiment, a polysilicon layer 344. Polysilicon layer 344 preferably comprises intrinsic polysilicon as defined above, and is deposited with a depth dictated by the particular application. Upon polysilicon layer 344 is formed a masking substrate, one example of which is a photoresist mask 346. Photoresist mask 346 is patterned with a pair of openings 348 which may be of any horizontal shape.

After photoresist mask 346 is formed, a first ion implantation operation is conducted in which ions, represented by arrows 350, are implanted through openings 348 into selected regions of polysilicon layer 344. These selected regions, in the depicted embodiment, comprise implanted upright regions 352 and have the form of columns extending upward from silicon substrate 342 to the top most surface of polysilicon layer 344. The ions are of a type selected in accordance with an etching process which is selective to implanted silicon-containing material. The implantation parameters of the first ion implantation operation are selected in the manner discussed above for the first method, such that a first depth range of ion implantation is obtained. The implantation parameters may also be appropriately selected to tailor the shape of implanted upright region 352 as described above for the first method. In the embodiment shown in FIG. 69, the first depth range extends from the top most surface of polysilicon layer 344 to the bottom of polysilicon layer 344. After implanted upright regions 352 are formed, photoresist mask 346 is removed.

Figure 70:
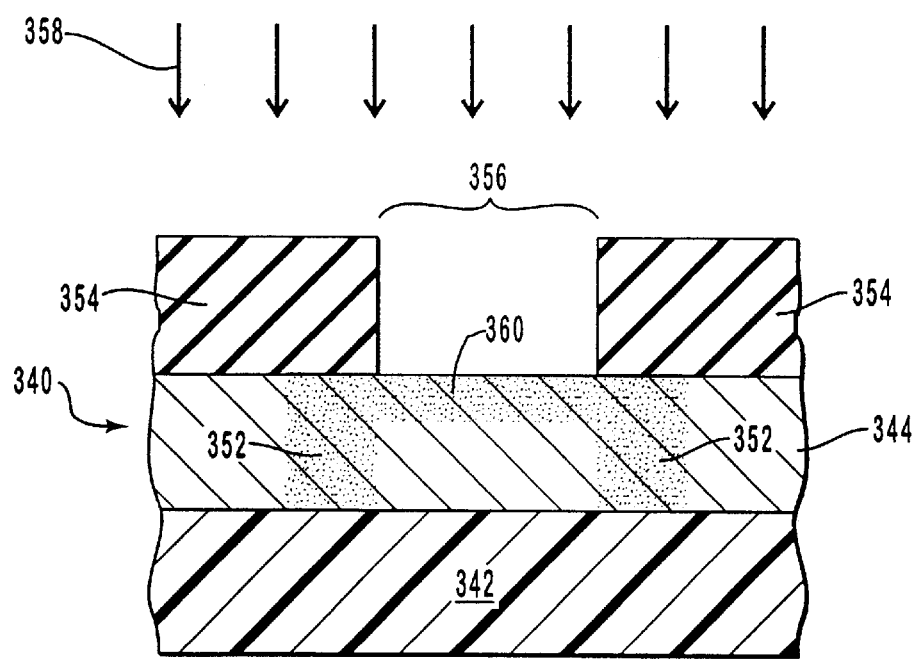
FIG. 70 is a cross-sectional view of the semiconductor wafer of FIG. 69, showing a further procedure of one embodiment of the fifteenth method of the present invention in which a second photoresist mask is formed over the polysilicon layer of FIG. 69 and ions are implanted through a second opening in the photoresist mask and into the polysilicon layer of FIG. 69.

As illustrated in FIG. 70, a second photoresist mask 354 or other suitable masking substrate is subsequently applied for use in a second ion implantation operation. Second photoresist mask 354 is patterned with an opening 356 extending between and above implanted upright regions 352. Opening 356 is, in the depicted embodiment, elongated, and has a width extending in a direction into the page of FIG. 70.

After second photoresist mask 354 is applied, a second ion implantation operation is conducted. The implantation of ions is represented by arrows 358. The ions are preferably of the same type as were implanted in the first ion implantation operation and are selected in the manner discussed above for the first method. The ions could be of a suitable type other than that used in the first ion implantation operation. The second ion implantation operation implanted ion within a second depth range. The second depth range in the depicted embodiment extends from the top most surface of polysilicon layer 344 into and partially through polysilicon layer 344, extending to an intermediate depth therein. The second depth range is preferably achieved using an implantation energy range that is reduced from the implantation energy range used in the first ion implantation operation. Consequently, the second depth range extends shallower into polysilicon layer 344 than the first depth range. The order of implantation of the first and second depth ranges could be reversed, and further ion implantation operations could also be conducted to implant ions to different depth ranges and with different implantation patterns.

The implantations of ions within the second depth range creates an implanted cross-bar region 360 extending between implanted upright regions 352. The second ion implantation operation, as with the first ion implantation operation, can be conducted with ion implantation parameters appropriately selected to tailor the shape of implanted cross-bar region 360 in the manner described above for the first method.

Polysilicon layer 344 is subsequently etched with an etching process which is selective to implanted silicon-containing material. The etching process is conducted substantially in the manner described above for the first method and removes portions of polysilicon layer 344 that are not implanted with ions. Thus, implanted upright regions 352 and implanted cross-bar region 360 remain and are integrally connected after the etching process which is selective to implanted silicon-containing material. Implanted upright regions 352 and implanted cross-bar region 360 together form a shaped structure in the form of a free-standing bridge 362 as shown in FIG. 71. Free-standing bridge 362 is formed with a pair of vertically extending uprights 364 and a crossbar 366 connecting uprights 364.

Free-standing bridge 362 may be covered with a further layer such as a deposited insulative layer and can be used to connect two underlying charge connecting regions such as active regions or vias. Implanted cross-bar region 360, when formed with a selected thickness that can be severed by energy such as a high voltage, can also be used as a programmable fuse. The programmable fuse is useful, for instance, in constructing a programmable memory device such as a programmable read only memory (PROM).

Of course, the combination and order of operations used, as illustrated by way of example in the discussion of FIGS. 69 through 71 to form free-standing bridge 362 can be varied. The basic procedure of FIGS. 64 through 71 can also be used to form other types of shaped structures.

A further embodiment of a shaped structure that can be formed with the fifteenth method of the present invention is depicted in FIG. 72. Shown in FIG. 72 is a lever 364 that is suitable for use as a component of a micromachine as can be employed in small sensors and actuators. Lever 364 is formed in a manner that is similar to the formation of free-standing bridge 362 of the basic embodiment. Thus, in forming lever 368, essentially the same procedure is followed as discussed for the formation of free-standing bridge 362. One exception to the procedure of the first embodiment is that, when forming implanted upright regions 352, only one implanted upright region 352 is formed.

The embodiment of FIG. 72 is given by way of example and is not intended to be limiting. For instance, various other micro-machine parts can also be formed by combining and modifying the aforementioned procedure in a manner that would be apparent to one skilled in the art.

FIG. 73 depicts yet a further embodiment of the fifteenth method of the present invention wherein a multiple cross-bar free-standing bridge 370 is formed. Multiple cross-bar free-standing bridge 370 is useful, for example, for forming an electrically severable fuse having a specified conductivity.

The manner of forming multiple cross-bar free-standing bridge 370 is similar to that of the embodiment of FIGS. 69–71. Thus, a layer of silicon-containing material, which in one embodiment is polysilicon layer 344, is initially formed, and first photoresist mask 346 is then applied and patterned thereon as shown in FIG. 69. Ions, represented in FIG. 69 by arrows 350, are then implanted into polysilicon layer 344 through openings 348 in photoresist mask 346 in a first ion implantation operation. The first ion implantation operation implants ions to a first depth range extending from the surface of polysilicon layer 344 to the bottom of polysilicon layer 344. A pair of implanted upright regions 348 are created by the ion implantation operation.

Also, as shown in FIG. 70, a second photoresist mask 354 is thereafter applied and patterned. Subsequently, ions represented by arrows 358 are implanted with a second ion implantation operation into an opening 356 in photoresist mask 366 located above and between implanted upright regions 352. The ions of the second ion implantation operation are implanted to a second selected depth range that extends from the surface of polysilicon layer 344 partially down into polysilicon layer 344. The second ion implantation operation creates an implanted cross-bar region 360 that is of the selected depth and extends between implanted upright regions 352.

A third ion implantation operation is then conducted to implant ions into polysilicon layer 344 with a third selected depth range. In forming multiple cross-bar free-standing bridge 370, as shown in FIG. 73, the third ion implantation is conducted with a set of ion implantation parameters that are varied from the second ion implantation operation. The ion implantation parameters are varied such that the third depth range has an initial depth that is substantially greater than the lowest depth of the second depth range. The third depth range then has a final depth somewhat greater than the initial depth of the third depth range.

The second and third depth ranges are separated by a selected distance, and are preferably selected such that, after conducting the etching process which is selective to implanted silicon-containing material, a multiple cross-bar free-standing bridge 370 results. As shown, multiple cross-bar free-standing bridge 370 has an upper bridge cross-bar 372 and an underlying bridge cross-bar 374 separated by the selected distance. Further bridge cross-bars could also be formed, and the bridge cross-bars could be of varying thicknesses. The width of overlying and underlying bridge cross-bars 372 and 374 can be tailored without varying the width of opening 356 used during implantation by varying the angle of the implanted ions. Thus, ions of two selected depth ranges could be implanted using the same photoresist mask to form two separate cross-bars, and the width of the two cross-bars could be varied by varying the angles at which the ions are implanted between the ion implantation operations that create each of the second and third depth ranges.

In one embodiment, multiple cross-bar free-standing bridge 370 is used as a fuse in a programmable memory device. In so doing, overlying cross-bar 372 and underlying cross-bar 374 are formed of a thickness that can be severed by applied energy. Additional cross-bars of suitable thicknesses can further be formed. The multiple cross-bars can be used for tailoring the resistivity of the connection between uprights 364. For instance, if greater conductivity is desired, each of first and second cross-bars 372 and 374 are left intact. If a reduced conductivity is desired, one of first and second cross-bars 372, 374 are severed to break the connection with uprights 364. Each of first and second cross-bars 372, 374, and other multiple cross-bars if needed, can be of different thicknesses and corresponding conductivities to further tailor the conductivity of the programmable memory device being formed thereby.

A further embodiment of the fifteenth method is shown in cross section in FIG. 74. Shown therein is a set of overlapping bridges 376. Overlapping bridges 376 are comprised of an overlying bridge cross-bar 378 connected at either end thereof to one of a first set of uprights 364 and a perpendicularly oriented underlying bridge cross-bar 380 connected at either end thereof to one of a second set of uprights 382. Overlapping bridges 376 of FIG. 74 are useful, for example, where semiconductor devices or discrete features of semiconductor devices are to be electrically interconnected in a manner whereby the electrical interconnections must cross over each other without making electrical contact. Under conventional methods, doing so would require numerous material deposition and masking operations, whereas under the method of the present invention, overlapping bridges 376 of FIG. 74 can be formed with a minimum of such material deposition and masking operations.

The formation of overlapping bridges 376 of the fifteenth method of the present invention is similar to the first embodiment of FIGS. 69 through 71. Thus, a polysilicon layer 344 is initially formed, and a first photoresist mask 346 or other masking substrate is then applied and patterned as shown in FIG. 69. Ions, represented by arrows 350, are then implanted with a first ion implantation operation into polysilicon layer 344 through openings 348 in photoresist mask 346. Unlike the embodiment of FIG. 69, however, four implanted upright regions such as implanted upright regions 352 seen in FIG. 70 are created. The four implanted upright regions form a first set of uprights 364 and a second set of uprights 382. Second set of uprights 382 are off-set from first set of upright 364, as shown in FIG. 74, after the etching process is conducted which is selective to implanted silicon-containing material. Subsequently, a second photoresist mask 354 or other masking substrate is applied and patterned with an opening 356 located above and between implanted upright regions 352 as shown in FIG. 70. A second ion implantation operation is then conducted to create an upper implanted cross-bar region similar to implanted cross-bar region 360. The upper implanted cross-bar region preferably has a second depth range that extends from the upper most surface of polysilicon layer 344 to a distance somewhat deeper than the surface of polysilicon layer 344 and forms an overlying bridge cross-bar 378 once the etching process is conducted which is selective to implanted silicon-containing material.

A third photoresist mask is subsequently formed and a third ion implantation operation is then conducted. The third ion implantation operation forms a lower implanted cross-bar region that has a third depth range that is deeper than the second depth range. In so doing, the same procedure is essentially followed as is used for forming the upper implanted cross-bar region. In forming the lower implanted cross-bar region, however, opening 356 is reoriented to form lower implanted cross-bar region in a perpendicular or otherwise cross-wise orientation to the upper implanted cross-bar region. Thereby, once the etching process which is selective to implanted silicon-containing material is conducted, overlying bridge cross-bar 378 will be formed and will cross over without contacting underlying bridge cross-bar 378.

In final processing of the embodiment seen in FIGS. 74a and 74b, the etching process is conducted which is selective to implanted silicon-containing material as discussed above for the first embodiment. The etching process removes portions of polysilicon layer 344 other than overlying bridge cross-bar 378, first set of uprights 376, underlying bridge cross-bar 380 which extend through first set of uprights 364, and second set of uprights 382. The result is overlapping bridges 376 of FIGS. 74a and 74b.

Figure 75:
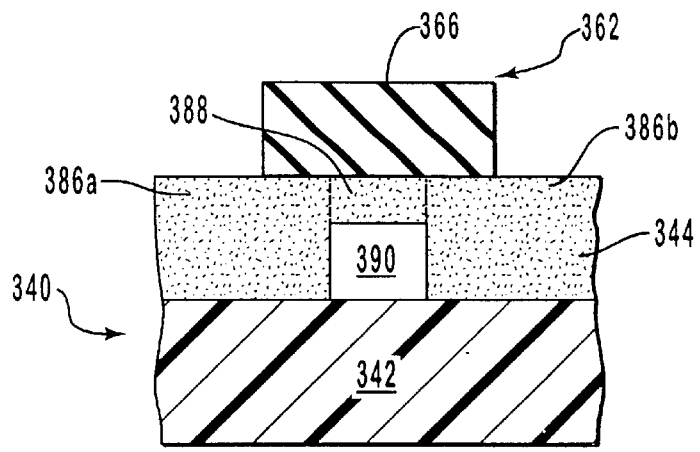
FIG. 75 is a cross-sectional view of a semiconductor wafer showing an initial procedure in a further alternate embodiment of the fifteenth method of the present invention in which a photoresist mask is formed over a polysilicon layer that has been implanted with ions of a selected type in all but a selected region.
Figure 76:
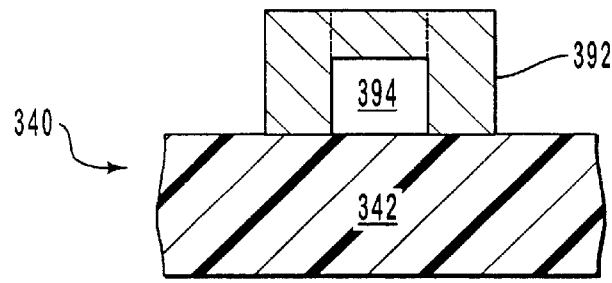
FIG. 76 is a cross-sectional view of the semiconductor wafer of FIG. 70, showing a further procedure of an alternate embodiment of the fifteenth method of the present invention in which a dry etching process is conducted with the use of the photoresist mask to form a block of polysilicon that has an opening extending through the center thereof.

A further embodiment of the fifteenth method is shown in FIGS. 75 and 76. In the embodiment of FIGS. 75 and 76, a dry etching process is incorporated into the basic embodiment of the fifteenth method to create a free-standing block of silicon-containing material with an opening extending through the bottom thereof as shown in FIG. 76. The opening can be later filled with a second material, either an insulator or a conductor. If filled with an insulator, the block of silicon-containing material can serve as a bridge as described for the first embodiment of the fifteenth method. If filled with a conductor, the block of silicon-containing material can be oxidized and converted to an insulator, thereby forming an electrical interconnect with an overlying insulative layer using a minimum of material deposition and masking operations.

In forming the free-standing block of silicon-containing material with an opening extending through the bottom thereof as shown in FIG. 75, a layer of silicon-containing material such as a polysilicon layer 344 is first formed. Thereafter, polysilicon layer 344 is masked as described for FIGS. 69 and 70 above with a first photoresist mask that covers a top region 388 of polysilicon layer 344 located above where an opening 396 is to be formed. A first ion implantation operation is thereafter conducted in the manner discussed for FIGS. 69 and 70. The first ion implantation preferably implants ions into a first side region 386a and a second side region 386b that adjoin the location where the opening in the polysilicon block 392 seen in FIG. 76 is to be formed. The ions of the first ion implantation operation have a first depth range extending from the top most surface of polysilicon layer 344 to the bottom of polysilicon layer 344.

A second ion implantation operation is then conducted substantially in the manner described above for the first method to implant ions into top region 388 of polysilicon layer 344. A second photoresist mask or other masking substrate can be used to define an opening over top region 388, but doing so is not necessary as the ions can be implanted into first and second side regions 386a and 386b as well. The ions of the second ion implantation operation are implanted with a second depth range that extends from the top most surface of polysilicon layer 344 to an intermediate point in polysilicon layer 344 to thereby define a top region 388. In so doing, a relatively unimplanted region 390 is left remaining under top region 388. Preferably, relatively unimplanted region 390 is elongated and extends laterally in a direction facing into the page of FIG. 75.

In an alternative to using a second photoresist mask and ion implantation operation, the first photoresist mask can be left in place for the second ion implantation operation. In such a case, an increased implantation energy is used such that ions are implanted through the first photoresist mask partially into polysilicon layer 344 to implant top region 388.

Once top region 388 is implanted, a photoresist mask 366 or other suitable masking substrate is applied over polysilicon layer 344. An anisotropic etching process, preferably a dry etching process such as RIE, is then conducted to form polysilicon block 392 shown in FIG. 76. Thereafter, an etching process is conducted which is selective to implanted silicon-containing material as described above for the first embodiment. Opening 394 is thereby formed and extends through polysilicon block 392 as illustrated. Of course, polysilicon block 392 could be of any size, shape or dimension, and opening 394 extending therethrough could also be of any size, shape, or dimension. It is preferred that opening 394 extend completely through polysilicon block 392, but applications are contemplated wherein opening 394 does not extend completely through polysilicon block 392, such as where an electrical interconnect is being formed that is to be surrounded on more than two sides by insulating material.

As discussed, opening 394 is in one embodiment filled with an insulating material to form a bridge. In an alternative embodiment, opening 394 is filled with a conducting material, by, for instance, the process of aluminum reflow. In this alternative embodiment, polysilicon block 392 is preferably converted thereafter to an insulating material by oxidation of the polysilicon thereof. A line of conducting material is thereby produced that is surrounded on two or three sides by insulating material. Under this embodiment, opening 394 is formed extending into the page of FIG. 76 in an elongated fashion and the conducting material filling opening 394 is then used as an interconnect line electrically connecting semiconductor devices or discrete features of semiconductor devices. As with the first method, the interconnect line can be of sub-photolithographic resolution dimensions.

Multiple openings such as opening 394 can be concurrently formed in polysilicon block 392. Also, opening 394 or the multiple of such openings can be tailored in height, width, and shape by appropriate selection of the ion implantation parameters in the manner discussed above for the first method.

Figure 77:
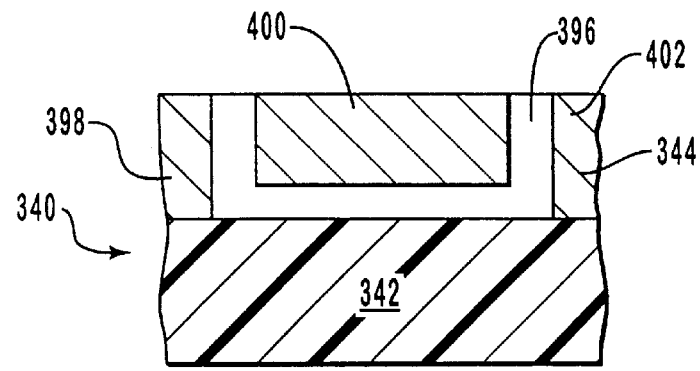
FIG. 77 is a cross-sectional view of a semiconductor wafer showing a tunnel formed by a further alternate embodiment of the fifteenth method of the present invention.

A further embodiment of the fifteen method is shown in FIG. 77. FIG. 77 shows a tunnel 396 extending through polysilicon layer 344. Tunnel 396 can be, for example, filled with an electrically conductive material. In such a case, it is preferred that polysilicon layer 344 be converted to an insulating material as was discussed with respect to FIG. 76. Filling tunnel 396 with conducting material and surrounding tunnel 396 with insulating material would allow tunnel 396 to be employed as an electrical interconnect between semiconductor devices or portions of semiconductor devices. Tunnel 396 can be formed with a minimum of masking and material deposition operations, as described above with the implementation and etch selective processes detailed herein.

In forming tunnel 396 of FIG. 77, ion implantation is conducted in a similar manner to the ion implantation operations of FIGS. 69 and 70. Unlike the ion implantation operation of FIGS. 69 and 70, however, a masking substrate such as photoresist mask 346 of FIG. 69 is used that leaves openings over a first side region 398 and second side region 402 adjoining at either end the area where tunnel 396 is to be formed. Ions of a type selected in accordance with the etching process which is selective to implanted silicon-containing material of the first method are then implanted into the entirety of first and second side regions 398 and 402. A second photoresist mask, or other masking substrate, is then formed leaving an opening over a top region 400 situated above the location where a bottom portion of tunnel 396 is to be formed.

Ions are then implanted with a second ion implantation operation into top region 400. In the second ion implantation operation, the ions are implanted with a selected depth range of less depth than the depth range of the first ion implantation operation, such that the implanted ions penetrate only partially into polysilicon layer 344 to implant top region 400 and not the location where a bottom portion of tunnel 396 is to be formed.

Thereafter, an etching process is conducted which is selective to implanted silicon-containing material as discussed above for the first embodiment. Implanted portions of polysilicon layer 344, including first and second side regions 398 and 402 as well as top region 400, are left remaining, while polysilicon is removed from tunnel 396, to produce the structure shown in FIG. 77.

The structures produced by the fifteenth method of the present invention are generally constructed with fewer material deposition and masking operations than can be achieved without the use of the fifteenth method of the present invention. Accordingly, the shaped structure can be formed efficiently, while maintaining a high throughput and a low cost of the integrated circuit manufacturing process.

16. Formation of a Bottle-shaped Trench with the Etching Process which is Selective to Implanted Silicon-containing Material A sixteenth method of the present invention is depicted in FIGS. 78 through 81. The sixteenth method is used to form a bottle-shaped trench that is useful for forming a trench capacitor or trench isolation region. The bottle-shaped trench of the sixteenth method is wider at the bottom thereof than at the top thereof. Thus, the bottle-shaped trench facilitates dense packing of semiconductor devices on the semiconductor substrate.

Figure 78:
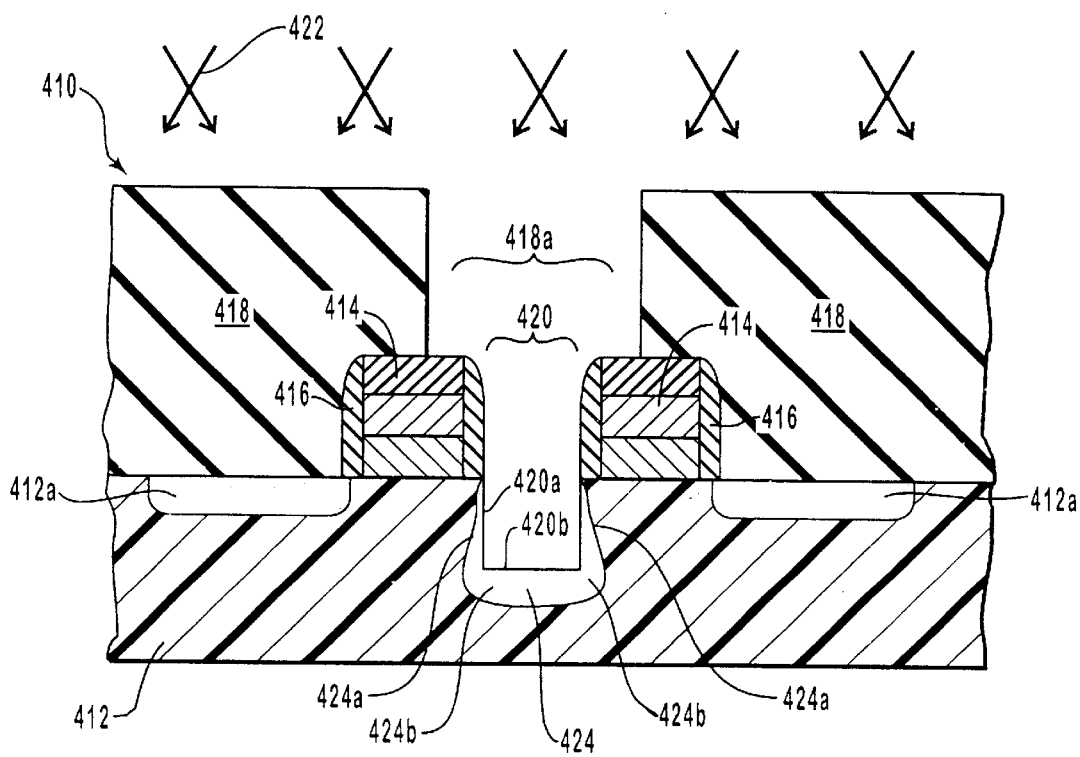
FIG. 78 is a cross-sectional view of a semiconductor wafer showing an initial procedure of a first embodiment of a sixteenth method of the present invention in which ions are implanted through a photoresist mask into sidewalls of a trench disposed between two gate regions.

FIG. 78 shows the initial structure in forming the bottle-shaped trench. In the embodiment depicted in FIGS. 78 and 79, a bottle-shaped trench is being formed between transistors in a CMOS circuit on a semiconductor substrate comprising a silicon substrate of a semiconductor wafer. Nevertheless, one skilled in the art will readily appreciate that the bottle-shaped trench formed by the sixteenth method could be formed within any volume of silicon and on any type of semiconductor substrate.

The initial procedure in forming the structure of FIG. 78 comprises providing a volume of silicon-containing material. In the depicted embodiment, the volume of silicon-containing material comprises a semiconductor wafer 410 which is formed on a silicon substrate 412. A pair of gate regions 414 are also formed on silicon substrate 412. Gate regions 414 are encased in insulating spacers 416. Active regions 412a are also formed in silicon substrate 412 adjacent gate regions 414. In subsequent processing, a masking substrate in the form of a photoresist mask 418 is formed over silicon substrate 12 and over gate regions 414. A trench 420 is then anisotropically etched into silicon substrate 412 through an opening 418a in photoresist mask 418. Trench 420 is preferably formed with substantially anisotropic sidewalls.

Of course, gate regions 414 and active regions 412a need not be formed prior to trench formation and could be formed at any suitable stage in the integrated circuit manufacturing process, including after the bottle-shaped trench is formed and filled to form a trench isolation region or trench capacitor.

Subsequently, in the sixteenth method, ions of a selected type, represented by arrows 422, are implanted into a sidewall 420a and a bottom 420b of anisotropic trench 420. The ions are of a selected type determined in accordance with an etching process which is selective to unimplanted silicon-containing material as described above in the discussion of the second method. The ion implantation operation is preferably conducted to implant ions at an angle other than orthogonal to silicon substrate 412. Thus, the ions are implanted with an angulated trajectory that causes the ions to be implanted into corners of trench 420.

An implanted region 424 is formed with a thin top implanted portion 424a at the top of trench 420 and a thicker bottom implanted portion 424b at the bottom of trench 420. The angle of implantation is preferably selected to implant as great an amount of ions into the corners of trench 420 as is possible. Other implantation parameters can also be selected to tailor the dimensions of top implanted portion 424a and bottom implanted portion 424b in the manner described above in the discussion of the first and second methods. For instance, the ion implantation operation could be conducted in multiple implantation stages with the angle of the ion implantation being varied between the multiple implantation stages.

Figure 79:
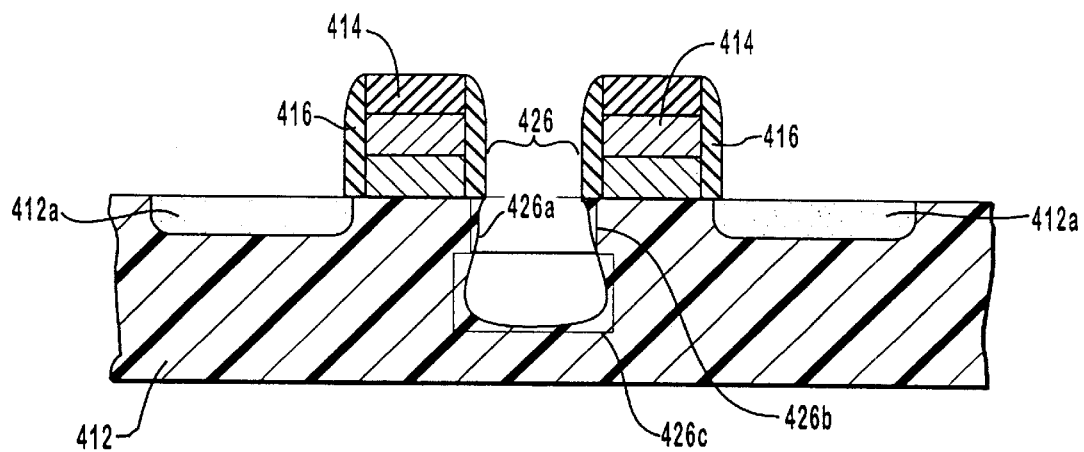
FIG. 79 is a cross-sectional view of the semiconductor wafer of FIG. 78, showing a further procedure of the first embodiment of the sixteenth method of the present invention in which an etching process which is selective to unimplanted silicon-containing material is conducted to remove relatively unimplanted portions of the sidewalls in the trench of FIG. 78.

In further processing of the sixteenth method, the implanted portions of the sidewalls and bottom of trench 420 are etched with an etching process which is selective to unimplanted silicon-containing material. The etching process is conducted substantially in the manner described in the description of the second method above. The results are a bottle-shaped trench 426 as shown in FIG. 79. Bottle shaped trench 426 is formed with a continuous sidewall 426a that extends vertically downward into silicon substrate 412. Sidewall 426a of bottle shaped trench 426 has an upper neck portion 426b that is relatively narrow, and a bulbous bottom portion 426c that is wider than upper neck portion 426b.

Figure 80:
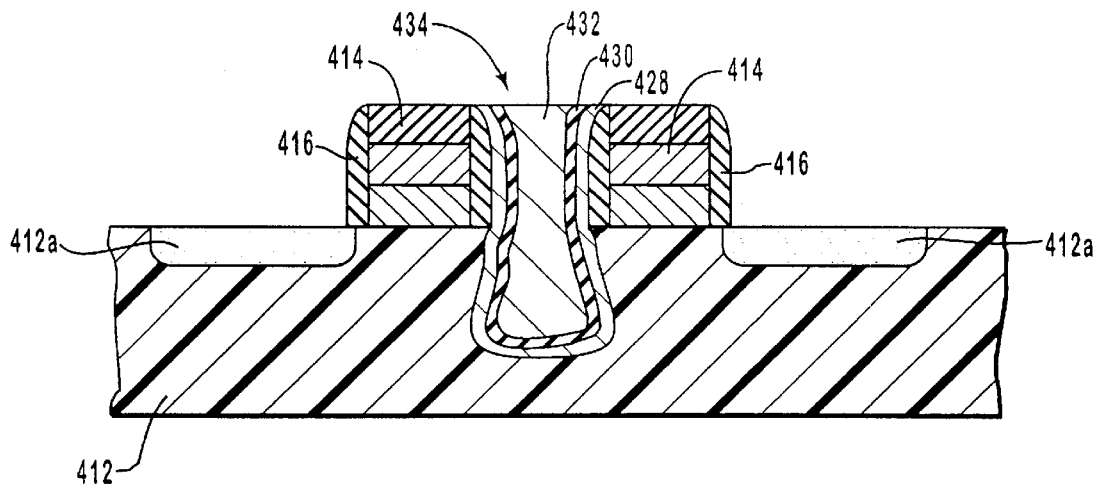
FIG. 80 is a cross-sectional view of the semiconductor wafer of FIG. 79, showing a further procedure of the first embodiment of the sixteenth method of the present invention in which a capacitor storage node, dielectric layer, and upper plate are deposited in the trench of FIG. 79 to form a trench capacitor.

FIG. 80 shows one application of bottle-shaped trench 426, wherein a CMOS DRAM memory cell is being constructed that is to be associated with a trench capacitor 434 that is to be formed. In forming trench capacitor 434, a storage node layer 428 is first formed within bottle-shaped trench 426. In the depicted embodiment, storage node layer 428 comprises a polysilicon layer deposited by chemical vapor deposition (CVD). Thereafter, a dielectric layer 430 is formed over storage node layer 428 in bottle-shaped trench 426, preferably as a grown oxide layer. Once dielectric layer 430 is formed, an upper capacitor plate 432 is deposited over dielectric layer 430. Upper capacitor plate 432 is also preferably formed from polysilicon with a CVD process. Storage node layer 428 is thereafter electrically connected to one of transistors 414 in any suitable manner, and upper capacitor plate 432 is electrically connected to a word line in any suitable manner.

Trench capacitor 434 is formed with a greater surface area than it would otherwise have, due to the shape of bottle-shaped trench 426 that is wider at the bottom thereof than at the top thereof. The shape of bottle-shaped trench 426 allows for denser packing of semiconductor devices on semiconductor wafer 410 due to the minimal surface space of silicon substrate 412 that is occupied. Trench capacitor 434 also has a high capacitance due to the large surface area with which bottle-shaped trench 426 is formed.

Figure 81:
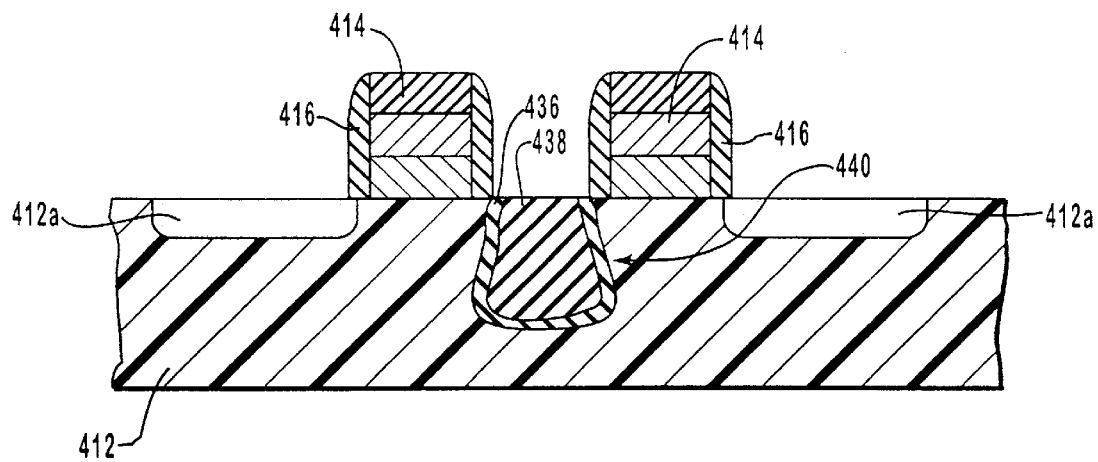
FIG. 81 is a cross-sectional view of the semiconductor wafer of FIG. 79, showing a procedure of a second embodiment of the sixteenth method of the present invention in which an insulating layer is grown and in which an oxide filler material is deposited into the trench to form a trench isolation region.

Bottle-shaped trench 426 is useful for formation of an improved trench isolation region 440 as shown in FIG. 81. In forming trench isolation region 440, a volume of insulating material is formed within a bottle-shaped trench. In one embodiment, the volume of insulating material comprises a thermal oxide layer 436 that is grown on the sidewalls and bottom of the bottle-shaped trench. Also, an oxide filler layer 438 is deposited within the remainder of the bottle-shaped trench. Oxide filler layer 438 is preferably deposited with a TEOS process. Resulting trench isolation region 440 occupies a minimum of surface area of silicon substrate 412 and accordingly facilitates a dense packing of semiconductor devices thereon. A large surface area and an extended depth are also provided, resulting in a high resistance to cross-talk current leakage between transistors located on either side thereof.

17. Formation of Silicon-containing Material A on Horizontal Surface with the Etching Process which is Selective to Implanted Silicon-containing Material A seventeenth method of the present invention is illustrated in FIGS. 82 through 86. The seventeenth method is used to form silicon-containing material on substantially horizontal surfaces at the top and to the sides of a protruding structure. Silicon-containing material, under the seventeenth method, is not formed on substantially vertical surfaces or at the bottom of substantially vertical surfaces. Several applications for the use of the shaped structure formed thereby are also described herein, including an application for use in increasing the conductivity of existing interconnect structures, an application for use in forming new interconnect structures, and an application for use as an implant mask for a halo implant to provide punch-through protection.

Figure 82:
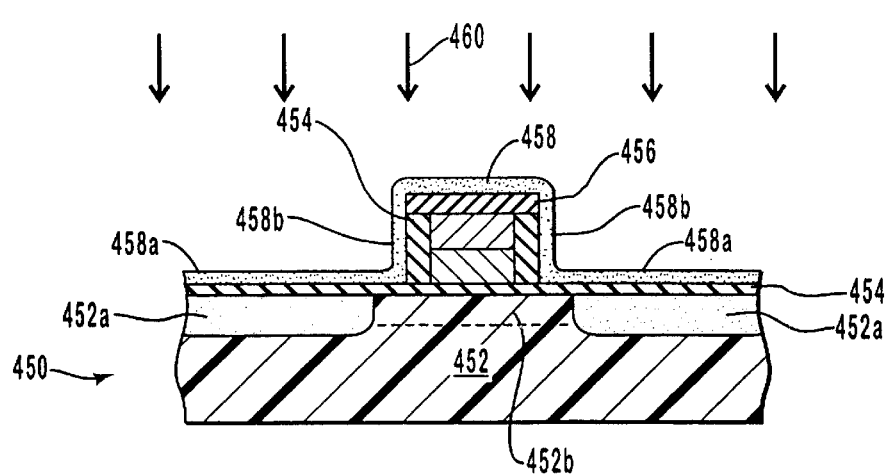
FIG. 82 is a cross-sectional view of a semiconductor wafer showing an initial procedure in a first embodiment of a seventeenth method of the present invention in which a polysilicon layer is formed over a gate region and in which ions of a selected type are implanted into horizontal surfaces of the polysilicon layer.

FIG. 82 shows an initial structure for the seventeenth method. Under the seventeenth method, a semiconductor substrate, such as a semiconductor wafer 450, is initially provided. In the depicted embodiment, semiconductor wafer 450 is used in forming a CMOS integrated circuit and has provided thereon two N+doped source/drain regions 452a and an intervening lightly P-doped channel region 452b. Vertically extending surfaces and horizontally extending surfaces are provided on semiconductor wafer 450 in the form of a protruding structure. The protruding structure in the embodiment of FIG. 82 comprises a gate region 454 which is located above lightly P-doped channel region 452b, and which has formed thereon a nitride spacer 456. Both gate region 454 and nitride spacer 456 are formed in a conventional manner. A gate oxide layer 454 is, in the depicted embodiment, formed under gate region 454. Gate region 454 can be elongated, such that it protrudes in a direction looking into the page of FIG. 82, as for instance, when gate region 454 comprises a word line of a DRAM memory circuit.

Under the seventeenth method, a volume of silicon-containing material is formed over the protruding structure. Thus, in the depicted embodiment of FIG. 82, a polysilicon layer 458 is formed over gate region 454 and nitride spacer 456. Polysilicon layer 458 is preferably formed of intrinsic polysilicon and can be formed in any suitable manner.

Once polysilicon layer 458 is formed, an ion implantation operation is conducted, represented in FIG. 82 by arrows 460, to implant ions into horizontal surfaces 458a of polysilicon layer 458. The implanted ions are of a selected type chosen in accordance with an etching process which is selective to implanted silicon-containing material, as discussed above for the first method. The ions are preferably implanted with an angle of implantation that is substantially orthogonal to horizontal surfaces 458a.

Figure 83:
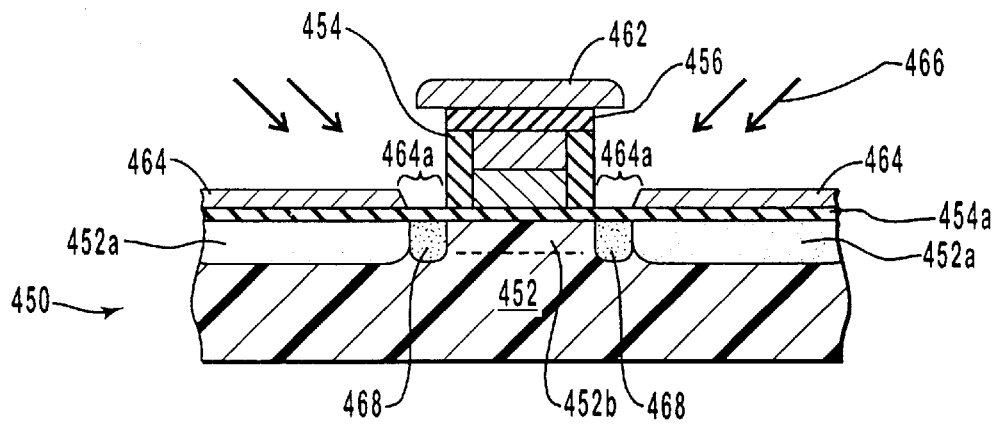
FIG. 83 is a cross-sectional view of the semiconductor wafer of FIG. 82, showing a further procedure of the first embodiment of the seventeenth method in which an etching process which is selective to implanted silicon-containing material is conducted to remove implanted portions of the polysilicon layer and in which the polysilicon layer is used as a mask for a halo implantation operation.

After conducting the ion implantation operation, the etching process which is selective to implanted silicon-containing material is conducted in a manner substantially in accordance with the discussion of the first method above. The results of the etching process are shown in FIG. 83. As shown therein, all substantially vertical segments 458b of polysilicon layer 458 have been moved, and all substantially horizontal segments 464 of polysilicon layer 458 remain. A top polysilicon region 462 is situated over gate region 454 and nitride spacer 456. A pair of side polysilicon regions 464 also remain at the sides of gate region 454 and are separated from gate region 454 by a pair of openings 464a having a width corresponding approximately to the width of top polysilicon region 462.

As discussed above, the structure created by the present invention has several applications. One application is shown in FIG. 83. Shown in FIG. 83 is a MOS transistor having a gate region 454, two N+ doped source/drain regions 468 located at the sides of gate region 454, and a lightly P-doped channel region 452b of silicon substrate 452 located between N+ doped source/drain regions 452a. One problem with related conventional structures is that, even when gate region 454 does not have an applied voltage so as to turn on the transistor, charge leakage, known as punch-through, can occur from N+ doped source/drain regions 452a across lightly P-doped region 452b. One manner of preventing punch-through is to form small, highly doped P+ regions 468 within lightly P-doped region 452b at the edges of N+doped source/drain regions 452a. The seventeenth method provides a convenient manner of forming an implant mask in the form of top polysilicon region 462 and side polysilicon regions 464 that define suitable openings 464a at the sides of gate regions 454 for implanting P-type dopants to form highly doped P+ regions 468.

Thus, once top polysilicon region 462 and side polysilicon regions 464 together with openings 464a are formed as described, implantation of P-type dopants, represented by arrows 466, is conducted to form highly doped P+ regions 468, which serve to prevent punch-through as described.

Figure 84:
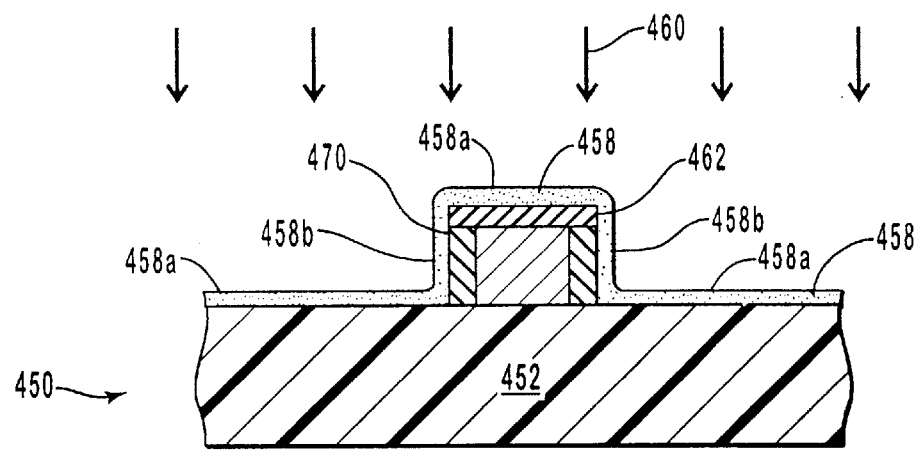
FIG. 84 is a cross-sectional view of a semiconductor wafer showing a procedure in a second embodiment of the seventeenth method of the present invention in which a polysilicon layer is formed over an aluminum interconnect line and in which ions of a selected type are implanted into horizontal surfaces of the polysilicon layer.

The embodiment depicted in FIGS. 82 and 83 is only one particular embodiment of the seventeenth method and is given by way of example only. Other applications of the seventeenth method will be readily apparent to one skilled in the art. For instance, the protruding structure could comprise an interconnect line used for providing electrical communication between semiconductor devices on an integrated circuit. Accordingly, FIG. 84 depicts an initial structure in a second embodiment of the seventeenth method wherein polysilicon regions are formed over and to the sides of a protruding structure that, in the depicted embodiment, has the form of an aluminum interconnect line 470. Aluminum interconnect line 470 may or not be provided with an insulating spacer 462a at the top thereof as will be hereafter discussed.

As shown in FIG. 84, a polysilicon layer 458 is formed over aluminum interconnect line 470. Polysilicon layer 458 is preferably formed of intrinsic polysilicon and can be formed or deposited in any suitable manner.

Figure 85:
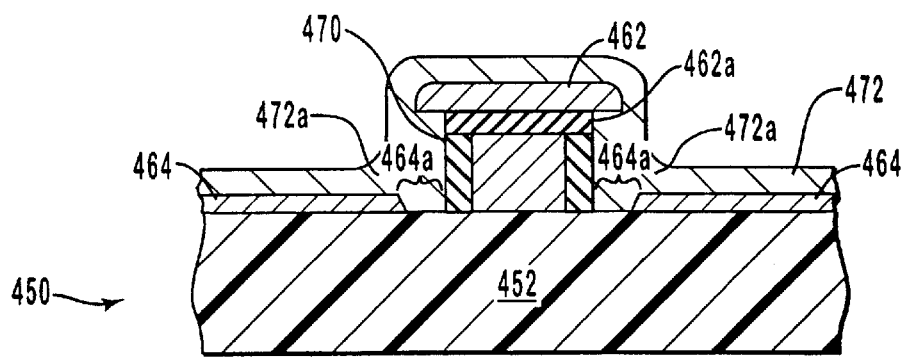
FIG. 85 is a cross-sectional view of the semiconductor wafer of FIG. 84, showing a further procedure in the second embodiment of the seventeenth method of the present invention in which an etching process which is selective to implanted silicon-containing material is conducted to remove relatively unimplanted portions of the polysilicon layer of FIG. 84 and in which a titanium layer is deposited over the horizontal surfaces of the polysilicon layer.

An ion implantation operation, represented by arrows 460, is then conducted to implant ions into horizontal surfaces 458a of polysilicon layer 458 to the exclusion of lateral portions 458b. The implanted ions are of a selected type chosen in accordance with an etching process which is selective to implanted polysilicon, as discussed above for the first method. After ion implantation, the etching process is conducted to etch away all portions of polysilicon layer 458 located on exposed vertical surfaces of aluminum interconnect line 470. Portions of polysilicon layer 458 located on substantially horizontal surfaces of aluminum interconnect line 470 are left remaining by the etching process. Thus, as is shown in FIG. 85, top polysilicon region 462 is left situated over aluminum interconnect line 470 and insulating spacer 462a. Side polysilicon regions 464 are also left remaining at the sides of aluminum interconnect line 470 and are separated from aluminum interconnect line 470 by a pair of openings 464a having a width corresponding to approximately the width of top polysilicon region 462.

Merely by increasing the amount of conducting material on aluminum interconnect line 470 in the form of top polysilicon region 462, the conductivity of aluminum interconnect line 470 is increased. Nevertheless, in order to further increase the conductivity of top polysilicon region 462 and side polysilicon regions 464, a silicidation process can be conducted to convert top polysilicon region 462 and side polysilicon regions 464 to a silicide material.

Thus, in one embodiment, shown in FIG. 85, silicidation is accomplished by forming titanium layer 472 over top polysilicon region 462 and side polysilicon regions 464. Thereafter, a heat treatment, such as a rapid thermal anneal, is conducted to react titanium layer 472 with top polysilicon region 462 and side polysilicon regions 464 to convert top polysilicon region 462 and side polysilicon regions 464 to titanium silicide (TiSi$_x$). In so doing, titanium layer 472 will be substantially converted to titanium silicide, except for portions of titanium layer 472 located on surfaces such as sidewalls of aluminum interconnect line 470 that do not have polysilicon thereon. Thus, after conducting the silicidation operation, remaining unreacted regions of titanium layer 472 are removed. Removal of titanium layer 472 is preferably accomplished by conducting an etching process that etches titanium, or any alternative metal of which the silicide is formed, and does not substantially etch titanium silicide or a silicide of an alterative metal of which the silicide is formed.

Figure 86:
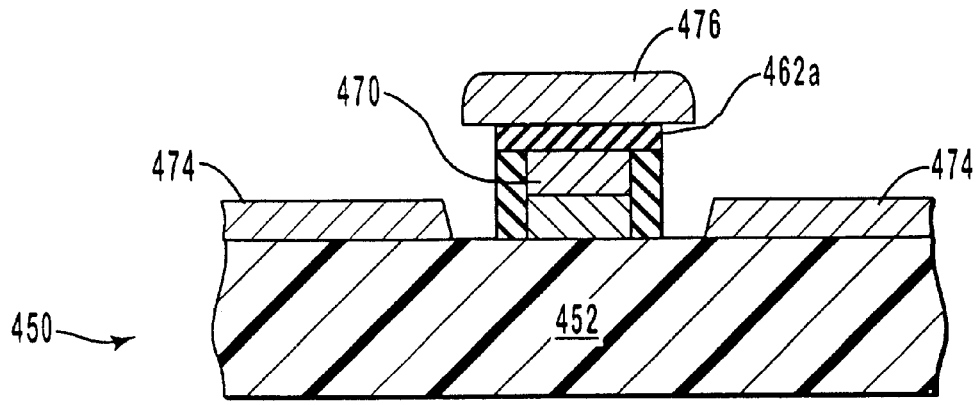
FIG. 86 is a cross-sectional view of the semiconductor wafer of FIG. 85, showing a further procedure in the second embodiment of the seventeenth method of the present invention in which a heat treatment operation is conducted to convert the horizontal surfaces of the polysilicon layer to titanium silicide and in which the unreacted titanium is removed.

The resulting structure is shown in FIG. 86. As shown in FIG. 86, aluminum interconnect line 470 is covered by a top titanium silicide region 476 and has formed at the side thereof side titanium silicide regions 474. If the purpose of the application of the seventeenth method is to increase the conductivity of aluminum interconnect line 470, no insulating spacer 462a will be previously formed, and side titanium silicide regions 474 can be removed. Alternatively, side titanium silicide regions 474 might be desired for use as additional interconnect lines, and can be patterned for such use.

Top titanium silicide region 476 might be used as a separate interconnect line, such that it can carry signals independent of aluminum interconnect line 470. In order to form a separate interconnect line from aluminum interconnect line 470, insulating spacer 462a is formed on aluminum interconnect line 470 prior to forming top polysilicon region 462 and side polysilicon regions 464 of FIG. 85.

Rather than being formed of a conducting material as is aluminum connect line 470, the protruding structure can be formed of an insulating material. This allows multiple interconnect lines to be formed closely together. By example in FIG. 86, aluminum interconnect line 470 would be formed of a conducting material, and top titanium silicide region 486 and side titanium silicide regions 474 would comprise separate conducting lines that are electrically isolated by the insulating protruding feature, in this case, a line of insulating material in the place of aluminum interconnect line 470.

The seventeenth method selectively forms silicon-containing material on horizontal surfaces of a protruding structure without the need for masking or dry etching. New conductive shaped structures can be formed and the conductivity of existing shaped structures can be increased.

18. Formation of Thin Interconnect Lines having Integral Larger Structures of Greater Width than the Thin Interconnect Lines with the Etching Process which is Selective to Implanted Silicon-containing Material An eighteenth method of the present invention is illustrated in FIGS. 87 through 90. The eighteenth method is used to form an interconnect line together with an integral structure of greater width than the interconnect line that is used for electrically connecting the interconnect line to a larger structure. The eighteenth method forms an interconnect line that can be of sub-photolithography resolution dimensions. The interconnect line, and the integral structure of greater width than the interconnect line, can be integrally formed under the eighteenth method with a single material deposition operation and with two masking operations.

Figure 87:
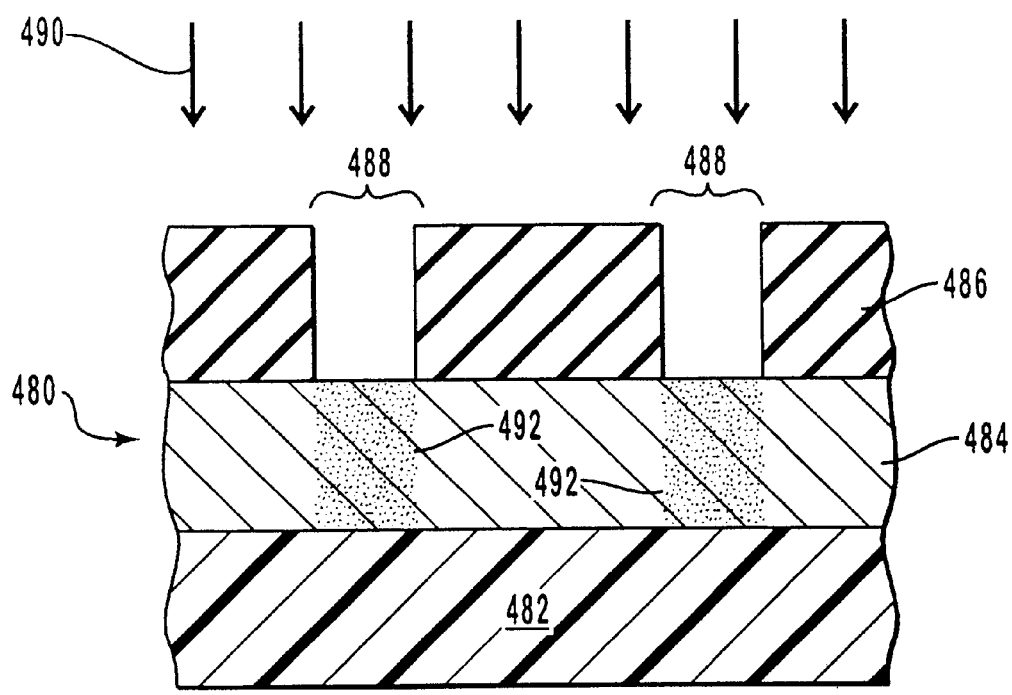
FIG. 87 is a cross-sectional view of a semiconductor wafer showing an initial procedure in an eighteenth method of the present invention in which selected regions of a polysilicon layer are implanted through a photoresist mask.

FIGS. 87 through 90 depict one embodiment of the eighteenth method, wherein a pair of interconnect lines are formed of a silicon-containing material on a semiconductor substrate. FIG. 87 is a cross-sectional view showing a starting structure for the eighteenth method wherein a semiconductor substrate is provided. In the depicted embodiment, the semiconductor substrate is a semiconductor wafer 480 having thereon a silicon substrate 482. Once semiconductor wafer 480 and silicon substrate 482 are provided, a volume of silicon-containing material is formed on silicon substrate 482. In the depicted embodiment, the volume of silicon-containing material comprises a polysilicon layer 484. Polysilicon layer 484 is preferably formed of intrinsic polysilicon and is deposited in any suitable manner, as described above in the discussion of the first method.

Once polysilicon layer 484 is formed, a masking substrate such as a photoresist mask 486 is applied over polysilicon layer 484. Photoresist mask 486 is patterned with openings 488 at each location in polysilicon layer 484 wherein the integral structures of greater width than the interconnect lines are to be formed. The openings are formed with the shape of the integral structures of greater width than the interconnect lines.

Once photoresist mask 486 is patterned, an ion implantation operation, represented by arrows 490, is conducted. The ion implantation operation is conducted substantially as described above in the discussion of the first method. Consequently, the ions of the ion implantation operation are of a selected type chosen in accordance with an etching process which is selective to implanted silicon-containing material. The ions are implanted through openings 488 in photoresist mask 486 into selected regions 492 of polysilicon layer 484 where the integral structures of greater width than the interconnect lines are to be formed. The parameters of the ion implantation operation can be appropriately selected in the manner described in the discussion of the first method above to tailor the shape of selected regions 492. Consequently, the implantation of ions into selected regions 492 defines the shape of the integral structures of greater widths than the interconnect lines.

Figure 88:
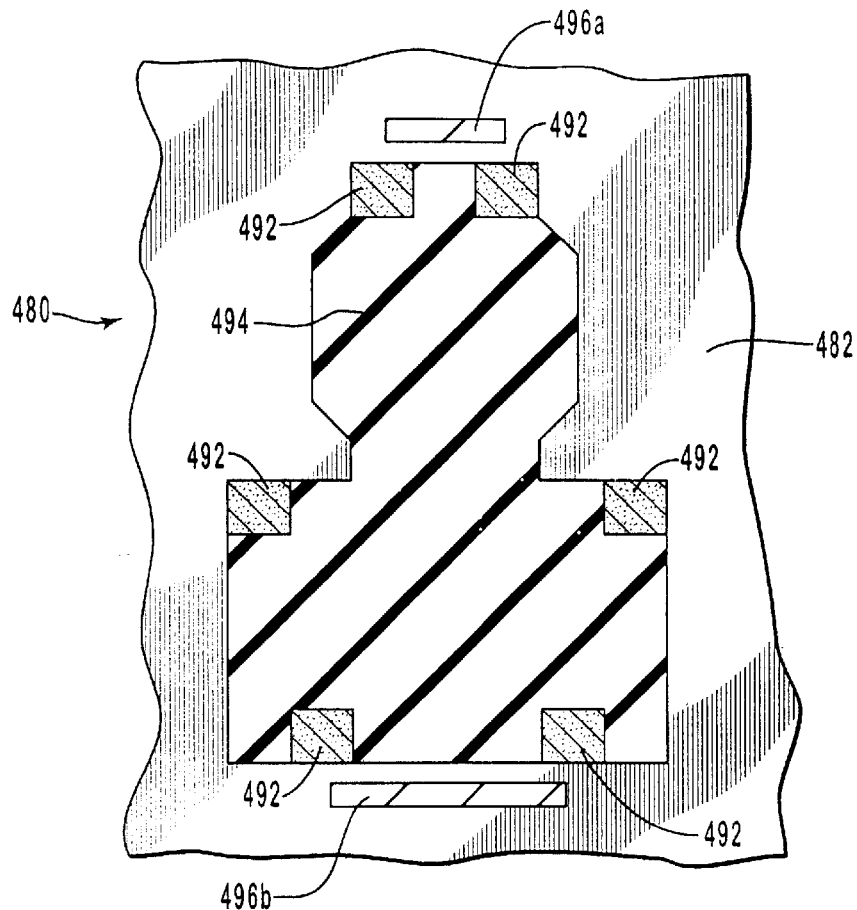
FIG. 88 is a top-down plan view of the semiconductor wafer of FIG. 87, showing a further procedure of the eighteenth method of the present invention in which the polysilicon layer of FIG. 87 is reduced to a patterned polysilicon block having a selected surface shape and in which sacrificial spacer blocks are formed adjacent selected locations of the patterned polysilicon block.

FIG. 88 is a top down view showing the results of further processing in the eighteenth method. Once selected regions are implanted, photoresist mask 486 is removed and a second photoresist mask, not shown in FIG. 88, is formed over polysilicon layer 484. The second photoresist mask is patterned to mask over a selected surface shape of a block of polysilicon. An anisotropic etching process, such as a dry etching process, is then conducted to reduce polysilicon layer 484 to the selected surface shape. One such selected surface shape is depicted by way of example in FIG. 88 wherein there is shown a patterned polysilicon block 494 of the selected surface shape that has been formed from polysilicon layer 484 with an anisotropic etching process.

The selected surface shape defines a perimeter of polysilicon block 494 comprising laterally extending surfaces at which the interconnect lines will be formed. Consequently, selected regions 492 are preferably proximal to the outer perimeter of patterned polysilicon block 494 so as to be integrally connected to the interconnect lines once the interconnect lines are formed.

Figure 89:
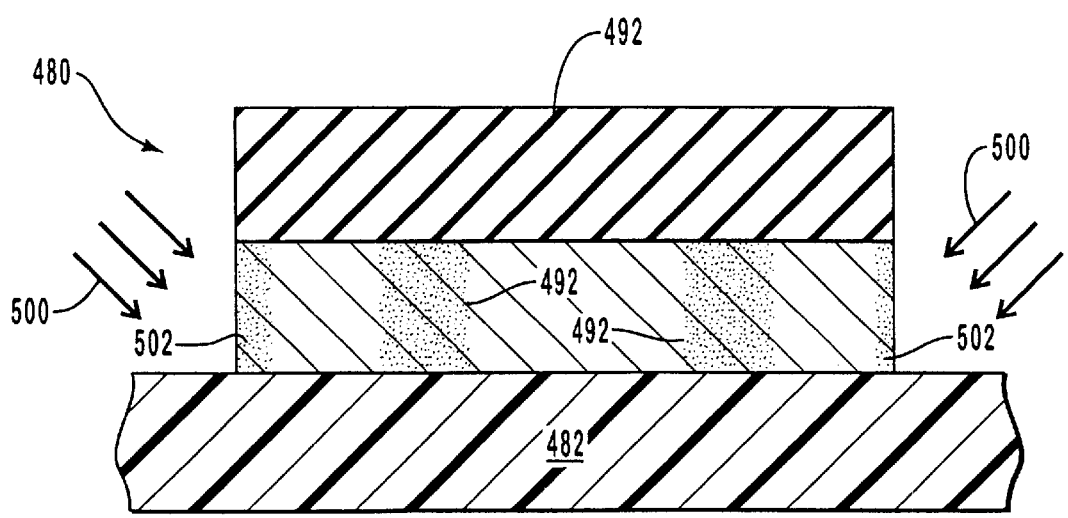
FIG. 89 is a cross-sectional view of the semiconductor wafer of FIG. 88, showing a further procedure of the eighteenth method of the present invention in which laterally extending surfaces of the patterned polysilicon block of FIG. 88 are implanted with ions.

In the depicted embodiment, interconnect lines are being formed around the entire perimeter of patterned polysilicon block 494. In such a situation, structures are preferably provided for forming breaks in the interconnect lines. Thus, as one example of a means for forming breaks in the interconnect lines, a pair of sacrificial spacer blocks 496a and 496b are placed close to the locations at the perimeter of patterned polysilicon block 494 where the breaks in the interconnect lines are to be formed. The placement of sacrificial spacer blocks 496a and 496b determines the location of the breaks in the interconnect lines as will be shown FIG. 89 is a cross-sectional view showing a second photoresist mask 492. Implanted selected regions 492 are shown in patterned polysilicon block 494. Second photoresist mask 492 is preferably left in position over patterned polysilicon block 494 after the anisotropic etching process is conducted. A second ion implantation process is then conducted after the anisotropic etching process is completed and is represented in FIG. 89 by arrows 500. The second ion implantation process is conducted with ions of a selected type that may be the same as the first ion implantation process, or may be of another selected type compatible with the etching process which is selective to implanted silicon-containing material of the present invention.

The second ion implantation process is preferably conducted with an angle of implantation other than orthogonal to the surface of semiconductor wafer 480, causing the ions to impact the laterally extending surfaces on the edges of patterned polysilicon block 494. Implanted edge regions 502 are thus formed at the edges of patterned polysilicon block 494. Implanted edge regions 502 have a thickness determined by the parameters of the ion implantation operation, as discussed for the first, sixth, and seventh methods. Thus, for instance, varying the angle of implantation or the implantation energy of the implanted ions will alter the thickness of implanted edge regions 502. Additionally, in order to maintain a uniform thickness and profile of implanted edge regions 502, the ion implantation operation can be conducted in multiple stages wherein the angle, implantation energy, or other parameters are varied for each stage as discussed in relation to FIG. 3. In order to uniformly implant each sidewall of patterned polysilicon block 494, ions can be implanted with an angle or set of angles having a horizontal component directed to each side of patterned polysilicon block 494. Alternatively, semiconductor wafer 480 can be rotated using an angle or set of angles having a single horizontal component.

Second photoresist mask 492 is of a selected thickness that stops the implanted ions from penetrating through second photoresist mask 492 into the interior of patterned polysilicon block 494. Accordingly, other than prior implanted selected regions 492, ions do not penetrate substantially into the interior of patterned polysilicon block 494.

Figure 90:
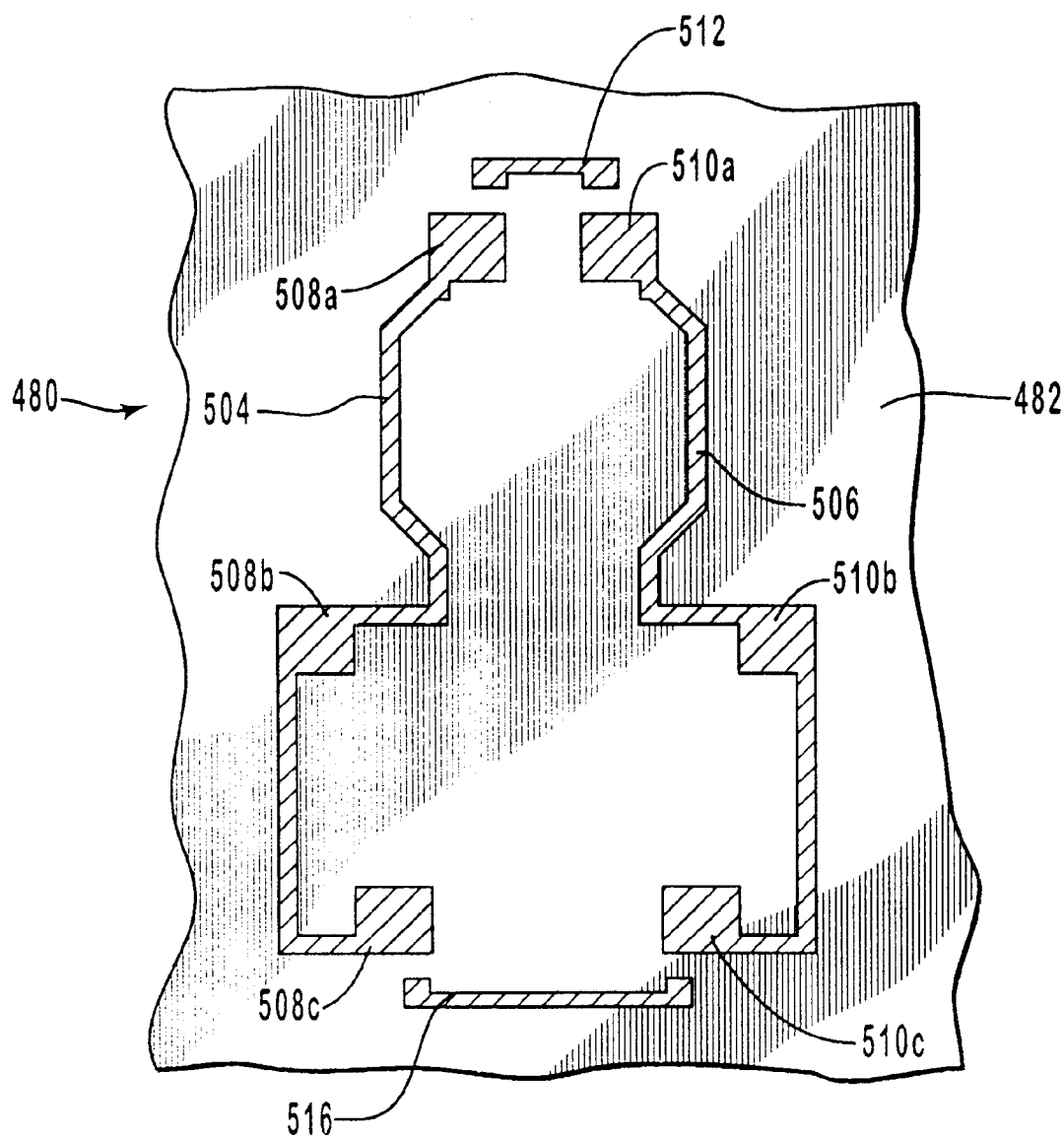
FIG. 90 is a top-down plan view of the semiconductor wafer of FIG. 89, showing a further procedure of the eighteenth method of the present invention in which an etching process which is selective to implanted silicon-containing material is conducted to remove relatively unimplanted portions of the patterned polysilicon block and the sacrificial spacer blocks, thereby forming a pair of interconnect lines with integral contact pads.

FIG. 90 is a top-down view depicting the results of a further procedure of the eighteenth method. After the second ion implantation operation is conducted, an etching process is conducted which is selective to implanted silicon-containing material, as described above in the discussion of the first method. As a result, unimplanted silicon-containing material is removed from the interior of the patterned polysilicon block of FIGS. 88 and 89, while implanted portions are left remaining, forming thereby the structure of FIG. 90. Shown in FIG. 90 are two interconnect lines which are left side interconnect line 504 and right side interconnect line 506, each having a height corresponding to the depth of polysilicon layer 484 and a sub-photolithographic width determined by the selection of the ion implantation operation parameters.

Also left remaining after the etching process, as depicted in FIG. 90, is upper sacrificial spacer block 512 and corresponding lower sacrificial spacer block 516, which remain from sacrificial spacer blocks 496a and 496b, respectively. During the ion implantation operation, sacrificial spacer blocks 512, 516, together with portions of photoresist mask 492 formed over sacrificial spacer blocks 512, 516, create a shadow effect that blocks the ions being angularly implanted from contacting a portion of the sidewall of patterned polysilicon block 494. As a result, openings 514 and 518 are formed. Openings 514 and 518 enable the formation of two separate interconnect lines that are electrically isolated from each other to be formed, rather than the formation of a single continuous interconnect line.

If a single continuous interconnect line with no intervening openings is to be formed, openings 514 and 518 need not be formed. If a single opening is desired, only one of sacrificial spacer blocks 496a and 496b would be used. If more than two openings are desired, further spacer blocks similar to sacrificial spacer blocks 496a and 496b would be used. Spacer blocks 496a and 496b are placed sufficiently close to patterned polysilicon block 494 of FIG. 88 to conserve surface area and effectively block the implantation of ions. At the same time, spacer blocks 496*a*, 496*b* are spaced sufficiently far away from patterned polysilicon block 494 that, when the eighteenth method is concluded and the structure of FIG. 90 is formed, electrical charge will not be conducted from left and right side interconnect lines 504 and 506 to upper and lower sacrificial spacer blocks 512 and 516.

In an alternative embodiment, the order of implanting selected implanted regions 492 and implanting implanted edge regions 502 is reversed. A still further embodiment of the eighteenth method is used as an alternative to the use of sacrificial spacer blocks 496*a* and 496*b*. The further embodiment is also a specific example of a means for forming breaks in left and right side interconnect lines 504, 506. In this embodiment, after conducting the etching process which is selective to implanted silicon-containing material, a third photoresist mask, not depicted, is used to cover portions of left side interconnect lines 504 and 506 that are intended to remain. Portions of left and right side interconnect lines 504, 506 that are intended to be broken are left unmasked. Thereafter, an etching process, preferably an anisotropic dry etch for polysilicon as described above, is conducted to remove the unmasked portions of left and right side interconnect lines 504, 506, thereby forming breaks in left and right side interconnect lines 504, 506.

Additionally, in embodiments wherein an interconnect line is desired to be formed at the location of only one, two or three sides of patterned polysilicon block 494 of FIG. 88, ions are implanted, respectively, into the one, two or three sides of patterned polysilicon block 494 during the second ion implantation operation. Selectively implanting ions into less than all sides of polysilicon block 494 can be accomplished by directing ions in a trajectory having an angle or angles of implantation that will cause the ions to contact only the sides of patterned polysilicon block 494 where the interconnect lines are intended to be formed. Also, ions can be implanted into specified sides of patterned polysilicon block 494 by using an angle or set of angles that initially causes ions to contact a single side of patterned polysilicon block 494, and then rotating semiconductor wafer 480 in such a manner that other sides of patterned polysilicon block 494 are exposed to the implantation of ions.

Left and right side interconnect lines 504, 506 have a thickness determined by the thickness of implanted edge regions 502 of FIG. 89. Consequently, as discussed in the fourteenth embodiment, the parameters of the ion implantation operation are appropriately selected to determine the thickness of left and right side interconnect lines 504, 506. It is preferred that polysilicon layer 484 of FIG. 87 be deposited with a depth in a range from about 250 angstroms to about 4000 angstroms, corresponding to the final height of left and right side interconnect lines 504, 506. Also, ions are preferably implanted into implanted edge regions 502 with a uniform thickness in a range from about 200 angstroms to about 3000 angstroms. Consequently, when completed, left and right side interconnect lines 504, 506 form elongated strips with a height, as determined by the deposition of polysilicon layer 484, in a range from about 250 angstroms to about 4000 angstroms and a thickness, as determined by the implantation of edge regions 502, in a range from about 200 angstroms to about 3000 angstroms. More preferably, left and right side interconnect lines 504, 506 are formed with a height in a range of about 500 to 3000 angstroms, and also more preferably, left and right side interconnect lines 504, 506 are formed with a width in a range from about 300 angstroms to about 2000 angstroms. Most preferably, left and right side interconnect lines 504, 506, once completed, have a height of about 1000 angstroms and a width of about 1000 angstroms.

Also formed in FIG. 90 are six integral structures of greater width than the interconnect lines which in the depicted embodiment have the form of contact pads. The contact pads, as shown, include a left upper contact pad 508*a*, a left middle contact pad 508*b*, a left lower contact pad 508*c*, a right upper contact pad 510*a*, a right middle contact pad 510*b*, and a right lower contact pad 510*c*. Contact pads 508*a* through 508*c* and 510*a* through 510*c* are formed with a greater width than that of the left and right side interconnect lines 504, 506. They can be formed to any desired width surface shape, and are preferably integrally connected with either or both of left interconnect line 504 and right interconnect line 506.

Left and right side interconnect lines 504, 506 of the depicted embodiment are suitable for use in conjunction with word lines in a MOS DRAM memory array structure. Accordingly, in such an embodiment, left upper contact pad 508*a* and right upper contact pad 510*a* are employed as landing pads for contacts extending to bit lines on a different level of the semiconductor substrate. Left middle contact pad 508*b* and right middle contact pad 510*b* are used as gate regions of relatively large MOS transistors. Also, left and right lower contact pads 508*c*, 510*c* are used for landing pads to make contact with external control lines or other such uses.

Left and right side interconnect lines 504, 506 can also pass over active regions. When so doing, source/drain regions can be formed around left and right side interconnect lines 504, 506 to form MOS transistors. Due to the small dimensions with which left and right side interconnect lines 504, 506 are formed, the resulting MOS transistors will have correspondingly narrow channel lengths. The narrow channel lengths make possible even faster device speeds, thereby providing for increased speed of the integrated circuit being formed.

The particular shape of patterned polysilicon block 494 of FIG. 88 as depicted was arbitrarily chosen, and as is readily apparent, patterned polysilicon block 494 need not be formed with the depicted shape. Accordingly, left and right side interconnect lines 504, 506 also need not be of the shape of the depicted embodiment and could have any desired shape or length, as required by the particular application.

Thus, the eighteenth method forms an interconnect line that is integrally connected with an integral structure of greater width than the interconnect line for electrically connecting the interconnect line with a larger feature of greater width. Additionally, the interconnect line and integral large structure with a width greater than that of the interconnect line are formed by the eighteenth method with a single material deposition operation and can be formed with two masking operations. The eighteenth method provides an interconnect line of a width that is less than that which can be achieved by conventional photolithography resolution. At the same time, the interconnect line can be connected to structures of greater width. Due to the dimensions with which the interconnect line is formed, the integrated circuit being formed can be miniaturized. Additionally, when the interconnect line is employed as a gate region by implanting source/drain regions to either side thereof, narrow channel lengths can be achieved, allowing for an increase in the speed of the resulting integrated circuit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of removing material from a semiconductor substrate, comprising:

forming a mask over a volume of a material located on a semiconductor substrate to form an unmasked portion and a masked portion thereof, wherein the masked portion of the volume of the material is masked by said mask, and the unmasked portion of the volume of the material is not masked by the mask;

implanting ions into the unmasked portion of the volume of the material such that the unmasked portion of the volume of the material has implanted therein a concentration of said ions that is greater than a concentration of said ions that are implanted in the masked portion of the volume of the material;

removing the mask from the masked portion; and removing said material from the unmasked portion with an etchant at a material removal rate that is greater than that of the masked portion.

2. A method as recited in claim 1, wherein the volume of the material is at least one of a volume of silicon-containing material, a volume of germanium containing material, and a volume of material containing combinations thereof.

3. A method as recited in claim 1, wherein the etchant is an acidic etchant.

4. A method as recited in claim 3, wherein the acidic etchant is at least one of acetic acid, hydrofluoric acid, and nitric acid.

5. A method as recited in claim 1, wherein said ions being implanted are implanted at at least one angle that is non-orthogonal to the planar surface of the semiconductor substrate.

6. A method as recited in claim 1, wherein implanting said plurality of ions further comprises:

a plurality of ion implantation stages.

7. A method as recited in claim 6, wherein at least one of said plurality of ion implantation stages implants said ions by using a greater implantation energy than an implantation energy of another one of said plurality of ion implantation stages.

8. A method as recited in claim 6, wherein at least one of said plurality of ion implantation stages implants said ions by using an angle of implantation that is different than an angle of implantation of another one of said plurality of ion implantation stages.

9. A method as recited in claim 6, wherein at least one of said plurality of ion implantation stages implants a first type of ion that is different from a second type of ion implanted during another one of said plurality of ion implantation stages.

10. The method of claim 9, wherein said first type of ion is an inert ion and said second type of ion alters an electrical characteristic of said material implanted therewith.

11. A method of forming a shaped structure on a semiconductor substrate, comprising:

forming a mask extending from a volume of a material located on a planar surface of a semiconductor substrate, said material of said volume of said material being at least one of a silicon-containing material, a germanium containing material, and a material containing combinations thereof;

implanting ions into the volume of the material and beneath the mask into the volume of the material so as to form therein a first portion and a second portion, the first portion having a concentration of said ions implanted therein that is greater than a concentration of said ions implanted in the second portion, the ions being implanted at at least one angle that is non-orthogonal to the planar surface of the semiconductor substrate;

removing said mask; and removing said material from the first portion, by etching with an acidic etchant, at a material removal rate that is greater than that of the second portion.

12. A method as recited in claim 11, wherein the acidic etchant is at least one of acetic acid, hydrofluoric acid, and nitric acid.

13. A method as recited in claim 11, wherein implanting said plurality of ions further comprises:

a plurality of ion implantation stages.

14. A method as recited in claim 13, wherein at least one of said plurality of ion implantation stages implants said ions by using a greater implantation energy than an implantation energy of another one of said plurality of ion implantation stages.

15. A method as recited in claim 13, wherein at least one of said plurality of ion implantation stages implants said ions by using an angle of implantation that is different than an angle of implantation of another one of said plurality of ion implantation stages.

16. A method as recited in claim 13, wherein at least one of said plurality of ion implantation stages implants a first type of ion that is different from a second type of ion implanted during another one of said plurality of ion implantation stages.

17. The method of claim 16, wherein said first type of ion is an inert ion and said second type of ion alters an electrical characteristic of said material implanted therewith.

18. A method of forming a shaped structure on a semiconductor, substrate, comprising:

forming a mask over a volume of a material located on a planar surface of a semiconductor substrate to form an unmasked and a masked portion thereof, wherein the masked portion of the volume of the material is masked by said mask, and the unmasked portion of the volume of the material is not masked by the mask;

implanting ions into the volume of the material and beneath the mask into the volume of the material so as to form therein a first and a second portion, the first portion having a concentration of said ions implanted therein that is greater than a concentration of said ions implanted in the second portion, the ions being implanted at at least one angle that is non-orthogonal to the planar surface of the semiconductor substrate;

removing the unmasked portion of the volume by performing an initial etch; and removing said material from the first portion at a material removal rate that is greater than that of the second portion.

19. A method as recited in claim 18, wherein the initial etch comprises:

a dry etch process.

20. A method as recited in claim 19, wherein the dry etch process is at least one of RIE and MRIE.

21. A method as recited in claim 18, wherein removing said material from the first portion comprises:

etching with an etchant.

22. A method as recited in claim 21, wherein the etchant is an acidic etchant.

23. A method as recited in claim 21, wherein the volume of the material is doped, and wherein the first portion is implanted with a counter dopant.

24. A method as recited in claim 23, wherein the volume of the material is doped with a P-type dopant, and wherein the first portion is implanted with an N-type counter dopant.

25. A method as recited in claim 23, wherein removing the material from the first portion comprises:

etching with a basic etchant.

26. A method as recited in claim 18, wherein implanting said plurality of ions further comprises:

a plurality of ion implantation stages.

27. A method as recited in claim 26, wherein at least one of said plurality of ion implantation stages implants said ions by using a greater implantation energy than an implantation energy of another one of said plurality of ion implantation stages.

28. A method as recited in claim 26, wherein at least one of said plurality of ion implantation stages implants said ions by using an angle of implantation that is different than an angle of implantation of another one of said plurality of ion implantation stages.

29. A method as recited in claim 26, wherein at least one of said plurality of ion implantation stages implants a first type of ion that is different from a second type of ion implanted during another one of said plurality of ion implantation stages.

30. The method of claim 29, wherein said first type of ion is an inert ion and said second type of ion alters an electrical characteristic of said material implanted therewith.

31. A method as recited in claim 18, wherein said second portion forms a sacrificial spacer, said method further comprising:

depositing a blanket layer of material over the sacrificial spacer;

planarizing the blanket layer of material to form thereon a planar surface on the sacrificial spacer; and removing the sacrificial spacer at a material removal rate that is greater than that of the blanket layer of material.

32. A method as recited in claim 31, wherein the blanket layer of material is silicon dioxide.

33. A method of forming a shaped structure on a semiconductor, substrate, comprising:

forming a first volume of a first material and a second volume of a second material, located on a planar surface of a semiconductor substrate;

forming a first mask over said second volume of said second material to form an unmasked and a masked portion thereof, wherein the masked portion of the second volume of the second material is masked by said first mask, and the unmasked portion of the second volume of the second material is not masked by the first mask;

implanting ions into the second volume of the second material and beneath the first mask into the second volume of the second material so as to form therein a first and a second portion, the first portion having a concentration of said ions implanted therein that is greater than a concentration of said ions implanted in the second portion, the ions being implanted at at least one angle that is non-orthogonal to the planar surface of the semiconductor substrate;

removing the unmasked portion of the second volume by performing an initial etch;

removing said second material from the first portion at a material removal rate that is greater than that of the second portion to form a second mask over said first volume of said first material, wherein the masked portion of the first volume of the first material is masked by the second mask, and the unmasked portion is not masked by the second mask;

removing the unmasked portion of the first volume of the first material at a material removal rate that is greater than that of the second mask.

34. A method as recited in claim 33, wherein said first material is silicon dioxide.

35. A method as recited in claim 33, wherein implanting said plurality of ions further comprises:

a plurality of ion implantation stages.

36. A method as recited in claim 35, wherein at least one of said plurality of ion implantation stages implants said ions by using a greater implantation energy than an implantation energy of another one of said plurality of ion implantation stages.

37. A method as recited in claim 35, wherein at least one of said plurality of ion implantation stages implants said ions by using an angle of implantation that is different than an angle of implantation of another one of said plurality of ion implantation stages.

38. A method as recited in claim 35, wherein at least one of said plurality of ion implantation stages implants a first type of ion that is different from a second type of ion implanted during another one of said plurality of ion implantation stages.

39. The method of claim 38, wherein said first type of ion is an inert ion and said second type of ion alters an electrical characteristic of said material implanted therewith.

40. A method of forming an interconnect structure on a semiconductor substrate, comprising:

providing a volume of a material, wherein said material is at least one of a silicon-containing material, a germanium-containing material, and a material containing combinations thereof, said volume of said material being situated over a charge conducting region located within a semiconductor substrate;

masking the volume of the material with a mask to form a masked portion of the volume of the material situated above the charge conducting region and an unmasked portion of the volume of the material situated adjacent to the charge conducting region;

reducing the height of the unmasked portion;

implanting a plurality of ions into the volume of the material to form a first portion therein and also forming a second portion therein, the second portion being located within the masked portion of the volume of the material, the first portion having a concentration of said ions implanted therein that is greater than a concentration of said ions implanted in the second portion;

removing the mask; and removing the material from the first portion at a material removal rate that is greater than that of the second portion to form an interconnect structure from said volume of the material.

41. A method as recited in claim 40, wherein removing the material from the first portion comprises:

etching with an etchant.

42. A method as recited in claim 41, wherein the etchant is an acidic etchant.

43. A method as recited in claim 42, wherein the acidic etchant is at least one of acetic acid, hydrofluoric acid, and nitric acid.

44. A method as recited in claim 41, further comprising:
doping the material;
counter doping the first portion; and
etching with a basic etchant.

45. A method of forming a shaped structure on a semiconductor substrate, comprising:
forming a mask extending from a semiconductor material located on a surface of a semiconductor substrate;
implanting ions into the silicon-containing material and beneath the mask into the semiconductor material so as to form therein a first portion and a second portion, the first portion having a concentration of said ions implanted therein that is greater than the concentration of said ions implanted in the second portion, the ions being implanted at at least one angle that is non-orthogonal to the surface of the semiconductor substrate;
removing said mask; and
removing, by etching with a basic etchant, said semiconductor material from the second portion at a material removal rate that is greater than the material removal rate of the first portion.

46. A method as recited in claim 45, wherein the basic etchant is at least one of tetramethyl ammonium hydroxide (TMAH), tetraethylammonium hydroxide, tetrabutylphosphonium hydroxide, tetraphenylarsonium hydroxide, KOH, and NaOH.

47. A method as recited in claim 45, wherein implanting said plurality of ions further comprises:
a plurality of ion implantation stages.

48. A method as recited in claim 47, wherein at least one of said plurality of ion implantation stages implants said ions by using a greater implantation energy than an implantation energy of another one of said plurality of ion implantation stages.

49. A method as recited in claim 47, wherein at least one of said plurality of ion implantation stages implants said ions by using an angle of implantation that is different than an angle of implantation of another one of said plurality of ion implantation stages.

50. A method as recited in claim 47, wherein at least one of said plurality of ion implantation stages implants a first type of ion that is different from a second type of ion implanted during another one of said plurality of ion implantation stages.

51. The method of claim 50, wherein said first type of ion is an inert ion and said second type of ion alters an electrical characteristic of said material implanted therewith.

* * * * *

UNITED STATES PATENT AND TRADEMARK OFFICE
CERTIFICATE OF CORRECTION

PATENT NO. : 6,599,840 B2
DATED : July 29, 2003
INVENTOR(S) : Wu et al.

It is certified that error appears in the above-identified patent and that said Letters Patent is hereby corrected as shown below:

Column 7,
Line 35, change "modem" to -- modern --

Column 9,
Line 10, change "than" to -- the --
Line 24, before "first" insert -- the --

Column 11,
Line 6, before "preferably" remove "is"

Column 15,
Line 49, after "process" remove "is conducted"

Column 21,
Line 25, after "process" remove "which"

Column 36,
Line 34, change "layer 14" to -- layer 14. --

Column 39,
Line 34, change "5 C." to -- 5° C. --.
Lines 35-36, change "20 C." to -- 20° C. --

Column 40,
Line 19, change "satisfactorily" to -- satisfactory --

Column 46,
Line 49, change "on" to -- an --
Line 64, change "serves" to -- serve --

Column 47,
Line 56, change "preferable" to -- preferably --

Column 48,
Line 13, after "spacer" remove "therefrom"

Column 50,
Line 19, change "ion_plantation" to -- ion implantation --

Column 52,
Line 3, after "result" insert -- in --

UNITED STATES PATENT AND TRADEMARK OFFICE
CERTIFICATE OF CORRECTION

PATENT NO. : 6,599,840 B2
DATED : July 29, 2003
INVENTOR(S) : Wu et al.

It is certified that error appears in the above-identified patent and that said Letters Patent is hereby corrected as shown below:

Column 53,
Line 48, change "eight" to -- eighth --

Column 62,
Line 13, after "which" insert -- has --

Column 64,
Line 48, change "is" to -- are --

Column 65,
Line 20, change "capacity" to -- capacitor --

Column 66,
Line 32, before "implantation" remove "a"

Column 68,
Line 40, after "implanted" change "ion" to -- ions --

Column 75,
Line 46, after "Material" change "A on" to -- on a --

Column 84,
Line 39, change "semiconductor," to -- semiconductor --

Column 85,
Line 45, change "semiconductor," to -- semiconductor --

Signed and Sealed this

Twenty-eighth Day of September, 2004

JON W. DUDAS
*Director of the United States Patent and Trademark Office*